US 7,994,842 B2

(12) United States Patent
Ito

(10) Patent No.: US 7,994,842 B2
(45) Date of Patent: Aug. 9, 2011

(54) SEMICONDUCTOR INTEGRATED CIRCUIT APPARATUS AND ELECTRONIC APPARATUS

(75) Inventor: Minoru Ito, Shiga (JP)

(73) Assignee: Panasonic Corporation, Osaka (JP)

( * ) Notice: Subject to any disclaimer, the term of this patent is extended or adjusted under 35 U.S.C. 154(b) by 103 days.

(21) Appl. No.: 12/482,044

(22) Filed: Jun. 10, 2009

(65) Prior Publication Data

US 2009/0243707 A1 Oct. 1, 2009

Related U.S. Application Data

(62) Division of application No. 11/549,209, filed on Oct. 13, 2006, now Pat. No. 7,564,296.

(30) Foreign Application Priority Data

Oct. 13, 2005 (JP) ................... 2005-299209
Jun. 26, 2006 (JP) ................... 2006-175899

(51) Int. Cl.
*H01J 19/82* (2006.01)
*H02M 7/00* (2006.01)

(52) U.S. Cl. ........................ 327/534; 327/541

(58) Field of Classification Search .................. 327/534, 327/541–543, 566, 312, 313, 535–537
See application file for complete search history.

(56) References Cited

U.S. PATENT DOCUMENTS

| 5,610,550 | A | 3/1997 | Furutani |
| 5,793,040 | A * | 8/1998 | Oguchi et al. ............ 850/1 |
| 5,834,967 | A | 11/1998 | Kuroda et al. |
| 6,157,259 | A | 12/2000 | Dasgupta |
| 6,958,597 | B1 | 10/2005 | Lin et al. |
| 7,132,874 | B2 * | 11/2006 | McCorquodale et al. .... 327/347 |
| 2006/0186472 | A1 | 8/2006 | Ito |
| 2007/0045744 | A1 | 3/2007 | Ito |

FOREIGN PATENT DOCUMENTS

JP           9-130232            5/1997

OTHER PUBLICATIONS

Kobayashi et al, "Self-Adjusting Threshold-Voltage Scheme (SATS) for Low-Voltage High-Speed Operation", IEEE 1994 Custom Intergrated Circuits Conference, pp. 271-274.
English language abstract of JP 9-130232, May 16, 1997.

* cited by examiner

*Primary Examiner* — Lincoln Donovan
*Assistant Examiner* — Diana J Cheng
(74) *Attorney, Agent, or Firm* — Greenblum & Bernstein, P.L.C.

(57) ABSTRACT

Semiconductor integrated circuit apparatus and electronic apparatus having a leakage current detection circuit where arbitrarily set leakage current detection ratio does not depend on power supply voltage, temperature, or manufacturing variations, and where leakage current detection is straightforward. Semiconductor integrated circuit apparatus extracts a stable potential from the center of two NchMIS transistors, amplifies drain current of an NchMOS transistor taking this potential as a gate potential to a current value of an arbitrary ratio using current mirror circuit, makes this current flow through NchMOS transistor with the gate and drain connected, and applies drain potential of this NchMOS transistor to the gate of leakage current detection NchMOS transistor.

3 Claims, 24 Drawing Sheets

SEMICONDUCTOR INTEGRATED CIRCUIT APPARATUS AND ELECTRONIC APPARATUS

CROSS-REFERENCE RELATED TO APPLICATION

This application is a divisional of pending U.S. application Ser. No. 11/549,209, filed Oct. 13, 2006, which claims priority to Japanese Application Nos. 2005-299209, filed Oct. 13, 2005 and 2006-175899, filed Jun. 26, 2006, the contents of which are expressly incorporated herein by reference in their entireties.

BACKGROUND OF THE INVENTION

1. Field of the Invention

The present invention relates to a semiconductor integrated circuit apparatus that controls threshold voltage of MIS (Metal Insulated Semiconductor) transistor, and particularly relates to a semiconductor integrated circuit apparatus and electronic apparatus capable of controlling substrate voltage of fine-detailed MIS transistors operating at low power supply voltages.

2. Description of the Related Art

In recent years, methods of lowering power supply voltage are well-known as important methods for making semiconductor integrated circuits low in power consumption. However, by lowering the power supply voltage, fluctuations in threshold voltages of MIS transistors or MOS (Metal Oxide Semiconductor) transistors have a substantial influence on operating speed of semiconductor integrated circuits.

With regards to this problem, in the related art, circuit technology for making variations in threshold voltage small has been developed. For example, the operation described below is carried out using a leakage current detection circuit and substrate voltage circuit incorporated in a semiconductor integrated circuit. Namely, when the threshold voltage is lower than a target value, leakage current increases to more than a target value and the detected leakage current therefore becomes larger than a set value. As a result, the substrate voltage circuit operates and makes the substrate voltage Lower, and the threshold voltage is corrected to be higher. Conversely, when the threshold voltage is higher than a target value, leakage current falls to less than a target value and the detected leakage current therefore becomes smaller than a set value. As a result, the substrate voltage circuit makes the substrate voltage higher, and the threshold voltage is corrected to be lower. For example, see Document 1, Kobayashi, T. and Sakurai, T., "Self-Adjusting Threshold-Voltage Scheme (SATS) for Low-Voltage High-Speed Operation." Proc. IEEE 1994 CICC, pp. 271-274, May 1994.

Further, as shown in FIG. 23, as a circuit configuration for a leakage current detection circuit, two NchMOS transistors $M_{1n}$ and $M_{2n}$ with gates both connected to a first current supply $M_{gp}$ are connected in series, and drain potential $V_{bn}$ of $M_{1n}$ is applied to the gate of leakage current detection NchMOS transistor $M_{Ln}$. The two NchMOS transistors $M_{1n}$ and $M_{2n}$ are then made to operate in the sub-threshold region so as to generate input potential $V_{bn}$ of leakage current detection NchMOS transistor $M_{Ln}$. Leakage current detection ratio therefore does not depend on power supply voltage or temperature (see, Document 2: Japanese Patent Application Laid-Open No. HEI9-130232).

However, semiconductor integrated circuit apparatus of the related art has the following three problems.

First, leakage current detected by leakage current detection NchMOS transistor $M_{Ln}$ is extremely small, in the order of a few pA to a few tens of pA. It is therefore extremely difficult to implement a constant current source where a minute stable current flows due to the influence of microscopic leakage currents due to defects in the processes of an MOS transistor and increases in the size of MOS transistors etc. In addition, the response to the substrate voltage control operation delays due to the delayed change in the drain potential of the leakage current detection NchMOS transistor $M_{Ln}$. This results in fluctuation in substrate voltage which presents a first problem.

A second problem is that, in Document 1 and Document 2, the leakage current detection circuit is always operating and is therefore always consuming power.

Further, in recent years, the operating speed of the power supply voltage changes according to the operating speed which presents a third problem that how the threshold voltage is to be set for a changing system clock frequency and power supply voltage appropriately has been a big problem.

SUMMARY OF THE INVENTION

It is therefore an object of the present invention to provide a semiconductor integrated circuit apparatus and an electronic apparatus having a leakage current detection circuit where an arbitrarily set leakage current detection ratio does not depend on power supply voltage, temperature or manufacturing variations, and where detection of leakage current is straightforward and response to substrate voltage control is fast.

According to an aspect of the present invention, a semiconductor integrated circuit apparatus comprises a reference potential generating circuit, a current mirror circuit that amplifies or attenuates drain current of an MIS transistor taking an output potential of the reference potential generating circuit as a gate potential to a current value of an arbitrary ratio, and a leakage current detection circuit constituted by an MIS transistor that takes output potential of the current mirror circuit as a gate potential.

According to a further aspect of the present invention, a semiconductor integrated circuit apparatus comprises a reference potential generating circuit, a voltage amplifying circuit that amplifies or attenuates an output potential of the reference potential generating circuit to a potential of an arbitrary ratio, and a leakage current detection circuit constituted by an MIS transistor that takes a potential amplified by the voltage amplifying circuit as a gate potential.

According to another aspect of the present invention, a semiconductor integrated circuit apparatus comprises a first first main conductivity MIS transistor with a source connected to a first power supply, a second first main conductivity MIS transistor with a source connected to a drain of the first first main conductivity MIS transistor, a drain connected to a first current source, and a gate connected to a gate of the first first main conductivity MIS transistor and the first current source, and a current mirror circuit that amplifies or attenuates drain current of a third first main conductivity MIS transistor with a source connected to the first power supply, and that takes a drain potential of the first first main conductivity MIS transistor as a gate potential, to a current value of an arbitrary ratio. Here, the first and second first main conductivity MIS transistors operate in a sub-threshold region in such a manner that an absolute value of a difference in gate potential of the first first main conductivity MIS transistor and the second first main conductivity MIS transistor and the first power supply potential becomes equal to or smaller than a threshold voltage of the first and second first main conductivity MIS transistors.

According to a still further aspect of the present invention, a semiconductor integrated circuit apparatus comprises a first first main conductivity MIS transistor with a source connected to a first power supply, a second first main conductivity MIS transistor with a source connected to a drain of the first first main conductivity MIS transistor, a drain connected to a first current source, and a gate connected to a gate of the first first main conductivity MIS transistor and the first current source, and a voltage amplifying circuit that amplifies or attenuates drain potential of the first first main conductivity MIS transistor to a potential of an arbitrary ratio. The first and second first main conductivity MIS transistors operate in a sub-threshold region in such a manner that an absolute value of a difference in gate potential of the first first main conductivity MIS transistor and the second first main conductivity MIS transistor and the first power supply potential becomes equal to or smaller than a threshold voltage of the first and second first main conductivity MIS transistors.

According to another aspect of the present invention, a semiconductor integrated circuit apparatus comprises a first first main conductivity MIS transistor with a source connected to a first power supply, a second first main conductivity MIS transistor with a source connected to a drain of the first first main conductivity MIS transistor and a drain connected to a first current source, a fourth first main conductivity MIS transistor with a source connected to the first power supply, a gate and drain connected in common and connected to respective gates of the first first main conductivity MIS transistor and the second first main conductivity MIS transistor and a second current source, and a current mirror circuit that amplifies or attenuates drain current of a third first main conductivity MIS transistor with a source connected to the first power supply, and that takes a drain potential of the first first main conductivity MIS transistor as a gate potential, to a current value of an arbitrary ratio. The first, second and fourth first main conductivity MIS transistors operate in a sub-threshold region in such a manner that an absolute value of a difference in gate potential of the first first main conductivity MIS transistor, the second first main conductivity MIS transistor, and the fourth first main conductivity MIS transistor becomes equal to or smaller than a threshold voltage of the first, second, and fourth first main conductivity MIS transistors.

According to a further aspect of the present invention, a semiconductor integrated circuit apparatus comprises a first first main conductivity MIS transistor with a source connected to a first power supply, a second first main conductivity MIS transistor with a source connected to a drain of the first first main conductivity MIS transistor and a drain connected to a first current source, a fourth first main conductivity MIS transistor with a source connected to the first power supply, a gate and drain connected in common and connected to respective gates of the first first main conductivity MIS transistor and the second first main conductivity MIS transistor and a second current source, and a voltage amplifying circuit that amplifies or attenuates drain potential of the first first main conductivity MIS transistor to a potential of an arbitrary ratio. The first, second and fourth first main conductivity MIS transistors operate in a sub-threshold region in such a manner that an absolute value of a difference in gate potential of the first first main conductivity MIS transistor, the second first main conductivity MIS transistor, and the fourth first main conductivity MIS transistor becomes equal to or smaller than a threshold voltage of the first, second, and fourth first main conductivity MIS transistors.

According to another aspect of the present invention, a semiconductor integrated circuit apparatus comprises an internal circuit having a plurality of MIS transistors on a semiconductor substrate, a substrate voltage control block that supplies a substrate voltage to the internal circuit and controls threshold voltage for the MIS transistors of the internal circuit, a reference potential generating circuit, a current mirror circuit that amplifies or attenuates drain current of an MIS transistor taking an output potential of the reference potential generating circuit as a gate potential to a current value of an arbitrary ratio, and a leakage current detection circuit constituted by an MIS transistor with the substrate voltage supplied by the substrate voltage control block, and that takes output potential of the current mirror circuit as a gate potential. Here, the threshold voltage is controlled by inputting an output signal of the leakage current detection circuit to the substrate voltage control block.

According to a further aspect of the present invention, a semiconductor integrated circuit apparatus comprises an internal circuit having a plurality of MIS transistors on a semiconductor substrate, a substrate voltage control block that supplies a substrate voltage to the internal circuit and controls threshold voltage for the MIS transistors of the internal circuit, a reference potential generating circuit, a voltage amplifying circuit that amplifies or attenuates an output potential of the reference potential generating circuit to a potential of an arbitrary ratio, and a leakage current detection circuit constituted by an MIS transistor with the substrate voltage supplied by the substrate voltage control block, and that takes a potential amplified or attenuated by the voltage amplifying circuit as a gate potential. Here, the threshold voltage is controlled by inputting an output signal of the leakage current detection circuit to the substrate voltage control block.

According to a still further aspect of the present invention, a semiconductor integrated circuit apparatus comprises an internal circuit having a plurality of MIS transistors on a semiconductor substrate, a substrate voltage control block that supplies a substrate voltage to the internal circuit and controls threshold voltage for a first main conductivity MIS transistor of the internal circuit, a reference potential generating circuit composed of a first first main conductivity MIS transistor with a source connected to a first power supply, and a second first main conductivity MIS transistor with a source connected to a drain of the first first main conductivity MIS transistor, a drain connected to a first current source, and a gate connected to a gate of the first first main conductivity MIS transistor and the first current source, and that generates a stable reference potential from the drain of the first first main conductivity MIS transistor, a current mirror circuit that amplifies or attenuates drain current of a third first main conductivity MIS transistor with a source connected to the first power supply, and that takes the reference potential as a gate potential to a current value of an arbitrary ratio, a fifth first main conductivity MIS transistor with a gate and drain connected, and a current value amplified by the current mirror circuit flowing through, and a leakage current detection first main conductivity MIS transistor with a source connected to the first power supply, a drain connected to the third current source, and a drain potential of the fifth first main conductivity MIS transistor applied to a gate, and substrate voltage controlled by the substrate voltage control block. The first and second first main conductivity MIS transistors operate in a sub-threshold region in such a manner that an absolute value of a difference in gate potential of the first first main conductivity MIS transistor and the second first main conductivity MIS transistor and the first power supply potential becomes equal to or smaller than a threshold voltage of the first and second first main conductivity MIS transistors, and the threshold voltage is controlled by inputting a signal based on fluctuation in drain potential of the leakage current detection first main conductivity MIS transistor to the substrate voltage control block.

According to another aspect of the present invention, a semiconductor integrated circuit apparatus comprises an internal circuit having a plurality of MIS transistors on a semiconductor substrate, a substrate voltage control block that supplies a substrate voltage to the internal circuit and controls threshold voltage for a first main conductivity MIS transistor of the internal circuit, a reference potential generating circuit composed of a first first main conductivity MIS transistor with a source connected to a first power supply, and a second first main conductivity MIS transistor with a source connected to a drain of the first first main conductivity MIS transistor, a drain connected to a first current source, and a gate connected to a gate of the first first main conductivity MIS transistor and the first current source, and that generates a stable reference potential from the drain of the first first main conductivity MIS transistor, a voltage amplifying circuit that amplifies or attenuates the reference potential to a potential of an arbitrary ratio, a leakage current detection first main conductivity MIS transistor with a source connected to the first power supply, a drain connected to a third current source, a potential amplified by the voltage amplifying circuit applied to a gate, and substrate voltage is controlled by the substrate voltage control block. Here, the first and second first main conductivity MIS transistors operate in a sub-threshold region in such a manner that an absolute value of a difference in gate potential of the first first main conductivity MIS transistor and the second first main conductivity MIS transistor and the first power supply potential becomes equal to or smaller than a threshold voltage of the first and second first main conductivity MIS transistors, and the threshold voltage is controlled by inputting a signal based on fluctuation in drain potential of the leakage current detection first main conductivity MIS transistor to the substrate voltage control block.

According to a further aspect of the present invention, a semiconductor integrated circuit apparatus comprises an internal circuit having a plurality of MIS transistors on a semiconductor substrate, a substrate voltage control block that supplies a substrate voltage to the internal circuit and controls threshold voltage for a first main conductivity MIS transistor of the internal circuit, a reference potential generating circuit composed of a first first main conductivity MIS transistor with a source connected to a first power supply, a second first main conductivity MIS transistor with a source connected to a drain of the first first main conductivity MIS transistor and a drain connected to a first current source, and a fourth first main conductivity MIS transistor with a source connected to the first power supply, a gate and drain in common and connected to the respective gates of the first first main conductivity MIS transistor and the second first main conductivity MIS transistor and a second current source, that generates a stable reference potential from the drain of the first first main conductivity MIS transistor, a current mirror circuit that amplifies or attenuates drain current of a third first main conductivity MIS transistor with a source connected to the first power supply, and that takes the reference potential as a gate potential to a current value of an arbitrary ratio, a fifth first main conductivity MIS transistor with a gate and drain connected, and a current value amplified by the current mirror circuit flowing through, and a leakage current detection first main conductivity MIS transistor with a source connected to the first power supply, a drain connected to a third current source, a drain potential of the fifth first main conductivity MIS transistor applied to a gate, and substrate voltage controlled by the substrate voltage control block. The first, second and fourth first main conductivity MIS transistors operate in a sub-threshold region in such a manner that an absolute value of a difference in gate potential of the first first main conductivity MIS transistor, the second first main conductivity MIS transistor, and the fourth first main conductivity MIS transistor becomes equal to or smaller than a threshold voltage of the first, second, and fourth first main conductivity MIS transistors, and the threshold voltage is controlled by inputting a signal based on fluctuation in drain potential of the leakage current detection first main conductivity MIS transistor to the substrate voltage control block.

According to a still further aspect of the present invention, a semiconductor integrated circuit apparatus comprises an internal circuit having a plurality of MIS transistors on a semiconductor substrate, a substrate voltage control block that supplies a substrate voltage to the internal circuit and controls threshold voltage for a first main conductivity MIS transistor of the internal circuit, a reference potential generating circuit composed of a first first main conductivity MIS transistor with a source connected to a first power supply, a second first main conductivity MIS transistor with a source connected to a drain of the first first main conductivity MIS transistor and a drain connected to a first current source, and a fourth first main conductivity MIS transistor with a source connected to the first power supply, a gate and drain in common and connected to the respective gates of the first first main conductivity MIS transistor and the second first main conductivity MIS transistor and a second current source, and that generates a stable reference potential from the drain of the first first main conductivity MIS transistor, a voltage amplifying circuit that amplifies or attenuates the reference potential to a potential of an arbitrary ratio, a leakage current detection first main conductivity MIS transistor with a source connected to the first power supply, a drain connected to a third current source, and a potential amplified by the voltage amplifying circuit applied to a gate, and substrate voltage controlled by the substrate voltage control block. Here, the first, second and fourth first main conductivity MIS transistors operate in a sub-threshold region in such a manner that an absolute value of a difference in gate potential of the first first main conductivity MIS transistor, the second first main conductivity MIS transistor, and the fourth first main conductivity MIS transistor becomes equal to or smaller than a threshold voltage of the first, second, and fourth first main conductivity MIS transistors, and the threshold voltage is controlled by inputting a signal based on fluctuation in drain potential of the leakage current detection first main conductivity MIS transistor to the substrate voltage control block.

According to another aspect of the present invention, an electronic apparatus comprises a semiconductor integrated circuit apparatus having a power supply apparatus and a threshold voltage control function. Here, the semiconductor integrated circuit is constituted by the semiconductor integrated circuit apparatus described above.

BRIEF DESCRIPTION OF THE DRAWINGS

The above and other objects and features of the invention will appear more fully hereinafter from a consideration of the following description taken in connection with the accompanying drawings in which.

DESCRIPTION OF THE PREFERRED EMBODIMENTS

Figure 1:
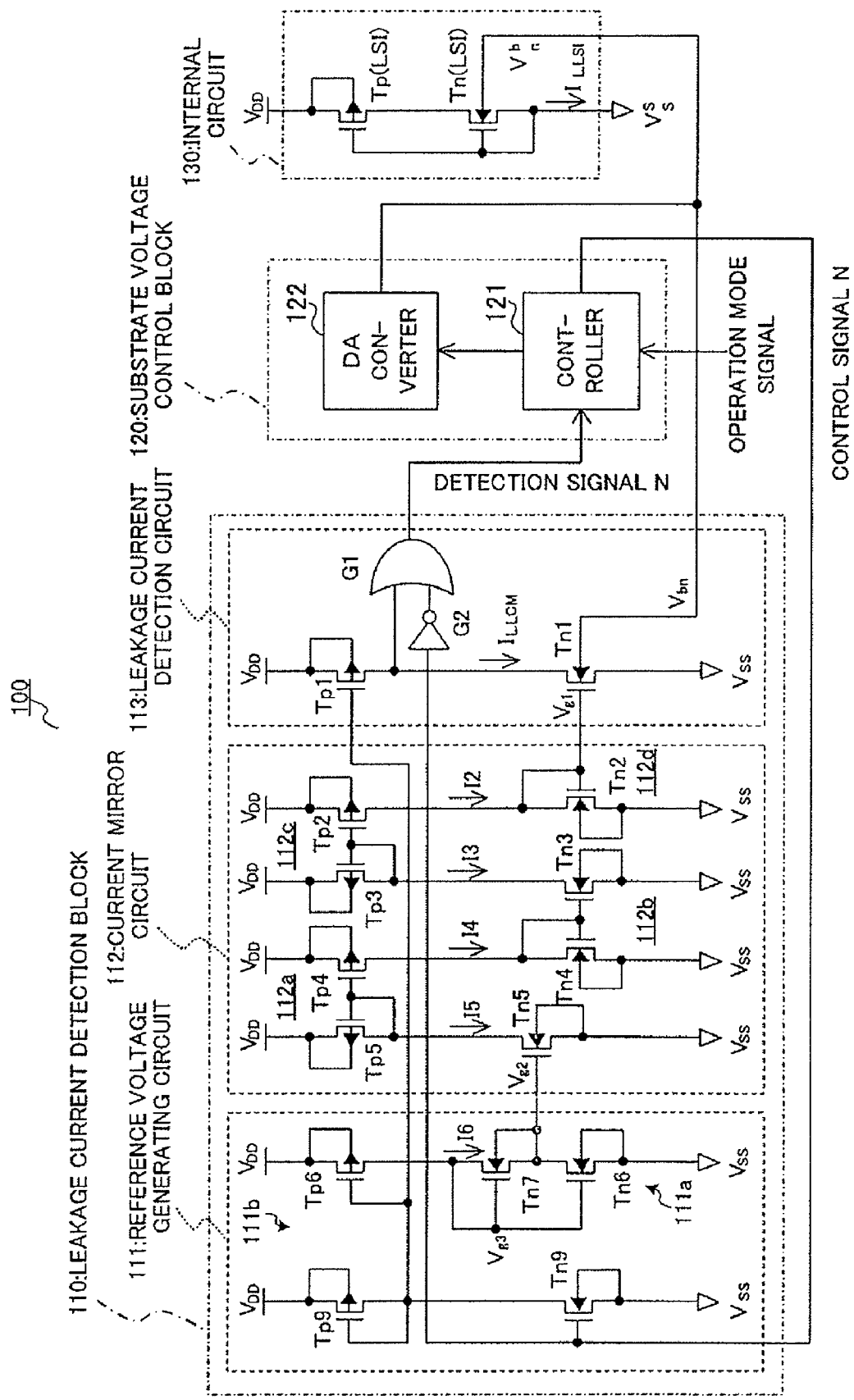
FIG. 1 shows a configuration for a semiconductor integrated circuit apparatus according to Embodiment 1 of the present invention.

Embodiments of the present invention using MOS transistors that are typical examples of MIS transistors will be described below in detail with reference to the accompanying drawings.

(Description of Theory)

First, the basic theory of the present invention will be described.

A semiconductor integrated circuit apparatus controlling transistor threshold voltage of the present invention comprises a leakage current detection block, substrate voltage control block, and internal circuit, with the leakage current detection block having the following circuit configuration. First, in order to resolve the first problem, leakage current detection NchMOS transistor $T_{n1}$ with a source connected to low potential side supply voltage $V_{SS}$, a drain connected to a constant current source, and a substrate voltage controlled by a voltage generated by the substrate voltage control block is formed. Next, a configuration is adopted where NchMOS transistor $T_{n6}$ and NchMOS transistor $T_{n7}$ are connected in series, the source of NchMOS transistor $T_{n6}$ is connected to low potential side supply voltage $V_{SS}$, the drain of NchMOS transistor $T_{n7}$ is connected to a separate constant current source, the gates of the two NchMOS transistors $T_{n6}$ and $T_{n7}$ connected together in series are connected in common and connected to the drain of NchMOS transistor $T_{n7}$, a stable potential $V_{g2}$ is taken from the center of the two NchMOS transistors, the drain current of NchMOS transistor $T_{n5}$ taking this potential $V_{g2}$ as a gate potential is amplified to a current value of an arbitrary ratio using a current mirror circuit, this current value flows through NchMOS transistor $T_{n2}$ with a gate and drain connected together, and drain potential $V_{g1}$ of this transistor is applied to the gate of leakage current detection NchMOS transistor $T_{n1}$.

As a separate circuit configuration, it is also possible to obtain $V_{g1}$ amplified by an arbitrary ratio from potential $V_{g2}$ by using a voltage amplifying circuit using operational amplifiers instead of the current mirror circuit.

As a further configuration for a reference voltage generating circuit, a configuration may be adopted where a drain voltage of NchMOS transistor $T_{n8}$ with a gate and drain connected to a separate constant current source, and a source connected to low potential side supply voltage $V_{SS}$ is applied to gate potential $V_{g3}$ of NchMOS transistors $T_{n6}$ and $T_{n7}$ generating the reference potential.

Further, as a separate configuration for a leakage current detection circuit, rather than using leakage current detection NchMOS transistor $T_{n1}$ connected as a circuit as described above, a source follower circuit comprised of leak current detection NchMOS transistor $T_{n21}$ where a drain is connected to a high potential side supply voltage $V_{DD}$, a source is connected to a constant current source, and substrate voltage is controlled by a substrate voltage control block is used. The leakage current can then be similarly detected by comparing the source potential of leakage current detection NchMOS transistor $T_{n21}$ with low potential side supply voltage $V_{SS}$ that is a reference potential using a comparator.

Further, it is also possible to similarly detect leakage current in a highly precise manner with a circuit configuration where a switch is inserted between the source potential and low potential side supply voltage $V_{SS}$ constituted by the reference potential and inputs IN1 and IN2 of a comparator, and then a DC offset of the comparator is cancelled.

Moreover, as a further configuration for a leakage current detection circuit, it is possible to similarly detect leakage current by carrying out potential comparison by a comparator to compare drain potential of leakage current detection NchMOS transistor $T_{n31}$ with a source connected to low potential side supply voltage $V_{SS}$, a gate and drain connected together and connected to a constant current source and a substrate voltage controlled by a substrate voltage control block and an output of a voltage amplifier using the current mirror circuit or operational amplifiers.

Further, it is also possible to detect leakage current in a highly precise manner with a circuit configuration where a switch is inserted between the output of the drain potential and a voltage amplifier using the current mirror circuit or operational amplifiers and inputs IN1 and IN2 of a comparator, and then a DC offset of the comparator is cancelled.

With the above circuit configuration, as it is possible to increase the detection current value of leakage current detection NchMOS transistor $T_{n1}$ by an arbitrary ratio, detection of leakage current, comparison of the detected leakage current and target current value and determination of the result after comparison are extremely straightforward. In addition, it is possible to accelerate the response to substrate voltage control so that fluctuation of substrate voltage can also be suppressed.

Further, in order to resolve the second problem, it is possible to keep the power consumed when the leakage current detection circuit is not operating low by using a control signal at a circuit constituting a constant current source of the leakage current detection circuit and putting the constant current source on or off.

Further, in order to resolve the third problem, it is possible to arbitrarily change the threshold voltage according to a changing system clock frequency or supply voltage by ensuring that the current amplification ratio of the current mirror circuit and the voltage amplification ratio of the voltage amplifying circuit using operational amplifiers are made to vary according to the system clock frequency or supply voltage.

Further, with CMOS (Complementary Metal Oxide Semiconductor) circuit, it is possible to achieve high speeds and low power consumption for the integrated circuit as a whole by providing threshold voltage control circuit apparatus at the NchMOS transistor and PchMOS transistor, respectively.

Embodiment 1

FIG. 1 shows a configuration for a semiconductor integrated circuit apparatus controlling a threshold voltage of a transistor according to Embodiment 1 of the present invention based on the aforementioned basic concepts. This embodiment shows an example applied to a semiconductor integrated circuit apparatus equipped with an NchMOS transistor leakage current detection block, substrate voltage control block, and internal circuit.

In FIG. 1, semiconductor integrated circuit apparatus 100 is equipped with NchMOS transistor leakage current detection block 110, substrate voltage control block 120 controlling substrate voltage, and internal circuit 130 having a plurality of MOS transistors on a semiconductor substrate. Semiconductor integrated circuit apparatus 100 adopts a basic configuration employing leakage current detection NchMOS transistor $T_{n1}$ with a drain connected to a constant current source for leakage current detection of the NchMOS transistor $T_{n\ (LSI)}$ equivalently representing internal circuit 130.

Leakage current detection block 110 is comprised of reference voltage generating circuit 111, current mirror circuit 112, and leakage current detection circuit 113. Leakage current detection block 110 arbitrarily amplifies a leakage current value of leakage current detection NchMOS transistor $T_{n1}$ of leakage current detection circuit 113 using current mirror circuit 112, and makes detection of leakage current and determination straightforward. Further, it is possible to accelerate the response to substrate voltage control so that fluctuation of substrate voltage can be suppressed. Moreover, the configuration is such that current does not pass through leakage current detection circuit 113 when leakage current detection circuit 113 is not operating.

[Circuit Configuration of Reference Voltage Generating Circuit 111]

Reference voltage generating circuit 111 is comprised of NchMOS transistor $T_{n9}$ receiving control signal N from substrate voltage control block 120 at a gate, PchMOS transistor $T_{p9}$ connected to the drain of NchMOS transistor $T_{n9}$, PchMOS transistor $T_{p6}$ with the drain of NchMOS transistor $T_{n9}$ connected to the gate, and NchMOS transistor $T_{n7}$ and NchMOS transistor $T_{n6}$ connected in series with PchMOS transistor $T_{p6}$.

Looked at functionally, reference voltage generating circuit 111 is comprised of NchMOS transistor $T_{n6}$ and NchMOS transistor $T_{n7}$ constituting voltage generating section 111a that generates a potential for generating gate potential $V_{g1}$ of leakage current detection NchMOS transistor $T_{n1}$ of leakage current detection circuit 113, and NchMOS transistor $T_{n9}$, PchMOS transistor $T_{p9}$, PchMOS transistor $T_{p6}$ and PchMOS transistor $T_{p1}$ of leakage current detection circuit 113 constituting constant current source 111b that supplies a constant current to this NchMOS transistor $T_{n6}$ and NchMOS transistor $T_{n7}$.

In voltage generating section 111a of reference voltage generating circuit 111, NchMOS transistor $T_{n6}$ and NchMOS transistor $T_{n7}$ are connected in series, the source of NchMOS transistor $T_{n6}$ is connected to low potential side supply voltage $V_{SS}$, the drain of NchMOS transistor $T_{n7}$ is connected to a separate constant current source 111b, this substrate is connected to the source of NchMOS transistor $T_{n7}$, and the gates of NchMOS transistor $T_{n6}$ and NchMOS transistor $T_{n7}$ respectively are connected in common and connected to the drain of NchMOS transistor $T_{n7}$. Drain potential $V_{g2}$ of NchMOS transistor $T_{n6}$ is applied to the gate of NchMOS transistor $T_{n5}$. Potential $V_{g2}$ of the drain of NchMOS transistor $T_{n6}$ and the source of NchMOS transistor $T_{n7}$ constitutes the generated potential of reference voltage generating circuit 111. The relationship between the gate potential $V_{g3}$ of NchMOS transistor $T_{n6}$ and NchMOS transistor $T_{n7}$ and the above potential $V_{g2}$ will be described later.

As an example circuit of constant current source 111b, this embodiment is comprised of NchMOS transistor $T_{n9}$ with a source connected to low potential side supply voltage $V_{SS}$ and control signal N received at a gate, PchMOS transistor $T_{p9}$ with a source connected to high potential side supply voltage $V_{DD}$, and a gate and drain connected to the drain of NchMOS transistor $T_{n9}$, and PchMOS transistor $T_{p6}$ and PchMOS transistor $T_{p1}$ constituting a current mirror circuit with PchMOS transistor $T_{p9}$.

It is then possible to keep the power consumed when leakage current detection circuit 113 is not operating low by controlling NchMOS transistor $T_{n9}$ within the circuit constituting constant current source 111b of leakage current detection circuit 113 using control signal N.

[Circuit Configuration of Current Mirror Circuit 112]

Current mirror circuit 112 is comprised of NchMOS transistor $T_{n5}$ receiving generated potential $V_{g2}$ of reference voltage generating circuit 111 at a gate, PchMOS transistor $T_{p5}$ and PchMOS transistor $T_{p4}$ connected to the drain of Nch- MOS transistor $T_{n5}$, NchMOS transistor $T_{n4}$ and NchMOS transistor $T_{n3}$ connected to the drain of PchMOS transistor $T_{p4}$, PchMOS transistor $T_{p3}$ and PchMOS transistor $T_{p2}$ connected to the drain of NchMOS transistor $T_{n3}$, and NchMOS transistor $T_{n2}$ connected to the drain of PchMOS transistor $T_{p2}$.

Looked at functionally, current mirror circuit 112 is comprised of a plurality of stages of current mirror circuits where the gates are common, the sources are at the same potential, and transistors constituting pairs operate under the same operating conditions. Specifically, the current mirror circuit has a plurality of stages comprised of first current mirror circuit 112a composed of PchMOS transistor $T_{p5}$ and PchMOS transistor $T_{p4}$ connected to the drain of NchMOS transistor $T_{n5}$, second current mirror circuit 112b composed of NchMOS transistor $T_{n4}$ and NchMOS transistor $T_{n3}$ connected to the drain of PchMOS transistor $T_{p4}$, third current mirror circuit 112c composed of PchMOS transistor $T_{p3}$ and PchMOS transistor $T_{p2}$ connected to the drain of NchMOS transistor $T_{n3}$, and fourth current mirror circuit 112d composed of NchMOS transistor $T_{n2}$ and leakage current detection Nch transistor $T_{n1}$ connected to the drain of PchMOS transistor $T_{p2}$.

Of current mirror circuits 112a to 112d of the plurality of stages, first current mirror circuit 112a, second current mirror circuit 112b and third current mirror circuit 112c are current amplifier circuits for amplifying drain current $I_5$ of NchMOS transistor $T_{n5}$ taking generated potential $V_{g2}$ of reference voltage generating circuit 111 as a gate potential to a current value of an arbitrary ratio and flowing through NchMOS transistor $T_{n2}$. Fourth current mirror circuit 112d is a circuit for extracting drain potential $V_{g1}$ of NchMOS transistor $T_{n2}$ when drain current $I_2$ flows through NchMOS transistor $T_{n2}$ with the gate and drain common and applying this potential to leakage current detection NchMOS transistor $T_{n1}$.

Current mirror circuit 112 has superior features in that (1) a separate power supply is not required, (2) drain current can be amplified by an arbitrary ratio by changing the physical size of the transistor, specifically, the channel width W etc. which will be described later, (3) a multi-stage configuration (in this case, 3 stages) is possible, and (4) there is no influence due to fluctuation in supply voltage, temperature and process variations during leak current detection. Further, in the case of application to leakage current detection block 110, (5) the ratio of the current value of drain current $I_5$ flowing through NchMOS transistor $T_{n5}$ and the current value of NchMOS transistor $T_{n\ (LSI)}$ of internal circuit 130 can be theoretically controlled by the transistor size. Therefore, there is no influence due to fluctuation in supply voltage, temperature and process variations during leakage current detection (to be described in detail later). Namely, by using a current mirror circuit, an effect is obtained that detection and determination can be straightforward by amplifying arbitrarily set leakage detection current values, and it is possible to accelerate the response to substrate voltage control so that fluctuation of substrate voltage can also be suppressed. It is also possible to control the ratio of the value of drain current flowing through NchMOS transistor $T_{n1}$ and the current value of NchMOS transistor $T_{n\ (LSI)}$ of internal circuit 130 so that there is therefore no influence due to fluctuation in supply voltage, temperature and process variations during leakage current detection.

In this embodiment, by giving a current mirror circuit for amplifying a leakage detection current value as a three stage configuration (current mirror circuits 112a to 112c), it is possible to employ a current mirror circuit using normal transistor size and implementation is straightforward.

[Circuit Configuration of Leakage Current Detection Circuit 113]

Leakage current detection circuit 113 is comprised of leakage current detection NchMOS transistor $T_{n1}$ receiving potential $V_{g1}$ at a gate, PchMOS transistor $T_{p1}$ connected in series with leakage current detection NchMOS transistor $T_{n1}$, OR gate circuit G1, and inverter circuit G2.

Leakage current detection NchMOS transistor $T_{n1}$ with a drain connected to OR gate circuit G1, a source connected to low potential side supply voltage $V_{SS}$, a gate connected to the gate of NchMOS transistor $T_{n2}$ of current mirror circuit 112, constitutes the fourth current mirror circuit 112d with NchMOS transistor $T_{n2}$.

Further, PchMOS transistor $T_{p1}$ with a source connected to high potential side supply voltage $V_{DD}$ and a drain connected to leakage current detection NchMOS transistor $T_{n1}$, and constitutes a current mirror circuit with PchMOS transistor $T_{p9}$ of reference voltage generating circuit 111.

[Circuit Configuration of Substrate Voltage Control Block 120]

Substrate voltage control block 120 is comprised of controller 121 controlling substrate voltage by an operation mode signal from outside, and DA converter 122 D/A converting a digital value from controller 121 and generating a substrate voltage.

Figure 2:
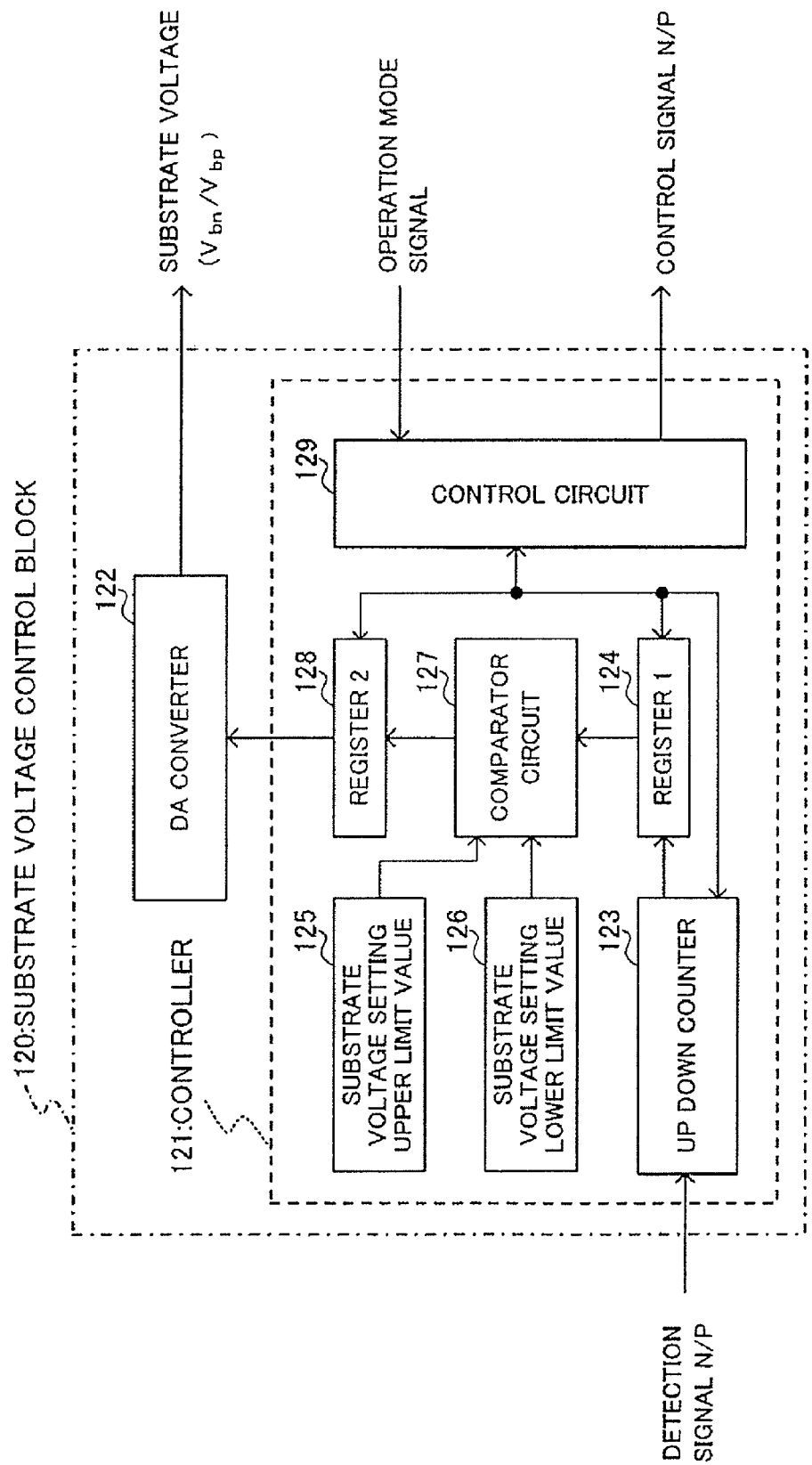
FIG. 2 shows a circuit configuration for a controller of a semiconductor integrated circuit apparatus according to Embodiment 1.

FIG. 2 shows a circuit configuration for controller 121. In FIG. 1 and FIG. 2, controller 121 is comprised of up-down counter 123, register 124 (register 1), substrate voltage setting upper limit value register 125, substrate voltage setting lower limit value register 126, comparator circuit 127, register 128 (register 2), and control circuit 129.

Controller 121 carries out control to change substrate voltage applied to the substrate of leakage current detection NchMOS transistor $T_{n1}$ and the substrate of the NchMOS transistors of internal circuit 130 by changing a count value of the up-down counter based on the output of gate circuit G1. DA converter 122 DA converts a digital value from controller 121 and generates a substrate voltage.

The value of register 2 from controller 121 is inputted to DA converter 122, and a substrate voltage corresponding to register 2 from DA converter 122 is applied to the substrate of leakage current detection NchMOS transistor $T_{n1}$ and the substrate of the NchMOS transistor of internal circuit 130. Further, DA converter 122 generates a substrate voltage via a buffer using, for example, an operational amplifier (an impedance converter circuit with an output of the DA converter connected to a +input terminal of an operational amplifier, and with the −input terminal and output terminal of the operational amplifier connected).

Internal circuit 130 may be any kind of circuit providing a circuit where threshold voltages of NchMOS transistors of the internal circuit are controlled by semiconductor integrated circuit apparatus 100, but here a CMOS circuit where gates of a PchMOS transistor and an NchMOS transistor connected in series are common is adopted as an example.

The above leakage current detection NchMOS transistor $T_{n1}$ may be arranged on the same substrate as the NchMOS transistor of internal circuit 130 or arranged on a separate substrate, and electrically connected.

A substrate voltage control operation for semiconductor integrated circuit apparatus 100 of the configuration described above will be described below. First, the operation of each block will be described, and followed by that, the threshold voltage control operation by substrate voltage control, and the theory of detecting leakage current $I_{LLCM}$ will be described.

[Operation of Leakage Current Detection Block 110]

(1) Operation of Reference Voltage Generating Circuit 111

First, at reference voltage generating circuit 111, a stable potential $V_{g2}$ is generated from the center of $T_{n6}$ and $T_{n7}$ as a result of NchMOS transistors $T_{n6}$ and $T_{n7}$ connected in series being made to operate in the sub-threshold region, and is applied to the gate of NchMOS transistor $T_{n5}$ of current mirror circuit 112.

(2) Operation of Current Mirror Circuit 112

At first current mirror circuit 112a of current mirror circuit 112, drain current $I_5$ of NchMOS transistor $T_{n5}$ is amplified by an arbitrary ratio (for example, ten times). The drain of PchMOS transistor $T_{p4}$ is connected to NchMOS transistor $T_{n4}$ constituting the second current mirror circuit 112b, and at the second current mirror circuit 112b, drain current $I_4$ amplified ten times by first current mirror circuit 112a of the front stage is further amplified by an arbitrary ratio (for example, ten times). The drain of NchMOS transistor $T_{n3}$ is connected to PchMOS transistor $T_{p3}$ constituting the third current mirror circuit 112c, and at the third current mirror circuit 112c, drain current $I_3$ amplified up to 100 times by second current mirror circuit 112b of the front stage is further amplified by an arbitrary ratio (for example, ten times). As a result, the current value of drain current $I_2$ of NchMOS transistor $T_{n2}$ becomes the current value of drain current $I_5$ of NchMOS transistor $T_{n5}$ amplified by an arbitrary ratio (in this case, 1000 times).

NchMOS transistor $T_{n2}$ of current mirror circuit 112 constitutes fourth current mirror circuit 112d with leakage current detection NchMOS transistor $T_{n1}$ of leakage current detection circuit 113, and drain potential $V_{g1}$ of NchMOS transistor $T_{n2}$ at the time drain current $I_2$ flows through NchMOS transistor $T_{n2}$ where a gate and drain are common is applied to the gate of leakage current detection NchMOS transistor $T_{n1}$.

The drain current $I_2$ of NchMOS transistor $T_{n2}$ is a current value that is the detection current value of drain current $I_5$ of NchMOS transistor $T_{n5}$ amplified 1000 times by current mirror circuits 112a to 112c and a potential $V_{g1}$ close to the threshold voltage of leakage current detection NchMOS transistor $T_{n1}$ is applied to leakage current detection NchMOS transistor $T_{n1}$ constituting current mirror circuit 112d together with NchMOS transistor $T_{n2}$. Therefore, as it is possible that leakage current detection NchMOS transistor $T_{n1}$ carries out a detection operation using an appropriate operation level, detection of leakage current, comparison of the detected leakage current and target current value and determination of the result after comparison are extremely straightforward. Further, it is possible to accelerate the response to substrate voltage control so that fluctuation of substrate voltage can also be suppressed.

(3) Operation of Leakage Current Detection Circuit 113

The drain of leakage current detection NchMOS transistor $T_{n1}$ is inputted to gate circuit G1, and a digital signal is outputted from gate circuit G1. Further, at gate circuit G1, control signal N from controller 121 of substrate voltage control block 120 is inputted, and if there is no other control signal N (if control signal N is an L level), gate circuit G1 becomes a buffer circuit or inverter circuit, and if there is control signal N, gate circuit G1 becomes an OR/NOR circuit or AND/NAND circuit. In Embodiment 1, an OR circuit is used. The output of gate circuit G1 is inputted to controller 121 of substrate voltage control block 120 as detection signal N. Control signal N of controller 121 is connected to the gate of PchMOS transistor $T_{p9}$ constituting constant current source 111b of leakage current detection circuit 113, and when leakage current detection circuit 113 is not operating, current is made not to flow through leakage current detection circuit 113 and the power consumed when leakage current detection circuit 113 is not operating can therefore be kept low. At this time, in order to prevent a situation where each of the transistors constituting the above constant current source 111b becomes a high-impedance state so as to cause circuit operation to become unstable, controller 121 inputs control signal N to gate circuit G1 so as to stop operation of this portion of the circuit.

[operation of Substrate Voltage Control Block 120]

Substrate voltage control block 120 includes two types, namely an analog scheme circuit and a digital scheme circuit, but here, an example of digital circuit will be described. As shown in FIG. 2, substrate voltage control block 120 is comprised of controller 121 comprised of up-down counter 123 controlling substrate voltage, register 124 (register 1), substrate voltage setting upper limit value register 125, substrate voltage setting lower limit value register 126, comparator circuit 127, register 128 (register 2) and control circuit 129, and DA converter 122 receiving a digital value from controller 121 and generating a substrate voltage. Control circuit 129 receives an operation mode signal and controls up-down counter 123 and registers 124 and 128. Further, control circuit 129 outputs control signal N to leakage current detection block 110. Control signal N is inputted to OR gate circuit G1 via inverter circuit G2, and operates of cutting current flowing through and fixing the output of OR gate circuit G1 at a high level when the leakage current detection block 110 is not operating. Substrate voltage generated by DA converter 122 is applied to the substrate of NchMOS transistor $T_{n\ (LSI)}$ equivalently representing the substrate of leakage current detection NchMOS transistor $T_{n1}$ and internal circuit 130.

Next, the threshold voltage control operation using substrate voltage control will be described.

In this embodiment, before starting the substrate voltage control operation, an up-down count value and register value are reset to zero (0) or are set to the value measured the previous time. Next, when control signal N becomes a high level (H), leakage current detection circuit 113 starts to operate. If drain current of leakage current detection NchMOS transistor $T_{n1}$ is smaller than a target current value generated by PchMOS transistor $T_{p1}$ constituting constant current source 111b, detection signal N outputted from OR gate circuit G1 becomes a high level, up-down counter 123 counts up, and a count value is stored in register 1. Comparator circuit 127 compares whether or not the inputted signal from register 1 exceeds the substrate voltage setting upper limit value or lower limit value, and stores the results of the comparison in register 2. DA converter 122 then outputs a substrate voltage corresponding to the value of register 2, and raises (makes shallow) the substrate voltage of leakage current detection NchMOS transistor $T_{n1}$. As a result, the threshold voltage of leakage current detection NchMOS transistor $T_{n1}$ becomes small, and the drain current of NchMOS transistor $T_{n1}$ becomes large.

Conversely, if the drain current of leakage current detection NchMOS transistor $T_{n1}$ is larger than a target current value, detection signal N becomes a low level, up-down counter 123 counts down, and the count value is stored in register 1. Comparator circuit 127 compares whether or not the inputted signal from register 1 exceeds the substrate voltage setting upper limit value or lower limit value, and stores the results of the comparison in register 2. DA converter 122 then outputs a substrate voltage corresponding to the value of register 2, and lowers (deepens) the substrate voltage of leakage current detection NchMOS transistor $T_{n1}$. As a result, the threshold voltage of leakage current detection NchMOS transistor $T_{n1}$ becomes large, and the drain current of NchMOS transistor $T_{n1}$ becomes small.

By repeating the above operation, the drain current of leakage current detection NchMOS transistor $T_{n1}$ finally converges to become the same as the target current value. If the drain current converges on the target current value, by fixing the value of register 2, stopping the operation of up-down counter 123, and making control signal N to L, it is also possible to fix the output of the OR gate circuit to a high level so as to ensure that current does not flow through leakage current detection circuit 113 and so as to prevent erroneous operation.

Further, when the internal circuit does not operate, for example at the time of turning on the power supply or in test mode, a threshold voltage control operation is carried out and values obtained for register 2 are saved, and at the time of normal operation mode, threshold voltage control of the internal circuit can be carried out using the value of register 2.

The lower limit of the output of substrate voltage control block 120 is preferably set to a voltage of a range where a GIDL (Gate-Induced Drain Leakage) effect does not occur at the NchMOS transistor. The GIDL effect is an effect where sub-threshold current increases when a back-bias that is a negative voltage to the substrate is excessively applied.

Further, the upper limit of the output of substrate voltage control block 120 is preferably set to a voltage of a range where the MOS transistor does not show bipolar characteristics. When a forward bias that is a positive voltage to the substrate is excessively applied, the MOS transistor shows a bipolar characteristic, the gain of the feedback of the threshold control circuit becomes extremely large, and the feedback system oscillates. Therefore, it is necessary to prevent the above.

Next, the capability that the ratio of the current value of a leakage current detection NchMOS transistor and the current value of the NchMOS transistor of internal circuit 130 can be controlled theoretically using transistor size will be described. In this way, there is no influence due to fluctuation in supply voltage, temperature and process variations during leakage current detection.

The relationship between leakage current $I_{L,\ LSI}$ of the NchMOS transistor $T_{n\ (LSI)}$ equivalently representing internal circuit 130 and leakage current $I_{L,\ LCM}$ of leakage current detection NchMOS transistor $T_{n1}$ will be described.

In FIG. 1, the current value $I_6$ of the constant current source is adjusted in such a manner that NchMOS transistor $T_{n6}$ and NchMOS transistor $T_{n7}$ of reference voltage generating circuit 111 operate in the sub-threshold region. Further, channel width of NchMOS transistor $T_{n6}$ is taken to be $W_1$, and channel width of NchMOS transistor $T_{n7}$ is taken to be $W_2$. At this time, a potential difference between gate potential $V_{g3}$ of NchMOS transistor $T_{n6}$ and potential $V_{SS}$ is taken to be equal to or smaller than the threshold voltage of NchMOS transistor $T_{n6}$ and NchMOS transistor $T_{n7}$.

Drain current of NchMOS transistor operating in the sub-threshold region is represented by the following equation (1).

[Equation 1]

$$I_{DS} = \frac{I_0}{W_0} W \cdot 10^{(V_{GS}-V_{TC})/S} \tag{1}$$

Here, W is channel width, $V_{GS}$ is gate-source voltage, $V_{TC}$ is $V_{GS}$ (threshold voltage) at the time drain current $I_0$ starts to flow through an MOS transistor of channel width $W_0$. S is referred to as "S parameter," and indicates the value of $V_{GS}$ required to lower the leakage current by one decimal place. This S parameter can be represented by the following equation (2).

[Equation 2]

$$S = \frac{kT}{q}\left(1 + \frac{C_{DP}}{C_{OX}}\right)\ln 10 \tag{2}$$

Therefore, the leakage current value of the NchMOS transistor $T_{n\ (LSI)}$ of internal circuit 130 can be represented by the following equation (3).

[Equation 3]

$$I_{L,LSI} = \frac{I_0}{W_0} W_{LSI} \cdot 10^{-V_{TC}/S} \tag{3}$$

The leakage current detected by leakage current detection NchMOS transistor $T_{n1}$ can be expressed by equation (4) based on equation (1).

[Equation 4]

$$I_{L,LCM} = \frac{I_0}{W_0} W_{LCM} \cdot 10^{(V_{g1}-V_{TC})/S} \tag{4}$$

With NchMOS transistor $T_{n6}$ and NchMOS transistor $T_{n7}$ of semiconductor integrated circuit apparatus 100 according to Embodiment 1, drain current can be expressed using equation (1), and as both are equal, the following equation (5) is satisfied.

[Equation 5]

$$W_1 \cdot 10^{(V_{gs}-V_{TC1})/S} = W_2 \cdot 10^{(V_{g3}-V_{g2}-V_{TC2})/S} \tag{5}$$

Here, $V_{TC1}$ is the threshold voltage of $T_{n6}$, and $V_{TC2}$ is the threshold voltage of $T_{n7}$. Gate potential $V_{g2}$ can therefore be expressed using the following equation (6).

[Equation 6]

$$V_{g2} = (V_{TC1} - V_{TC2}) + S \cdot \log\frac{W_2}{W_1} \approx S \cdot \log\frac{W_2}{W_1} \tag{6}$$

Further, assuming that the channel width ratio of PchMOS transistors $T_{p3}$ and $T_{p2}$ (third current mirror circuit 112c) constituting the current mirror circuits of current mirror circuit 112 from NchMOS transistors $T_{n2}$ to $T_{n5}$, NchMOS transistors $T_{n4}$ and $T_{n3}$ (second current mirror circuit 112b), and PchMOS transistors $T_{p5}$ and $T_{p4}$ (first current mirror circuit 112a) is ten times or one tenth of the channel length ratio, the current value of current $I_2$ becomes a current value that is 1000 times the current value of current $I_5$, and gate potential $V_{g1}$ can be expressed by the following equation (7).

[Equation 7]

$$V_{g1} = V_{g2} + 3S = S\left(\log\frac{W_2}{W_1} + 3\right) \tag{7}$$

Leakage current detection power of leakage current of NchMOS transistor $T_{n\,(LSI)}$ of internal circuit 130 and leakage current detection NchMOS transistor $T_{n1}$ can then be expressed by the following equation (8).

[Equation 8]

$$\frac{I_{L.LSI}}{I_{L.LCM}} = \frac{W_{LSI}}{W_{LCM}} \cdot 10^{-\left(\log \frac{W_2}{W_1} + 3\right)} = \frac{W_{LSI}}{W_{LCM}} \cdot \frac{W_1}{W_2} \cdot 10^{-3} \quad (8)$$

As can be seen from equation (8), the leakage current detection ratio has no influence due to fluctuation in supply voltage and temperature and process variations during leakage current detection so that it is possible to design the leakage current detection ratio by the ratio of channel width $W_1$ and $W_2$ of NchMOS transistor $T_{n6}$ and NchMOS transistor $T_{n7}$. Further, it is possible to increase the leakage detection current value of leakage current detection NchMOS transistor $T_{n1}$ by just an amount to increase the current value by an arbitrary ratio using the current mirror circuit.

In this embodiment, the substrates of NchMOS transistor $T_{n6}$ and NchMOS transistor $T_{n7}$ are electrically separated, but it is possible to connect the same substrate. In this event, an approximation of equation (6) is no longer satisfied and leakage current detection ratio is slightly dependant on temperature, but employment in practical uses is possible.

Embodiment 2

Embodiment 2 shows an example applied to a leakage current detection circuit using a leakage current detection PchMOS transistor.

Figure 3:
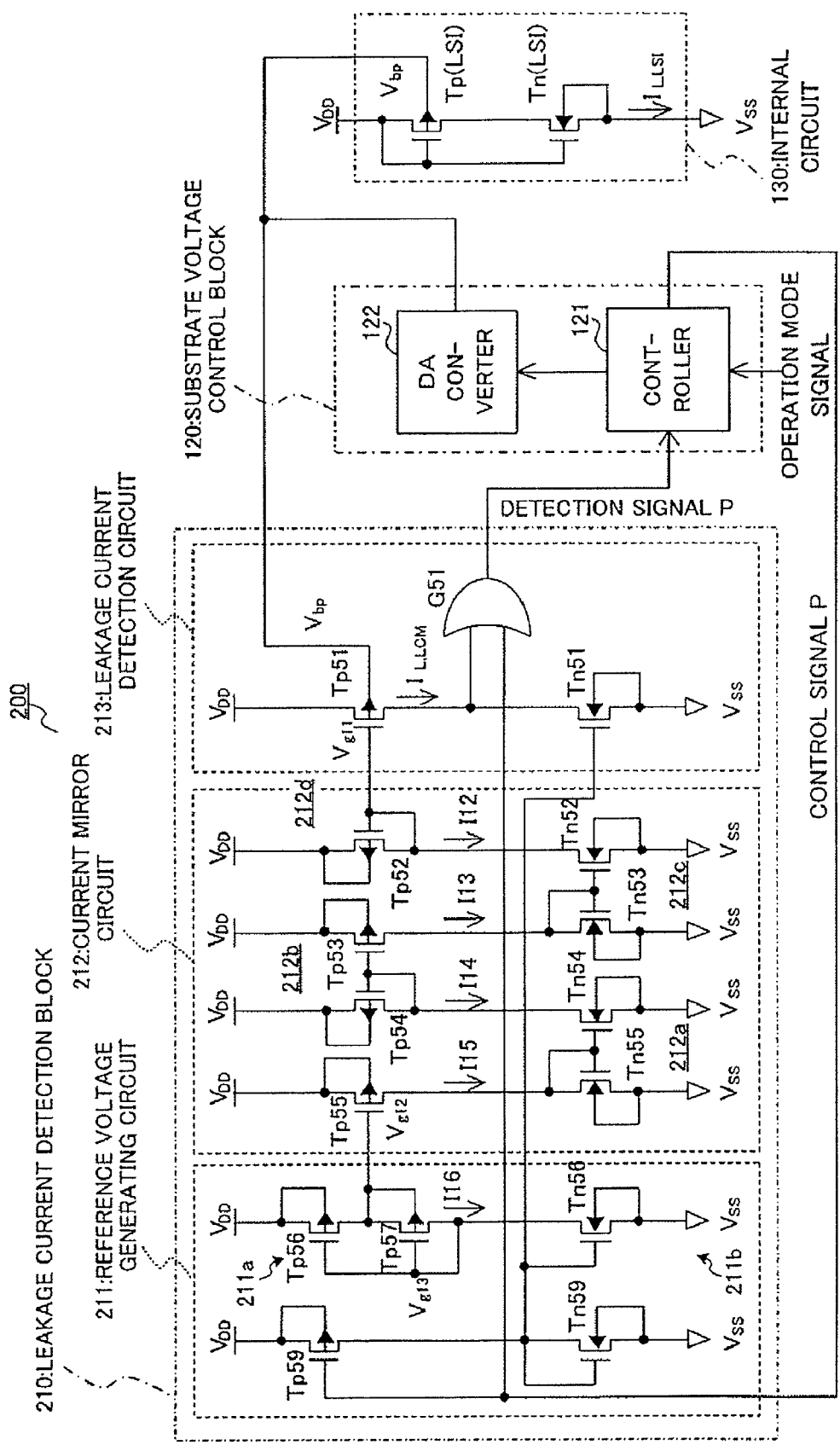
FIG. 3 shows a configuration for a semiconductor integrated circuit apparatus according to Embodiment 2 of the present invention.

FIG. 3 shows a configuration for a semiconductor integrated circuit apparatus according to Embodiment 2 of the present invention. This embodiment shows an example applied to semiconductor integrated circuit apparatus equipped with a PchMOS transistor leakage current detection circuit, substrate voltage control block, and internal circuit. Components identical to those in FIG. 1 are assigned the same numerals and description for the overlapped portions will be omitted.

In FIG. 3, semiconductor integrated circuit apparatus 200 is equipped with PchMOS transistor leakage current detection block 210, substrate voltage control block 120 controlling substrate voltage, and internal circuit 130 having a plurality of MOS transistors on a semiconductor substrate. Semiconductor integrated circuit apparatus 200 adopts a basic configuration employing leakage current detection PchMOS transistor $T_{p51}$ with a drain connected to a constant current source for leakage current detection of PchMOS transistor $T_{p\,(LSI)}$ equivalently representing internal circuit 130.

Leakage current detection block 210 is comprised of reference voltage generating circuit 211, current mirror circuit 212, and leakage current detection circuit 213. Leakage current detection block 210 arbitrarily amplifies a leakage current value of leakage current detection PchMOS transistor $T_{p51}$ of leakage current detection circuit 213 using current mirror circuit 212, and makes detection of leakage current and determination straightforward. Further, it is possible to accelerate the response to substrate voltage control so that fluctuation of substrate voltage can also be suppressed. Moreover, the configuration is such that current does not pass through leakage current detection circuit 213 when leakage current detection circuit 213 is not operating.

[Circuit Configuration of Reference Voltage Generating Circuit 211]

Reference voltage generating circuit 211 is comprised of PchMOS transistor $T_{p59}$ receiving control signal P from substrate voltage control block 120 at a gate, NchMOS transistor $T_{n59}$ connected to the drain of PchMOS transistor $T_{p59}$, NchMOS transistor $T_{n56}$ with the drain of NchMOS transistor $T_{n59}$ connected to the gate, and PchMOS transistor $T_{p56}$ and PchMOS transistor $T_{p57}$ connected in series with NchMOS transistor $T_{n56}$.

Looked at functionally, reference voltage generating circuit 211 is comprised of PchMOS transistor $T_{p56}$ and PchMOS transistor $T_{p57}$ constituting voltage generating section 211a that generates a potential for generating gate potential $V_{g11}$ of leakage current detection PchMOS transistor $T_{p51}$ of leakage current detection circuit 213, and PchMOS transistor $T_{p59}$, NchMOS transistor $T_{n59}$, NchMOS transistor $T_{n56}$ and NchMOS transistor $T_{n51}$ of leakage current detection circuit 213 constituting constant current source 211b that supplies a constant current to this PchMOS transistor $T_{p56}$ and PchMOS transistor $T_{p57}$.

In voltage generating section 211a of reference voltage generating circuit 211, PchMOS transistor $T_{p56}$ and PchMOS transistor $T_{p57}$ are connected in series, the source of NchMOS transistor $T_{n56}$ is connected to high potential side supply voltage $V_{DD}$, the drain of PchMOS transistor $T_{p57}$ is connected to a separate constant current source 211b, this substrate is connected to the source of PchMOS transistor $T_{p57}$, and the gates of PchMOS transistor $T_{p56}$ and PchMOS transistor $T_{p57}$ respectively are connected in common and connected to the drain of PchMOS transistor $T_{p57}$. Drain potential $V_{g12}$ of PchMOS transistor $T_{p56}$ is applied to the gate of PchMOS transistor $T_{p55}$. Potential $V_{g12}$ of the drain of PchMOS transistor $T_{p56}$ and the source of PchMOS transistor $T_{p57}$ constitutes the generated potential of reference voltage generating circuit 211. The relationship between the gate potential $V_{g13}$ of PchMOS transistor $T_{p56}$ and PchMOS transistor $T_{p57}$, and the above potential $V_{g12}$ is the same as Embodiment 1.

As an example circuit of constant current source 211b, this embodiment is comprised of PchMOS transistor $T_{p59}$ with a source connected to high potential side supply voltage $V_{DD}$ and control signal P received at a gate, NchMOS transistor $T_{n59}$ with a source connected to low potential side supply voltage $V_{SS}$, and a gate and drain connected to the drain of PchMOS transistor $T_{p59}$, and NchMOS transistor $T_{n56}$ and NchMOS transistor $T_{n51}$ constituting a current mirror circuit with NchMOS transistor $T_{n59}$.

It is then possible to keep the power consumed when leakage current detection circuit 213 is not operating low by controlling PchMOS transistor $T_{p59}$ within the circuit constituting constant current source 111b of leakage current detection circuit 213 using control signal P.

[Circuit Configuration of Current Mirror Circuit 212]

Current mirror circuit 212 is comprised of PchMOS transistor $T_{p55}$ receiving generated potential $V_{g12}$ of reference voltage generating circuit 211 at a gate, NchMOS transistor $T_{n55}$ and NchMOS transistor $T_{n54}$ connected to the drain of PchMOS transistor $T_{p55}$, PchMOS transistor $T_{p54}$ and PchMOS transistor $T_{p53}$ connected to the drain of NchMOS transistor $T_{n54}$, NchMOS transistor $T_{n53}$ and NchMOS transistor $T_{n52}$ connected to the drain of PchMOS transistor $T_{p53}$, and PchMOS transistor $T_{p52}$ connected to the drain of NchMOS transistor $T_{n52}$.

Further looked at functionally, current mirror circuit 212 has a plurality of stages comprised of first current mirror circuit 212a composed of NchMOS transistor $T_{n55}$ and Nch- MOS transistor $T_{n54}$ connected to the drain of PchMOS transistor $T_{p55}$, second current mirror circuit 212b composed of PchMOS transistor $T_{p54}$ and PchMOS transistor $T_{p53}$ connected to the drain of NchMOS transistor $T_{n54}$, third current mirror circuit 212c composed of NchMOS transistor $T_{n53}$ and NchMOS transistor $T_{n52}$ connected to the drain of PchMOS transistor $T_{p53}$, and fourth current mirror circuit 212d composed of PchMOS transistor $T_{p52}$ and leakage current detection Pch transistor $T_{p51}$ connected to the drain of NchMOS transistor $T_{n52}$.

Of the current mirror circuits 212a to 212d of the plurality of stages, first current mirror circuit 212a, second current mirror circuit 212b and third current mirror circuit 212c are current amplifier circuits for amplifying drain current $I_{15}$ of PchMOS transistor $T_{p55}$ taking generated potential $V_{g12}$ of reference voltage generating circuit 211 as a gate potential to a current value of an arbitrary ratio and flowing through PchMOS transistor $T_{p52}$. Fourth current mirror circuit 212d is a circuit for extracting drain potential $V_{g11}$ of PchMOS transistor $T_{p52}$ when drain current $I_{12}$ flows through PchMOS transistor $T_{p52}$ with the gate and drain common and applying this potential to leakage current detection PchMOS transistor $T_{p51}$.

As in Embodiment 1, each current mirror circuit 212a to 212c can amplify the current values by an arbitrary ratio depending on the design.

[Circuit Configuration of Leakage Current Detection Circuit 213]

Leakage current detection circuit 213 is comprised of leakage current detection PchMOS transistor $T_{p51}$ receiving potential $V_{g11}$ at a gate, NchMOS transistor $T_{n51}$ connected in series with leakage current detection PchMOS transistor $T_{p51}$, and OR gate circuit G51.

Leakage current detection PchMOS transistor $T_{p51}$ with a drain connected to OR gate circuit G51, a source connected to high potential side supply voltage $V_{DD}$, and a gate connected to the gate of PchMOS transistor $T_{p52}$ of current mirror circuit 212 constitutes the fourth current mirror circuit 212d with PchMOS transistor $T_{p52}$.

Further, NchMOS transistor $T_{n51}$ with a source connected to low potential side supply voltage $V_{SS}$ and a drain connected to leakage current detection PchMOS transistor $T_{p51}$ constitutes a current mirror circuit with NchMOS transistor $T_{n59}$ of reference voltage generating circuit 211.

By increasing the detection current value of leakage current detection PchMOS transistor $T_{p51}$, detection of leakage current, comparison of the detected leakage current and target current value and determination of the result after comparison are extremely straightforward. Further, it is possible to accelerate the response to substrate voltage control so that fluctuation of substrate voltage can also be suppressed.

Moreover, the circuit configuration of substrate voltage control block 120 and internal circuit 130 is identical to those in FIG. 1 and FIG. 2, and description thereof will be omitted.

A substrate voltage control operation for semiconductor integrated circuit apparatus 200 of the configuration described above will be described.

The theory of operation is exactly the same as for FIG. 1 simply with NchMOS transistors changed for PchMOS transistors, and vice versa.

[Operation of Leakage Current Detection Block 210]

(1) Operation of Reference Voltage Generating Circuit 211

First, at reference voltage generating circuit 211, a stable potential $V_{g12}$ is generated from the center of $T_{p56}$ and $T_{p57}$ as a result of PchMOS transistors $T_{p56}$ and $T_{p57}$ connected in series being made to operate in the sub-threshold region, and is applied to the gate of PchMOS transistor $T_{p55}$ of current mirror circuit 212.

(2) Operation of Current Mirror Circuit 212

At first current mirror circuit 212a of current mirror circuit 212, drain current $I_{15}$ of PchMOS transistor $T_{p55}$ is amplified by an arbitrary ratio (for example, ten times). The drain of NchMOS transistor $T_{n54}$ is connected to PchMOS transistor $T_{p54}$ constituting the second current mirror circuit 212b, and at the second current mirror circuit 212b, drain current $I_{14}$ amplified ten times by first current mirror circuit 212a of the front stage is further amplified by an arbitrary ratio (for example, ten times). The drain of PchMOS transistor $T_{p53}$ is connected to NchMOS transistor $T_{n53}$ constituting the third current mirror circuit 212c, and at the third current mirror circuit 212c, drain current $I_{13}$ amplified up to 100 times by second current mirror circuit 212b of the front stage is amplified by an arbitrary ratio (for example, ten times). As a result, the current value of drain current $I_{12}$ of PchMOS transistor $T_{p52}$ becomes the current value of drain current $I_{15}$ of NchMOS transistor $T_{p55}$ amplified by an arbitrary ratio (in this case, 1000 times).

PchMOS transistor $T_{p52}$ of current mirror circuit 212 constitutes fourth current mirror circuit 212d with leakage current detection PchMOS transistor $T_{p51}$ of leakage current detection circuit 213, and drain potential $V_{g11}$ of PchMOS transistor $T_{p52}$ at the time drain current $I_{12}$ flows through PchMOS transistor $T_{p52}$ where a gate and drain are common is applied to the gate of leakage current detection PchMOS transistor $T_{p51}$.

The drain current $I_{12}$ of PchMOS transistor $T_{p52}$ is a current value that is the detection current value of drain current $I_{15}$ of PchMOS transistor $T_{p55}$ amplified 1000 times by current mirror circuits 212a to 212c and a potential $V_{g11}$ close to the threshold voltage of leakage current detection PchMOS transistor $T_{p51}$ is applied to leakage current detection PchMOS transistor $T_{p51}$ constituting a current mirror circuit 212d together with PchMOS transistor $T_{p52}$. Therefore, as it is possible that leakage current detection PchMOS transistor $T_{p51}$ carries out a detection operation using an appropriate operation level, detection of leakage current, comparison of the detected leakage current and target current value and determination of the result after comparison are extremely straightforward. Further, it is possible to accelerate the response to substrate voltage control so that fluctuation of substrate voltage can also be suppressed.

(3) Operation of Leakage Current Detection Circuit 213

The drain of leakage current detection PchMOS transistor $T_{p51}$ is inputted to gate circuit G51, control signal P from controller 121 of substrate voltage control block 120 is inputted, and a digital signal is outputted from gate circuit G51. The output of gate circuit G51 is inputted to controller 121 of substrate voltage control block 120. Control signal P of controller 121 is connected to the gate of NchMOS transistor $T_{n59}$ constituting constant current source 211b of leakage current detection circuit 213, and when leakage current detection circuit 213 is not operating, current is made not to flow through leakage current detection circuit 213 and the power consumed when leakage current detection circuit 213 is not operating can therefore be kept low. At this time, in order to prevent a situation where each of the transistors constituting the above constant current source 211b becomes a high-impedance state so as to cause circuit operation to become unstable, controller 121 inputs control signal P to gate circuit G51 so as to stop operation of this portion of the circuit.

[Operation of Substrate Voltage Control Block 120]

As shown in FIG. 2, substrate voltage control block 120 is comprised of controller 121 with a register built-in used in substrate voltage control, and DA converter 122 receiving a digital value from controller 121 and generating a substrate voltage. Substrate voltage generated by substrate voltage control block 120 is applied to the substrate of PchMOS transistor $T_{p\ (LSI)}$ equivalently representing the substrate of leakage current detection PchMOS transistor $T_{p51}$ and internal circuit 130.

In this embodiment, before starting the substrate voltage control operation, an up-down count value and register value are reset to zero (0) or are set to the value measured the previous time. Next, when control signal P becomes a high level (H), leakage current detection circuit 213 starts to operate. If drain current of leakage current detection PchMOS transistor $T_{p51}$ is smaller than a target current value generated by NchMOS transistor $T_{n51}$ constituting constant current source 211b, detection signal P outputted from OR gate circuit G51 becomes a high level, up-down counter 123 counts up, and a count value is stored in register 1. Comparator circuit 127 compares whether or not the inputted signal from register 1 exceeds the substrate voltage setting upper limit value or lower limit value, and stores the results of the comparison in register 2. DA converter 122 then outputs a substrate voltage corresponding to the value of register 2, and raises (makes shallow) the substrate voltage of leakage current detection PchMOS transistor $T_{p51}$. As a result, the threshold voltage of leakage current detection PchMOS transistor $T_{p51}$ becomes small, and the drain current of PchMOS transistor $T_{p51}$ becomes large.

Conversely, if the drain current of leakage current detection PchMOS transistor $T_{p51}$ is larger than a target current value, detection signal P becomes a low level, up-down counter 123 counts down, and the count value is stored in register 1. Comparator circuit 127 compares whether or not the inputted signal from register 1 exceeds the substrate voltage setting upper limit value or lower limit value, and stores the results of the comparison in register 2. DA converter 122 then outputs a substrate voltage corresponding to the value of register 2, and lowers (deepens) the substrate voltage of leakage current detection PchMOS transistor $T_{p51}$. As a result, the threshold voltage of leakage current detection PchMOS transistor $T_{p51}$ becomes large, and the drain current of PchMOS transistor $T_{p51}$ becomes small.

By repeating the above operation, the drain current of leakage current detection PchMOS transistor $T_{p51}$ finally converges to become the same as the target current value. If the drain current converges on the target current value, by fixing the value of register 2, stopping the operation of up-down counter 123, and making control signal P to L, it is also possible to fix the output of the OR gate circuit 51 to a high level so as to ensure that current does not flow through leakage current detection circuit 213 and so as to prevent erroneous operation.

According to this embodiment, application is possible to a leakage current detection circuit employing a leakage current detection PchMOS transistor, and the same effects as for Embodiment 1 can be obtained, namely, detection of leakage current, comparison of the detected leakage current and target current value and determination of the result after comparison are extremely straightforward. Further, it is possible to accelerate the response to substrate voltage control so that fluctuation of substrate voltage can also be suppressed.

In the above Embodiment 1 and Embodiment 2, an odd number of stages of current mirror circuits are used, but when a current mirror circuit of an even number of stages is used, a combination of the reference voltage generating circuit of Embodiment 1 and the leakage current detection circuit of Embodiment 2, or a combination of the reference voltage generating circuit of working Example 2 and the leakage current detection circuit of Working Example 1 is possible.

Embodiment 3

Embodiment 3 is an example of applying a voltage amplifying circuit instead of a current mirror circuit at a leakage current detection circuit employing a leakage current detection NchMOS transistor.

Figure 4:
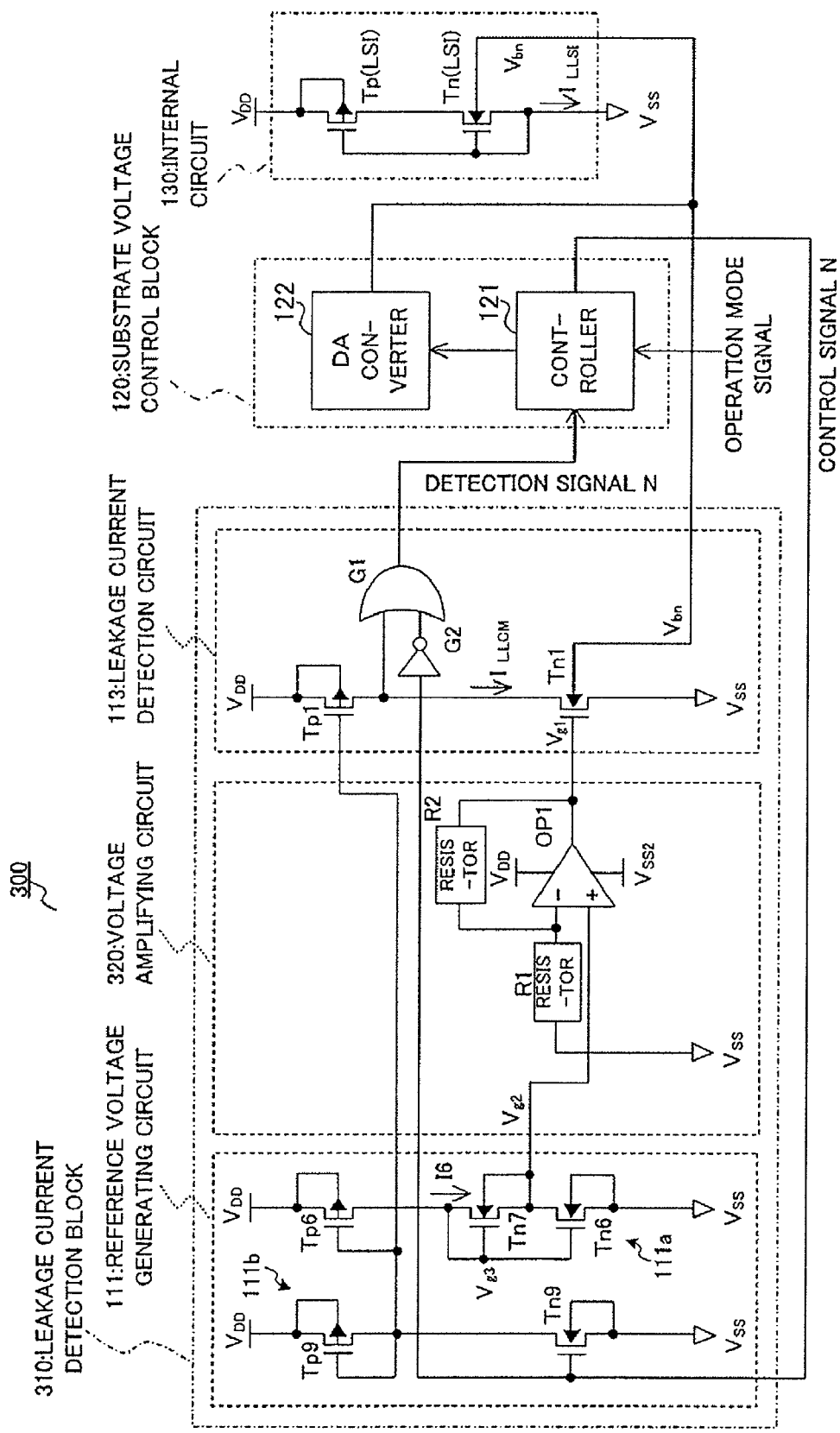
FIG. 4 shows a configuration for a semiconductor integrated circuit apparatus according to Embodiment 3 of the present invention.

FIG. 4 shows a configuration for a semiconductor integrated circuit apparatus according to Embodiment 3 of the present invention. This embodiment shows an example applied to semiconductor integrated circuit apparatus equipped with an NchMOS transistor leakage current detection circuit, substrate voltage control block, and internal circuit. Components identical to those in FIG. 1 are assigned the same numerals and description for the overlapped portions will be omitted.

In FIG. 4, semiconductor integrated circuit apparatus 300 is equipped with NchMOS transistor leakage current detection block 310, substrate voltage control block 120 controlling substrate voltage, and internal circuit 130 having a plurality of MOS transistors on a semiconductor substrate. Semiconductor integrated circuit apparatus 300 adopts a basic configuration employing leakage current detection NchMOS transistor $T_{n1}$ with a drain connected to a constant current source, for leakage current detection of the NchMOS transistor $Tn_{(LSI)}$ equivalently representing internal circuit 130.

Leakage current detection block 310 is comprised of reference voltage generating circuit 111, voltage amplifying circuit 320, and leakage current detection circuit 113. Leakage current detection block 310 arbitrarily amplifies a leakage current value of leakage current detection NchMOS transistor $T_{n1}$ of leakage current detection circuit 113 using voltage amplifying circuit 320, and makes detection of leakage current and determination straightforward. Further, it is possible to accelerate the response to substrate voltage control so that fluctuation of substrate voltage can also be suppressed. Moreover, the configuration is such that current does not pass through leakage current detection circuit 113 when leakage current detection circuit 113 is not operating.

Voltage amplifying circuit 320 is comprised of operational amplifier $OP_1$, and resistors $R_1$ and $R_2$. The drain of NchMOS transistor $T_{n6}$ of reference voltage generating circuit 111 is connected to a + input of operational amplifier $OP_1$, a − input of operational amplifier $OP_1$ is connected to low potential side supply voltage $V_{SS}$ via resistor $R_1$, and is connected to the output of operational amplifier $OP_1$ via resistor $R_2$. High potential side supply voltage $V_{DD}$ is applied as a + supply to operational amplifier $OP_1$, and a supply voltage $V_{SS2}$ that is lower than $V_{SS}$ is applied as a − supply voltage. Output of operational amplifier $OP_1$ is connected to the gate of leakage current detection NchMOS transistor $T_{n1}$. A substrate voltage control operation for semiconductor integrated circuit apparatus 300 of the configuration described above will be described below.

The relationship between drain potential $V_{g2}$ of NchMOS transistor $T_{n6}$ of reference voltage generating circuit 111 and gate potential $V_{g1}$ of leakage current detection NchMOS transistor $T_{n1}$ is expressed in the following equation (9).

[Equation 9]

$$V_{g1} = V_{g2} \cdot \frac{R_1 + R_2}{R_1} \quad (9)$$

Gate potential $V_{g2}$ can be expressed by equation (6) and gate potential $V_{g1}$ can be expressed by the following equation (10).

[Equation 10]

$$V_{g1} = S \cdot \frac{R_1 + R_2}{R_1} \cdot \log\frac{W_2}{W_1} \quad (10)$$

Leakage current detection ratio of leakage current of NchMOS transistor $T_{n\ (LSI)}$ of internal circuit 130 and leakage current detection NchMOS transistor $T_{n1}$ can then be expressed by the following equation (11).

[Equation 11]

$$\frac{I_{L.LSI}}{I_{L.LCM}} = \frac{W_{LSI}}{W_{LCM}} \cdot \left(\frac{W_1}{W_2}\right)^{\frac{R_1+R_2}{R_1}} \quad (11)$$

As can be seen from equation (11), the leakage current detection ratio has no influence due to fluctuation in supply voltage and temperature and process variations so that it is possible to design the leakage current detection ratio by the ratio of channel width $W_1$ and $W_2$ of NchMOS transistor $T_{n6}$ and NchMOS transistor $T_{n7}$ and the values of resister $R_1$ and resister $R_2$. Further, it is possible to increase the current value by an arbitrary ratio using voltage amplifying circuit 320. Therefore, it is possible to increase leakage detection current value according to the portion of increase in potential.

According to this embodiment, it is possible to obtain $V_{g1}$ that is $V_{g2}$ amplified by an arbitrary ratio even by using voltage amplifying circuit 320 that uses operational amplifiers instead of current mirror circuit 112, and the same effects as for Embodiment 1 can be obtained.

Embodiment 4

Embodiment 4 is an example of applying a voltage amplifying circuit instead of a current mirror circuit at a leakage current detection circuit employing a leakage current detection PchMOS transistor.

Figure 5:
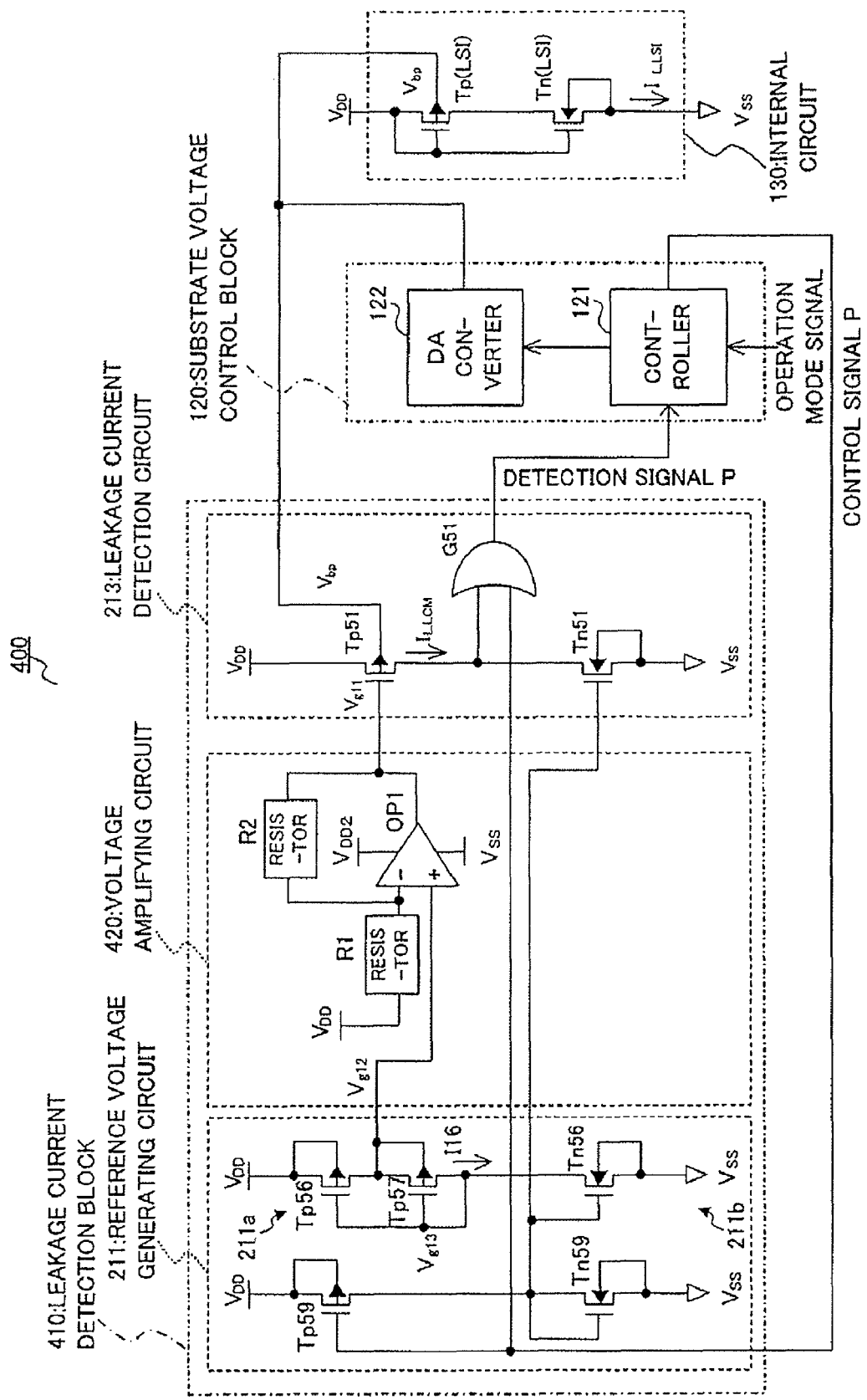
FIG. 5 shows a configuration for a semiconductor integrated circuit apparatus according to Embodiment 4 of the present invention.

FIG. 5 shows a configuration for a semiconductor integrated circuit apparatus according to Embodiment 4 of the present invention. This embodiment shows an example applied to semiconductor integrated circuit apparatus equipped with a PchMOS transistor leakage current detection circuit, substrate voltage control block, and internal circuit. Components identical to those in FIG. 3 are assigned the same numerals and description for the overlapped portions will be omitted.

In FIG. 5, semiconductor integrated circuit apparatus 400 is equipped with PchMOS transistor leakage current detection block 410, substrate voltage control block 120 controlling substrate voltage, and internal circuit 130 having a plurality of MOS transistors on a semiconductor substrate. Semiconductor integrated circuit apparatus 200 adopts a basic configuration employing leakage current detection PchMOS transistor $T_{p51}$ with a drain connected to a constant current source for leakage current detection of PchMOS transistor $T_{p\ (LSI)}$ equivalently representing internal circuit 130.

Leakage current detection block 410 is comprised of reference voltage generating circuit 211, voltage amplifying circuit 420, and leakage current detection circuit 213. Leakage current detection block 410 arbitrarily amplifies a leakage current value of leakage current detection PchMOS transistor $T_{p51}$ of leakage current detection circuit 213 using voltage amplifying circuit 420, and makes detection of leakage current and determination straightforward. Further, it is possible to accelerate the response to substrate voltage control so that fluctuation of substrate voltage can also be suppressed. Moreover, the configuration is such that current does not pass through leakage current detection circuit 213 when leakage current detection circuit 213 is not operating.

Voltage amplifying circuit 420 is comprised of operational amplifier $OP_1$ and resistors $R_1$ and $R_2$, as with voltage amplifying circuit 320 of FIG. 4. The drain of PchMOS transistor $T_{p56}$ of reference voltage generating circuit 211 is connected to a + input of operational amplifier $OP_1$, a − input of operational amplifier $OP_1$ is connected to high potential side supply voltage $V_{DD}$ via resistor $R_1$, and is connected to the output of operational amplifier $OP_1$ via resistor $R_2$. High potential side supply voltage $V_{DD2}$ that is a supply voltage higher than high potential side supply voltage $V_{DD}$ is applied to operational amplifier $OP_1$ as a + supply, and low potential side supply $V_{SS}$ is applied as a − supply. Output of operational amplifier $OP_1$ is connected to the gate of leakage current detection PchMOS transistor $T_{p51}$.

Semiconductor integrated circuit apparatus 400 of this embodiment applies voltage amplifying circuit 420 instead of current mirror circuit 212 of semiconductor integrated circuit apparatus 200 of FIG. 3, and the theory of operation is the same as Embodiment 2 of FIG. 3. Further, the operation of voltage amplifying circuit 420 is also exactly the same as the substrate voltage control operation of voltage amplifying circuit 320 of Embodiment 3 of FIG. 4.

It is therefore possible to obtain the same effects as for Embodiments 1 to 3.

Embodiment 5

Embodiment 5 is an example of applying a separate reference potential generating circuit to the reference potential generating circuit of the leakage current detection block.

Figure 6:
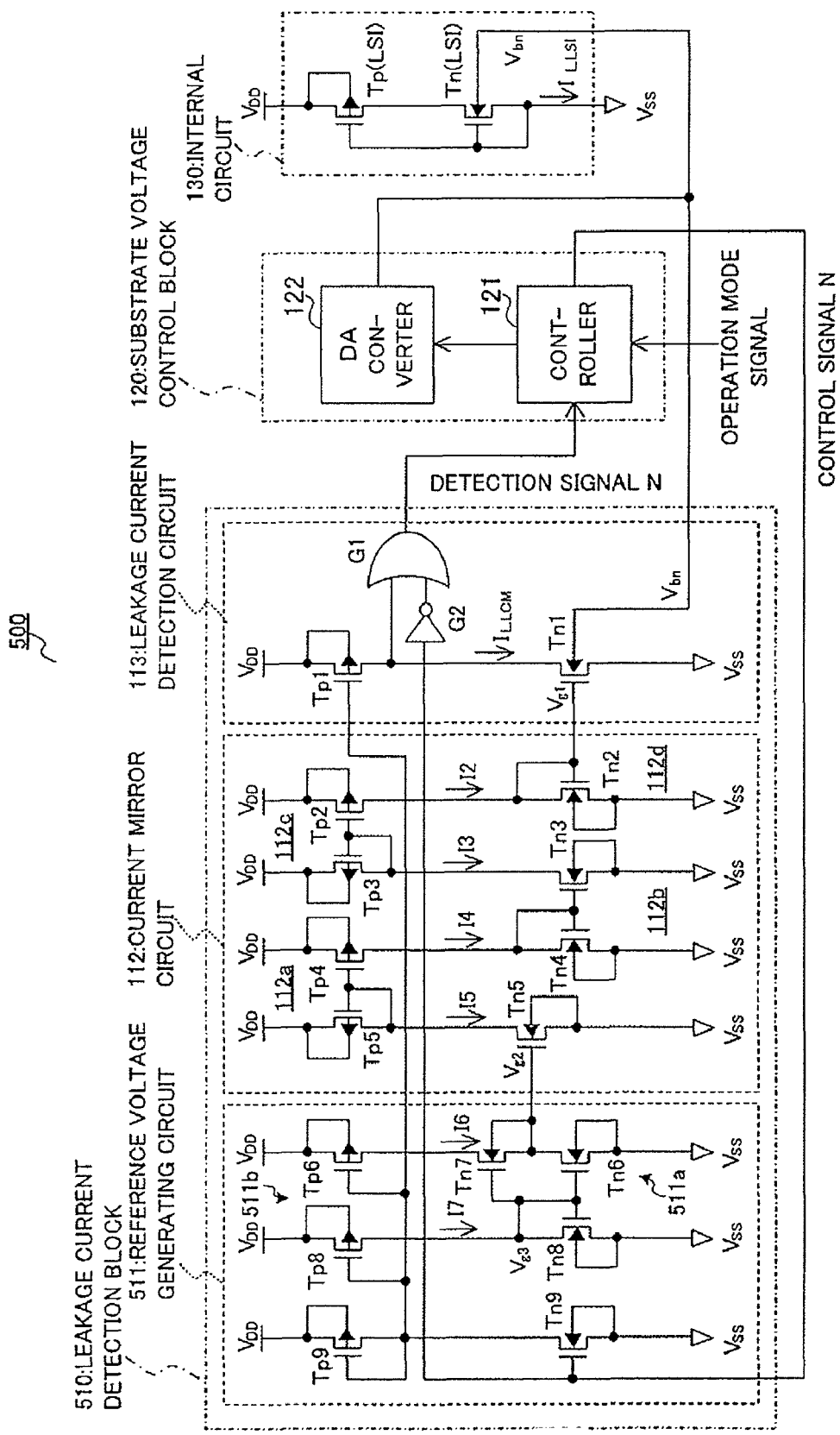
FIG. 6 shows a configuration for a semiconductor integrated circuit apparatus according to Embodiment 5 of the present invention.

FIG. 6 shows a configuration for a semiconductor integrated circuit apparatus according to Embodiment 5 of the present invention. This embodiment shows an example applied to semiconductor integrated circuit apparatus equipped with an NchMOS transistor leakage current detection circuit, substrate voltage control block, and internal circuit. Components identical to those in FIG. 1 are assigned the same numerals and description for the overlapped portions will be omitted.

In FIG. 6, semiconductor integrated circuit apparatus 500 is equipped with NchMOS transistor leakage current detection block 510, substrate voltage control block 120 controlling substrate voltage, and internal circuit 130 having a plurality of MOS transistors on a semiconductor substrate. Semiconductor integrated circuit apparatus 500 adopts a basic configuration employing leakage current detection NchMOS transistor $T_{n1}$ with a drain connected to a constant current source, for leakage current detection of NchMOS transistor $T_{n\ (LSI)}$ equivalently representing internal circuit 130.

Leakage current detection block 510 is comprised of reference voltage generating circuit 511, current mirror circuit 112, and leakage current detection circuit 113. Leakage current detection block 510 arbitrarily amplifies a leakage current value of leakage current detection NchMOS transistor $T_{n1}$ of leakage current detection circuit 113 using current mirror circuit 112, and makes detection of leakage current and determination straightforward. Further, it is possible to accelerate the response to substrate voltage control so that fluctuation of substrate voltage can also be suppressed. Moreover, the configuration is such that current does not pass through leakage current detection circuit 113 when leakage current detection circuit 113 is not operating.

Reference voltage generating circuit 511 is comprised of NchMOS transistor $T_{n6}$ and NchMOS transistor $T_{n7}$ constituting voltage generating section 511a that generates a potential for generating gate potential $V_{g1}$ of leakage current detection NchMOS transistor $T_{n1}$ of leakage current detection circuit 113, NchMOS transistor $T_{n8}$ with a source connected to low potential side supply voltage $V_{SS}$, and a drain and gate further connected to a separate constant current source 511b, NchMOS transistor $T_{n9}$, PchMOS transistor $T_{p9}$, PchMOS transistor $T_{p8}$, PchMOS transistor $T_{p6}$, and PchMOS transistor $T_{p1}$ of leakage current detection circuit 113 constituting constant current source 511b that supplies a constant current to this NchMOS transistor $T_{n8}$, NchMOS transistor $T_{n6}$ and NchMOS transistor $T_{n7}$.

Namely, reference voltage generating circuit 511 is such that NchMOS transistor $T_{n8}$ with a source connected to low potential side supply voltage $V_{SS}$, and a drain and gate further connected to a separate constant current source 511b is further added to reference voltage generating circuit 111 of FIG. 1, the gates of NchMOS transistors $T_{n6}$ and $T_{n7}$ are connected in common, and are connected to the drain of NchMOS transistor $T_{n8}$.

In other words, a configuration is adopted where a drain voltage of NchMOS transistor $T_{n8}$ with the gate and drain connected to constant current source 511b and the source connected to $V_{SS}$ is applied to gate potential $V_{g3}$ of NchMOS transistors $T_{n6}$ and $T_{n7}$ generating a reference potential.

Here, the relationship of current $I_6$ flowing through NchMOS transistors $T_{n6}$ and $T_{n7}$ and current $I_7$ flowing through NchMOS transistor $T_{n8}$ are given as follows.

Figure 24:
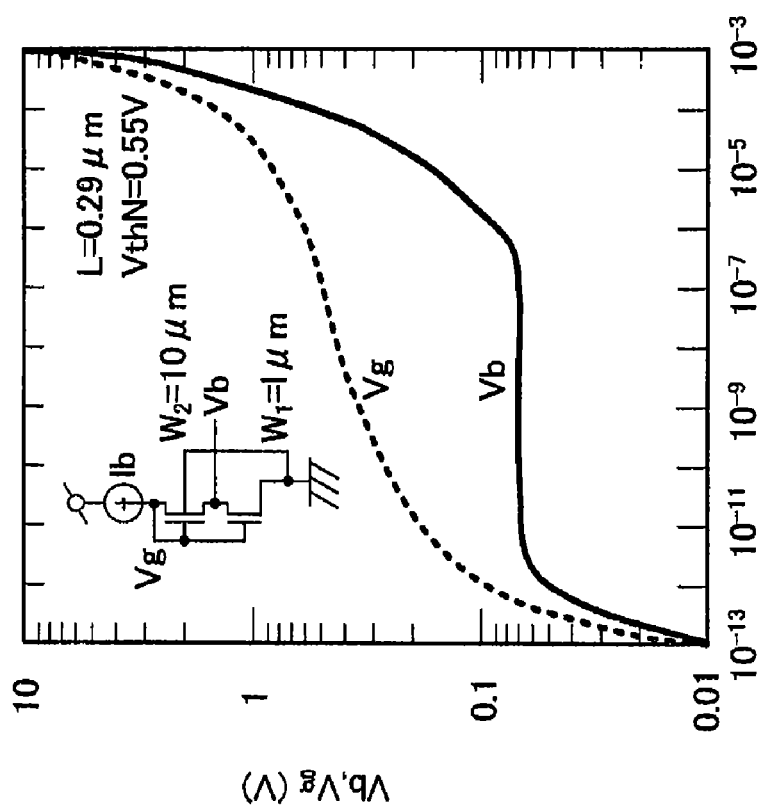
FIG. 24 shows the relationship between $V_g$, $V_b$ and $I_b$ of semiconductor integrated circuit apparatus of the related art.

FIG. 24 shows the relationship between $V_g$ and $V_b$, and $I_b$ of a semiconductor integrated circuit apparatus of the related art.

Referring to Document 2 of the related art, as shown in FIG. 24, the threshold voltage of each NchMOS transistor is taken to be 0.55V, $W_2/W_1=10$, $W_3=W_2$, and the S parameter is taken to be 0.08V, and assuming that $V_{g3}=0.55V$, $V_{g2}=0.08V$, then the gate-source voltage $V_{gs}$ of NchMOS transistor $T_{n7}$ can be expressed by the following equation (12).

[Equation 12]

$$V_{gs}=V_{g3}-V_{g2}=0.55V-S \quad (12)$$

Therefore, $I_6$ and $I_7$ can be expressed by the following equation (13).

[Equation 13]

$$I_7=10 \cdot I_6 \quad (13)$$

Namely, the current $I_7$ flowing through $T_{n8}$ is ten times the current $I_6$ flowing through $T_{n6}$ and $T_{n7}$.

As with the apparatus disclosed in Document 2 as a constant current source, considering the case of a PchMOS transistor with a gate connected to $V_{SS}$ and a source connected to $V_{DD}$, taking, for example, $I_6=1$ nA, $I_7=10$ nA, when on resistance of a PchMOS transistor of minimum dimensions is taken to be approximately 200KΩ, channel width of constant current source PchMOS transistor $T_{p6}$ with current $I_6$ flowing through is taken to be approximately 200KΩ, channel length becomes 650 μm, and the channel length of constant current source PchMOS transistor $T_{p7}$ with current $I_7$ flowing through becomes 65 μm. In this case, it is possible to make the size of the constant current source transistor one tenth smaller.

Further, in this embodiment, the size of the circuit increases compared to the apparatus disclosed in document 2, but by deciding the current value using NchMOS transistor $T_{n9}$, and constituting a current mirror circuit with NchMOS transistor $T_{p9}$ as constant current source 511b, it is no longer necessary to use an MOS transistor with an extremely long channel length as described above, the increase in surface area due to the circuit increase is only slight, and the effects of the reduction in transistor size as described above are larger. If the number of stages of the current mirror circuit is increased, it is possible to further reduce the surface area.

Compared to Embodiment 1, this embodiment takes the advantage of being able to independently control the gates of NchMOS transistors $T_{n6}$ and $T_{n7}$ by a separate NchMOS transistor $T_{n8}$, and having the broadened range of possible current adjustment.

Other than reference voltage generating circuit 511, this embodiment is identical to Embodiment 1, and the relationship of the detection ratio for leakage current of NchMOS transistor $T_{n\ (LSI)}$ of the internal circuit and leakage current of leakage current detection NchMOS transistor $T_{n1}$ shown in equation (8) is established.

Embodiment 6

Embodiment 6 is an example of applying a separate reference potential generating circuit to the reference potential generating circuit of the leakage current detection block.

Figure 7:
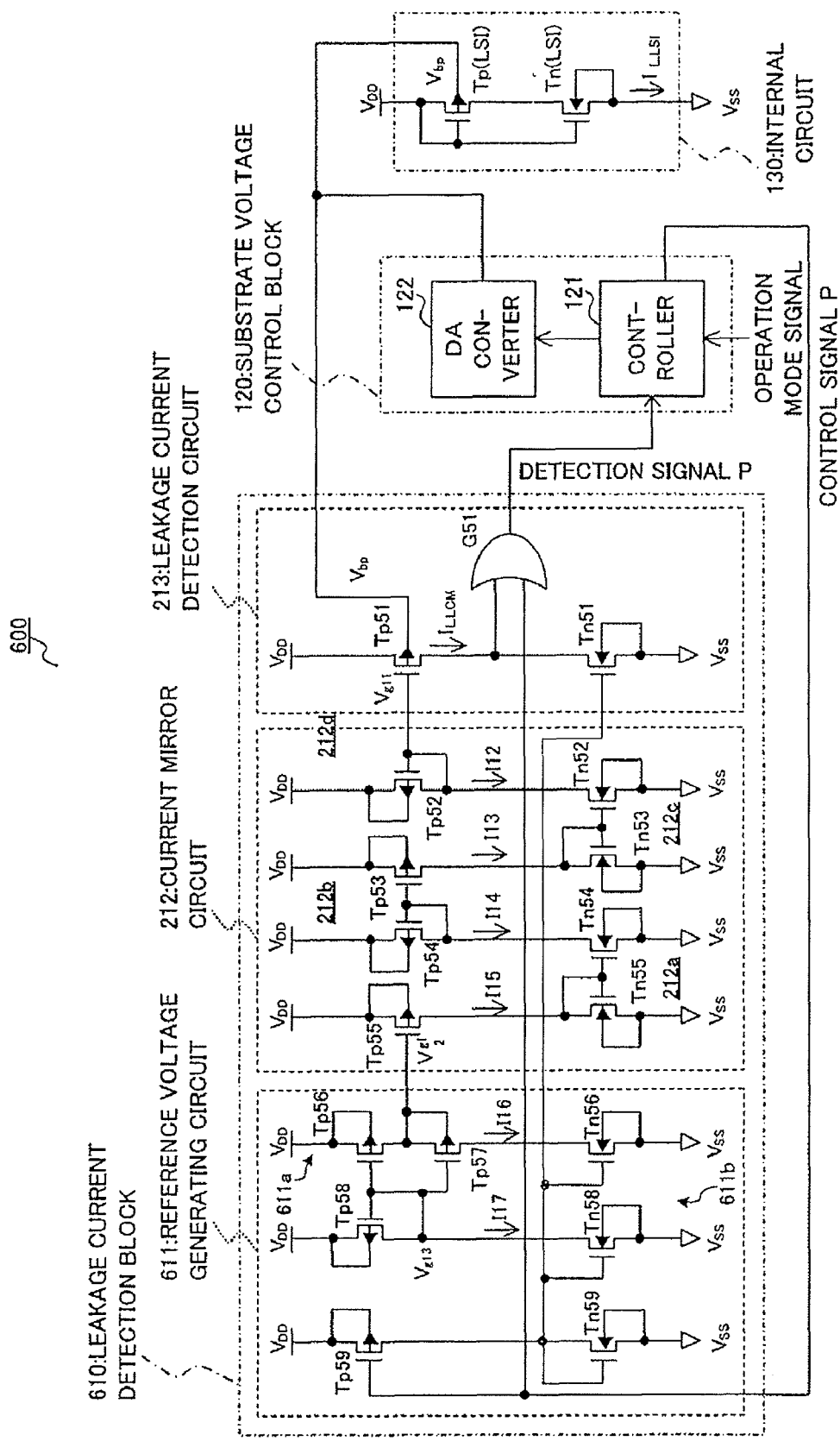
FIG. 7 shows a configuration for a semiconductor integrated circuit apparatus according to Embodiment 6 of the present invention.

FIG. 7 shows a configuration for a semiconductor integrated circuit apparatus according to Embodiment 6 of the present invention. This embodiment shows an example applied to semiconductor integrated circuit apparatus equipped with a PchMOS transistor leakage current detection circuit, substrate voltage control block, and internal circuit. Components identical to those in FIG. 3 are assigned the same numerals and description for the overlapped portions will be omitted.

In FIG. 7, semiconductor integrated circuit apparatus 600 is equipped with PchMOS transistor leakage current detection block 610, substrate voltage control block 120 controlling substrate voltage control, and internal circuit 130 having a plurality of MOS transistors on a semiconductor substrate. Semiconductor integrated circuit apparatus 600 adopts a basic configuration employing leakage current detection PchMOS transistor $T_{p51}$ with a drain connected to a constant current source, for leakage current detection of PchMOS transistor $T_{p\ (LSI)}$ equivalently representing internal circuit 130.

Leakage current detection block 610 is comprised of reference voltage generating circuit 611, current mirror circuit 212, and leakage current detection circuit 213. Leakage current detection block 610 arbitrarily amplifies a leakage current value of leakage current detection PchMOS transistor $T_{p51}$ of leakage current detection circuit 213 using current mirror circuit 212, and makes detection of leakage current and determination straightforward. Further, it is possible to accelerate the response to substrate voltage control so that fluctuation of substrate voltage can also be suppressed. Moreover, the configuration is such that current does not pass through leakage current detection circuit 213 when leakage current detection circuit 213 is not operating.

Reference voltage generating circuit 611 is comprised of PchMOS transistor $T_{p56}$ and PchMOS transistor $T_{p57}$ constituting voltage generating section 611a that generates a potential for generating gate potential $V_{g11}$ of leakage current detection PchMOS transistor $T_{p51}$ of leakage current detection circuit 213, PchMOS transistor $T_{p58}$ with a source connected to high potential side supply voltage $V_{DD}$, and a drain and gate further connected to a separate constant current source 611b, PchMOS transistor $T_{p59}$, NchMOS transistor $T_{n59}$, NchMOS transistor $T_{n58}$, NchMOS transistor $T_{n56}$, and NchMOS transistor $T_{n51}$ of leakage current detection circuit 213 constituting constant current source 611b that supplies a constant current to this PchMOS transistor $T_{p58}$, PchMOS transistor $T_{p56}$ and PchMOS transistor $T_{p57}$.

Namely, reference voltage generating circuit 611 is such that PchMOS transistor $T_{p58}$ with a source connected to high potential side supply voltage $V_{DD}$ and a drain and gate further connected to a separate constant current source 611b is further added to reference voltage generating circuit 211 of FIG. 3, the gates of NchMOS transistors $T_{p56}$ and $T_{p57}$ are connected in common, and are connected to the drain of PchMOS transistor $T_{p58}$.

In other words, a configuration is adopted where a drain voltage of PchMOS transistor $T_{p58}$ with the gate and drain connected to constant current source 611b, and the source connected to $V_{DD}$ is applied to gate potential $V_{g13}$ of PchMOS transistors $T_{p56}$ and $T_{p57}$ generating a reference potential.

According to Embodiment 6, the theory of operation is exactly the same as for the circuit shown in FIG. 6 simply with NchMOS transistors changed for PchMOS transistors, and vice versa.

It is therefore possible to obtain the same effects as for Embodiments 1 to 5. In particular, compared to Embodiment 2, this embodiment takes the advantage of being able to independently control the gates of PchMOS transistors $T_{p56}$ and $T_{p57}$ using a separate PchMOS transistor $T_{p58}$, and having the broadened range of possible current adjustment, as with Embodiment 5.

Embodiment 7

Embodiment 7 is an example of applying a voltage amplifying circuit instead of the current mirror circuit and also applying a separate reference potential generating circuit at the reference potential generating circuit of the leakage current detection block at the leakage current detection circuit employing the leakage current detection NchMOS transistor.

Figure 8:
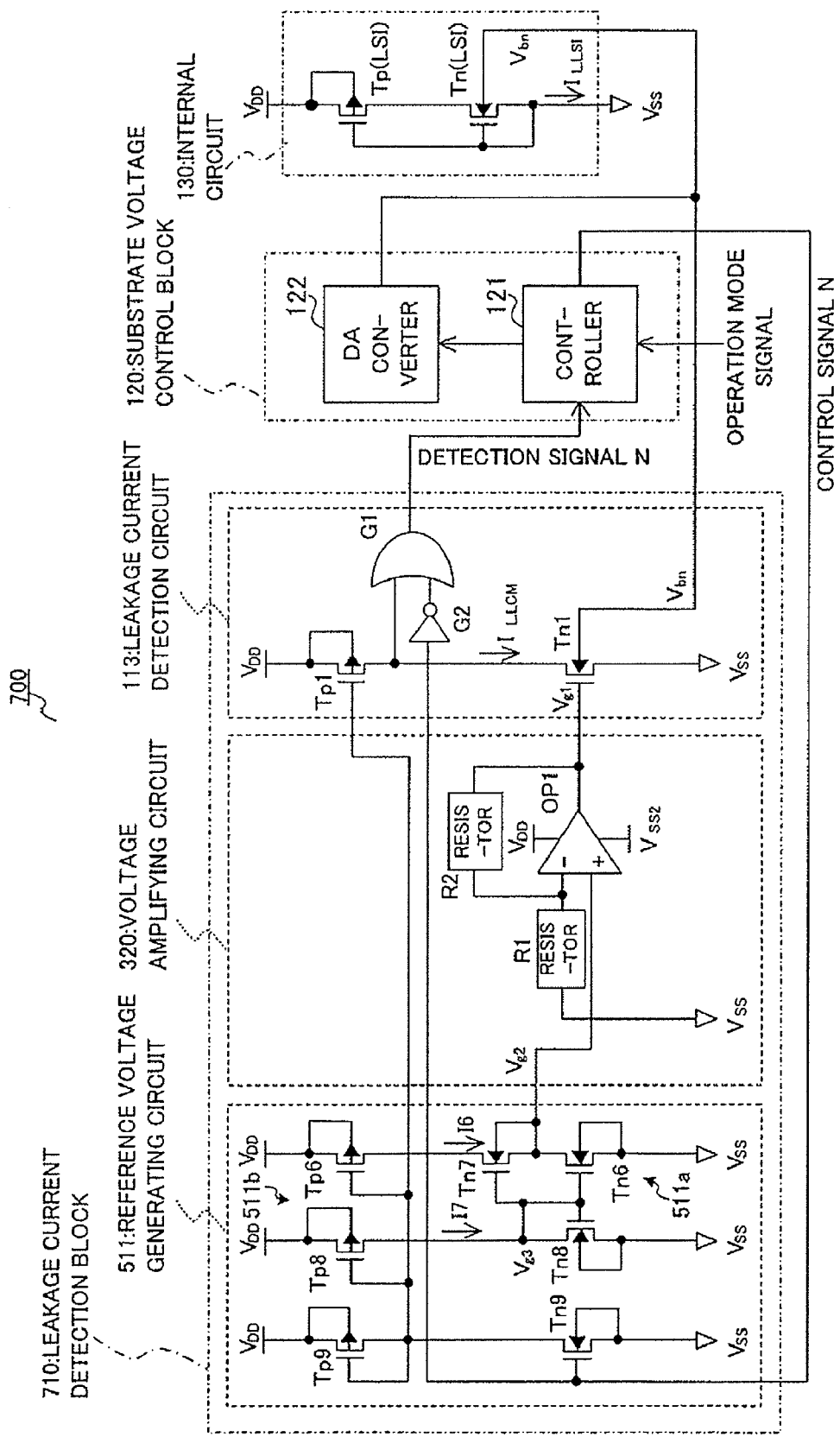
FIG. 8 shows a configuration for a semiconductor integrated circuit apparatus according to Embodiment 7 of the present invention.

FIG. 8 shows a configuration for a semiconductor integrated circuit apparatus according to Embodiment 7 of the present invention. This embodiment shows an example applied to semiconductor integrated circuit apparatus equipped with an NchMOS transistor leakage current detection circuit, substrate voltage control block, and internal circuit. Components identical to those in FIG. 4 and FIG. 6 are assigned the same numerals and description for the overlapped portions will be omitted.

In FIG. 8, semiconductor integrated circuit apparatus 700 is equipped with NchMOS transistor leakage current detection block 710, substrate voltage control block 120 controlling substrate voltage control, and internal circuit 130 having a plurality of MOS transistors on a semiconductor substrate. Semiconductor integrated circuit apparatus 700 adopts a basic configuration employing leakage current detection NchMOS transistor $T_{n1}$ with a drain connected to a constant current source, for leakage current detection of NchMOS transistor $T_{n\ (LSI)}$ equivalently representing internal circuit 130.

Leakage current detection block 710 is comprised of reference voltage generating circuit 511, voltage amplifying circuit 320, and leakage current detection circuit 113. Leakage current detection block 710 arbitrarily amplifies a leakage current value of leakage current detection NchMOS transistor $T_{n1}$ of leakage current detection circuit 113 using voltage amplifying circuit 320, and makes detection of leakage current and determination straightforward. Further, it is possible to accelerate the response to substrate voltage control so that fluctuation of substrate voltage can also be suppressed. Moreover, the configuration is such that current does not pass through leakage current detection circuit 113 when leakage current detection circuit 113 is not operating.

Reference voltage generating circuit 511 is such that NchMOS transistor $T_{n8}$ with a source connected to low potential side supply voltage $V_{SS}$ and a drain and gate further connected to a separate constant current source 511b is further added to reference voltage generating circuit 111 of FIG. 4, the gates of NchMOS transistors $T_{n6}$ and $T_{n7}$ are connected in common, and are connected to the drain of NchMOS transistor $T_{n8}$.

As with FIG. 4, voltage amplifying circuit 320 is comprised of operational amplifier $OP_1$, and resistors $R_1$ and $R_2$. The drain of NchMOS transistor $T_{n6}$ of reference voltage generating circuit 511 is connected to a + input of operational amplifier $OP_1$, a − input of operational amplifier $OP_1$ is connected to low potential side supply voltage $V_{SS}$ via resistor $R_1$, and is connected to the output of operational amplifier $OP_1$ via resistor $R_2$. High potential side supply voltage $V_{DD}$ is applied as a +supply to operational amplifier $OP_1$, and a supply voltage $V_{SS2}$ that is lower than $V_{SS}$ is applied as a − supply voltage. Output of operational amplifier $OP_1$ is connected to the gate of leakage current detection NchMOS transistor $T_{n1}$.

According to this embodiment, other than reference voltage generating section 511, this embodiment is identical to Embodiment 3 of FIG. 4, and the relationship of the detection ratio for leakage current of NchMOS transistor $T_{n\ (LSI)}$ of the internal circuit and leakage current of leakage current detection NchMOS transistor $T_{n1}$ shown in equation (11) is established.

Further, reference voltage generating circuit 511 is provided. Therefore, compared to Embodiment 1, this embodiment takes the advantage of being able to independently control the gates of NchMOS transistors $T_{n6}$ and $T_{n7}$ using a separate NchMOS transistor $T_{n8}$, and having the broadened range of possible current adjustment, as with Embodiment 6.

Embodiment 8

Embodiment 8 is an example of applying a voltage amplifying circuit instead of the current mirror circuit and also applying a separate reference potential generating circuit at the reference potential generating circuit of the leakage current detection block at the leakage current detection circuit employing the leakage current detection PchMOS transistor.

Figure 9:
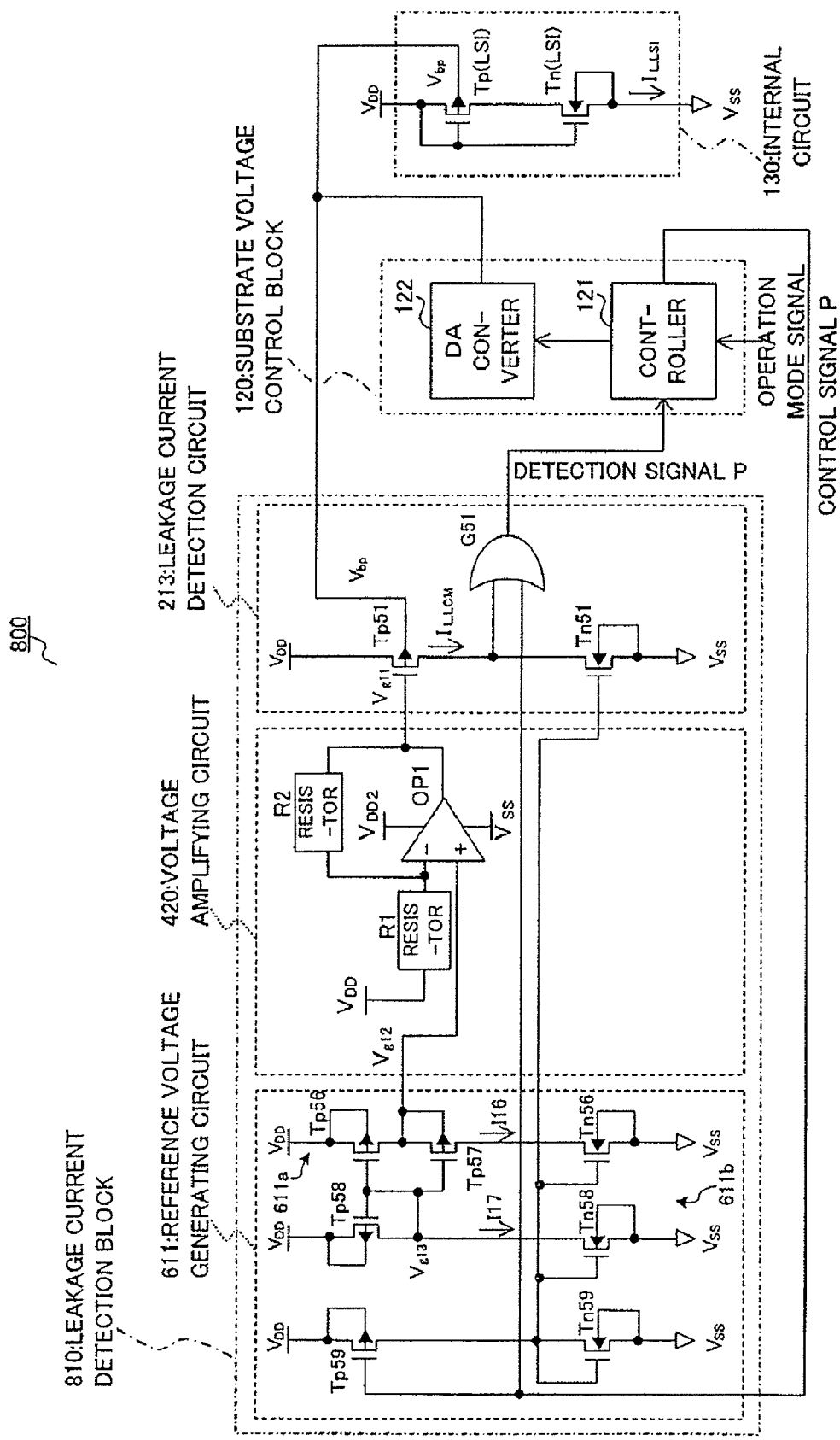
FIG. 9 shows a configuration for a semiconductor integrated circuit apparatus according to Embodiment 8 of the present invention.

FIG. 9 shows a configuration for a semiconductor integrated circuit apparatus according to Embodiment 8 of the present invention. This embodiment shows an example applied to semiconductor integrated circuit apparatus equipped with a PchMOS transistor leakage current detection circuit, substrate voltage control block, and internal circuit. Components identical to those in FIG. 5 and FIG. 7 are given the same numerals and description for the overlapped portions will be omitted.

In FIG. 9, semiconductor integrated circuit apparatus 800 is equipped with PchMOS transistor leakage current detection block 810, substrate voltage control block 120 controlling substrate voltage, and internal circuit 130 having a plurality of MOS transistors on a semiconductor substrate. Semiconductor integrated circuit apparatus 800 adopts a basic configuration employing leakage current detection PchMOS transistor $T_{p51}$ with a drain connected to a constant current source, for leakage current detection of PchMOS transistor $T_{p\ (LSI)}$ equivalently representing internal circuit 130.

Leakage current detection block 810 is comprised of reference voltage generating circuit 611, voltage amplifying circuit 420, and leakage current detection circuit 213. Leakage current detection block 810 arbitrarily amplifies a leakage current value of leakage current detection PchMOS transistor $T_{p51}$ of leakage current detection circuit 213 using voltage amplifying circuit 420, and makes detection of leakage current and determination straightforward. Further, it is possible to accelerate the response to substrate voltage control so that fluctuation of substrate voltage can also be suppressed. Moreover, the configuration is such that current does not pass through leakage current detection circuit 213 when leakage current detection circuit 213 is not operating.

Reference voltage generating circuit 611 is such that PchMOS transistor $T_{p58}$ with a source connected to high potential side supply voltage $V_{DD}$ and a drain and gate further connected to a separate constant current source 611b is further added to reference voltage generating circuit 211 of FIG. 5, the gates of PchMOS transistors $T_{p56}$ and $T_{p57}$ are connected in common, and are connected to the drain of PchMOS transistor $T_{p58}$.

As with FIG. 5, voltage amplifying circuit 420 is comprised of operational amplifier $OP_1$, and resistors $R_1$ and $R_2$. The drain of PchMOS transistor $T_{p56}$ of reference voltage generating circuit 611 is connected to a + input of operational amplifier $OP_1$, a – input of operational amplifier $OP_1$ is connected to high potential side supply voltage $V_{DD}$ via resistor $R_1$, and is connected to the output of operational amplifier $OP_1$ via resistor $R_2$. High potential side supply voltage $V_{DD2}$ that is a supply voltage higher than high potential side supply voltage $V_{DD}$ is applied to operational amplifier $OP_1$ as a + supply, and low potential side supply $V_{SS}$ is applied as a – supply. Output of operational amplifier $OP_1$ is connected to the gate of leakage current detection PchMOS transistor $T_{p51}$.

In this embodiment, the theory of operation is exactly the same as the circuit shown in FIG. 8 simply with NchMOS transistors changed for PchMOS transistors, and vice versa. According to this embodiment, in addition to the effects of Embodiments 1 to 4, this embodiment takes the advantage of being able to independently control the gates of PchMOS transistors $T_{p56}$ and $T_{p57}$ using a separate PchMOS transistor $T_{p58}$ and the broadened range of possible current adjustment.

Embodiment 9

Embodiment 9 shows an example of applying a separate leakage current detection circuit and reference potential generating circuit to the leakage current detection circuit and reference potential generating circuit of the leakage current detection block.

Figure 10:
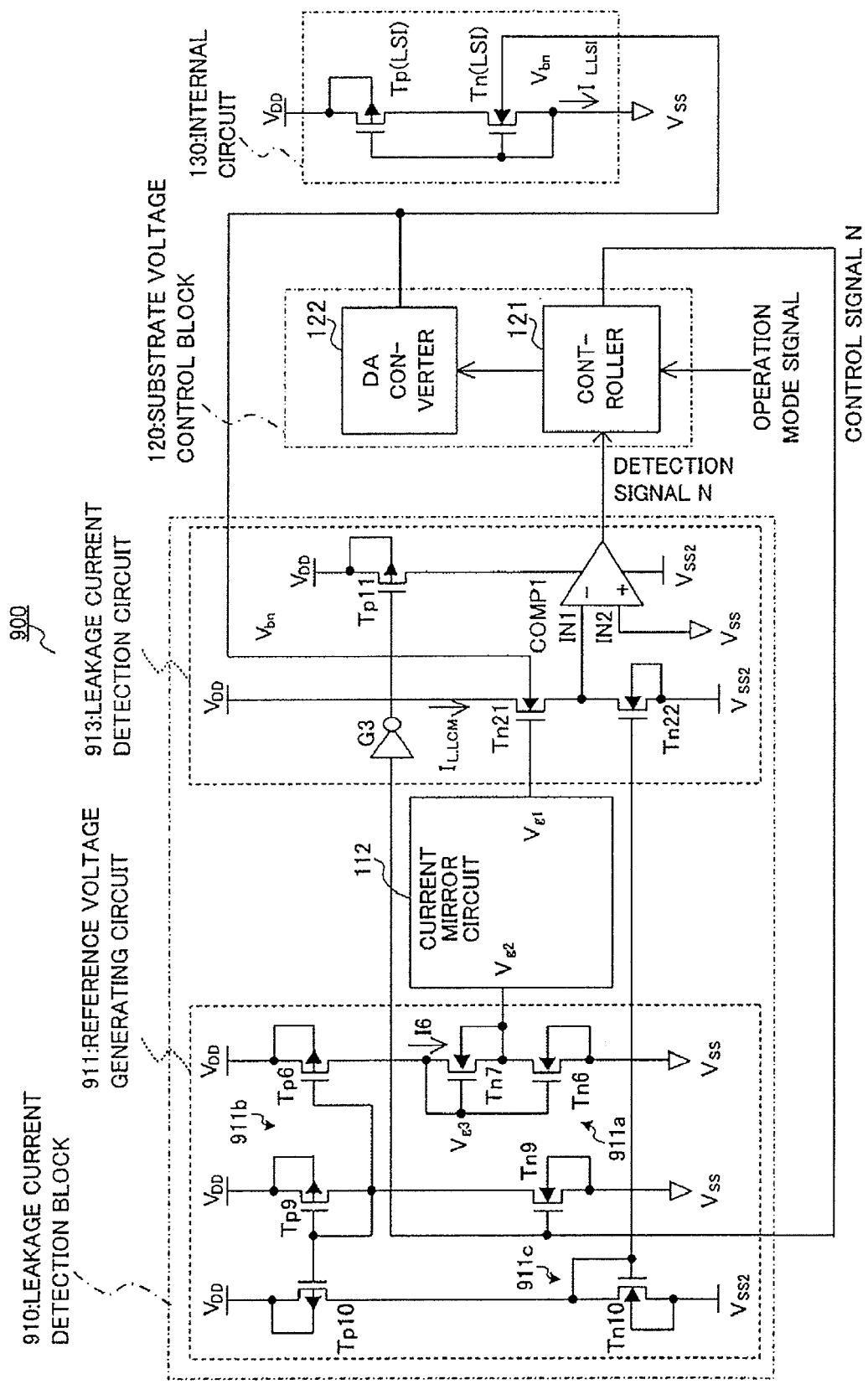
FIG. 10 shows a configuration for a semiconductor integrated circuit apparatus according to Embodiment 9 of the present invention.

FIG. 10 shows a configuration for a semiconductor integrated circuit apparatus according to Embodiment 9 of the present invention. This embodiment shows an example applied to semiconductor integrated circuit apparatus equipped with an NchMOS transistor leakage current detection circuit, substrate voltage control block, and internal circuit. Components identical to those in FIG. 1 are assigned the same numerals and description for the overlapped portions will be omitted.

In FIG. 10, semiconductor integrated circuit apparatus 900 is equipped with NchMOS transistor leakage current detection block 910, substrate voltage control block 120 controlling substrate voltage, and internal circuit 130 having a plurality of MOS transistors on a semiconductor substrate. Semiconductor integrated circuit apparatus 900 adopts a basic configuration employing a source follower circuit constructed using leakage current detection NchMOS transistor $T_{n21}$ with a drain connected to high potential side supply voltage $V_{DD}$, a source connected to a constant current source, and a substrate voltage controlled by substrate voltage control block 120, for NchMOS transistor $T_{n\ (LSI)}$ equivalently representing internal circuit 130.

Leakage current detection block 910 is comprised of reference voltage generating circuit 911, current mirror circuit 112, and leakage current detection circuit 913. Leakage current detection block 910 arbitrarily amplifies the leakage current value of leakage current detection NchMOS transistor $T_{n21}$ of leakage current detection circuit 913 using current mirror circuit 112, detects source potential of leakage current detection NchMOS transistor $T_{n21}$ by potential comparison with a reference potential using a source follower circuit constructed from leakage current detection NchMOS transistor $T_{n21}$, and makes detection of leakage current and determination straightforward. Further, the configuration is such that current does not pass through leakage current detection circuit 913 when leakage current detection circuit 913 is not operating.

Reference voltage generating circuit 911 is comprised of NchMOS transistor $T_{n6}$ and NchMOS transistor $T_{n7}$ constituting voltage generating section 911a that generates potential for generating gate potential $V_{g1}$ of leakage current detection NchMOS transistor $T_{n21}$ of leakage current detection circuit 913, NchMOS transistor $T_{n9}$, PchMOS transistor $T_{p9}$ and PchMOS transistor $T_{p6}$ constituting constant current source 911b that supplies a constant current to NchMOS transistor $T_{n6}$ and NchMOS transistor $T_{n7}$, and NchMOS transistor $T_{n10}$ and PchMOS transistor $T_{p10}$ constituting circuit 911c that generates a gate voltage for constant current source NchMOS transistor $T_{n22}$ of leakage current detection circuit 913.

Namely, reference voltage generating circuit 911 is further provided with NchMOS transistor $T_{n10}$ with a source connected to low potential side supply voltage $V_{SS2}$ of a lower potential than low potential side supply voltage $V_{SS}$ and a drain and gate connected to the gate of constant current source NchMOS transistor $T_{n22}$ of leakage current detection circuit 913 and PchMOS transistor $T_{p10}$ supplying a constant current to NchMOS transistor $T_{n10}$, at reference voltage generating circuit 111 of FIG. 1.

Leakage current detection circuit 913 is comprised of leakage current detection NchMOS transistor $T_{n21}$ with a drain connected to $V_{DD}$, a source connected to a constant current source, potential $V_{g1}$ received at a gate, and substrate voltage controlled by substrate voltage control block 120, constant current source NchMOS transistor $T_{n22}$ with a source connected to low potential side supply voltage $V_{SS2}$ of a potential lower than the low potential side supply voltage $V_{SS}$ and a drain connected to leakage current detection NchMOS transistor $T_{n21}$, comparator COMP1 comparing source potential of leakage current detection NchMOS transistor $T_{n21}$ and $V_{SS}$ potential that is a reference potential, and PchMOS transistor $T_{p11}$ with a source connected to high potential side supply voltage $V_{DD}$, a drain connected to comparator COMP1, and control signal N from controller 121 received at a gate via inverter circuit G3.

In this way, instead of leakage current detection NchMOS transistor $T_{n1}$ connected to the circuit as in each of Embodiments 1, 3, 5 and 7 described above, leakage current detection block 910 adopts a configuration using a source follower circuit configured from leakage current detection NchMOS transistor $T_{n21}$ with a drain connected to $V_{DD}$, a source connected to a constant current source, and substrate voltage controlled by substrate voltage control block 120, and comparing the source potential of leakage current detection NchMOS transistor $T_{n21}$ with $V_{SS}$ that is a reference potential by comparator COMP1.

A substrate voltage control operation for semiconductor integrated circuit apparatus 900 of the configuration described above will be described below. The overall operation is the same as Embodiments 1 and 3, so descriptions thereof will be omitted. Only different aspects of the operation will be described.

The configuration for the leakage current detection circuit differs from that of Embodiment 1 shown in FIG. 1 in that, rather than connecting the constant current source to the drain side of leakage current detection NchMOS transistor $T_{n1}$, this embodiment adopts a configuration where the constant current source is connected to the source side of leakage current detection NchMOS transistor $T_{n21}$, and this source potential is compared with $V_{SS}$ that is the reference potential using comparator COMP1. As a power supply voltage, $V_{SS2}$ that is a voltage lower than $V_{DD}$ and $V_{SS}$ is applied to comparator COMP1. At internal circuit 130, $V_{SS}$ is connected to a plurality of NchMOS transistor sources. Output of comparator COMP1 is inputted to substrate voltage control block 120.

Comparator COMP1 is comprised of a comparator and operational amplifier, and if the source potential of leakage current detection NchMOS transistor $T_{n21}$ is higher than the reference potential $V_{SS}$, detection signal N with low level is outputted. Substrate voltage control block 120 carries out the same operation as Embodiment 1 in that the substrate voltage is outputted, and the substrate voltage of leakage current detection NchMOS transistor $T_{n21}$ is lowered (deepens). As a result, the threshold voltage of leakage current detection NchMOS transistor $T_{n21}$ becomes large, and source potential is lowered, Conversely, if the source potential is lower than the reference voltage $V_{SS}$, comparator COMP1 outputs a detection signal N with high level and substrate voltage control block 120 operates in such a manner to raise (make shallow) the substrate voltage of leakage current detection NchMOS transistor $T_{n21}$. As a result, the threshold voltage of leakage current detection NchMOS transistor $T_{n21}$ becomes small, and source potential is raised.

As in Embodiment 1, a circuit generating gate potential of leakage current detection NchMOS transistor $T_{n21}$ is comprised of reference voltage generating circuit 911 and current mirror circuit 112. However, circuit of NchMOS transistor $T_{n10}$ and PchMOS transistor $T_{p10}$ generating a gate voltage for constant current source NchMOS transistor $T_{n22}$ is added to reference voltage generating circuit 911. The relationship between the detection ratio for the leakage current of the NchMOS transistor of the internal circuit and the leakage current of the leakage current detection NchMOS transistor shown in equation (8) is also satisfied.

As described above, according to this embodiment, instead of leakage current detection NchMOS transistor $T_{n1}$, a source follower circuit configured from NchMOS transistor $T_{n21}$ with a drain connected to a high potential side supply voltage $V_{DD}$, a source connected to a constant current source, and substrate voltage controlled by substrate voltage control block 120 is used, and the source potential of leakage current detection NchMOS transistor $T_{n21}$ is compared with low potential side supply voltage $V_{SS}$ that is a reference potential by comparator COMP1. As a result, the leakage current can then be similarly detected. In particular, as it is possible to increase the detection current value of leakage current detection NchMOS transistor $T_{n21}$ by an arbitrary ratio, detection of leakage current, comparison of the detected leakage current and target current value and determination of the result after comparison are extremely straightforward.

Embodiment 10

Embodiment 10 is an example of applying a separate leakage current detection circuit and reference potential generating circuit to the leakage current detection circuit and reference potential generating circuit of the leakage current detection block.

Figure 11:
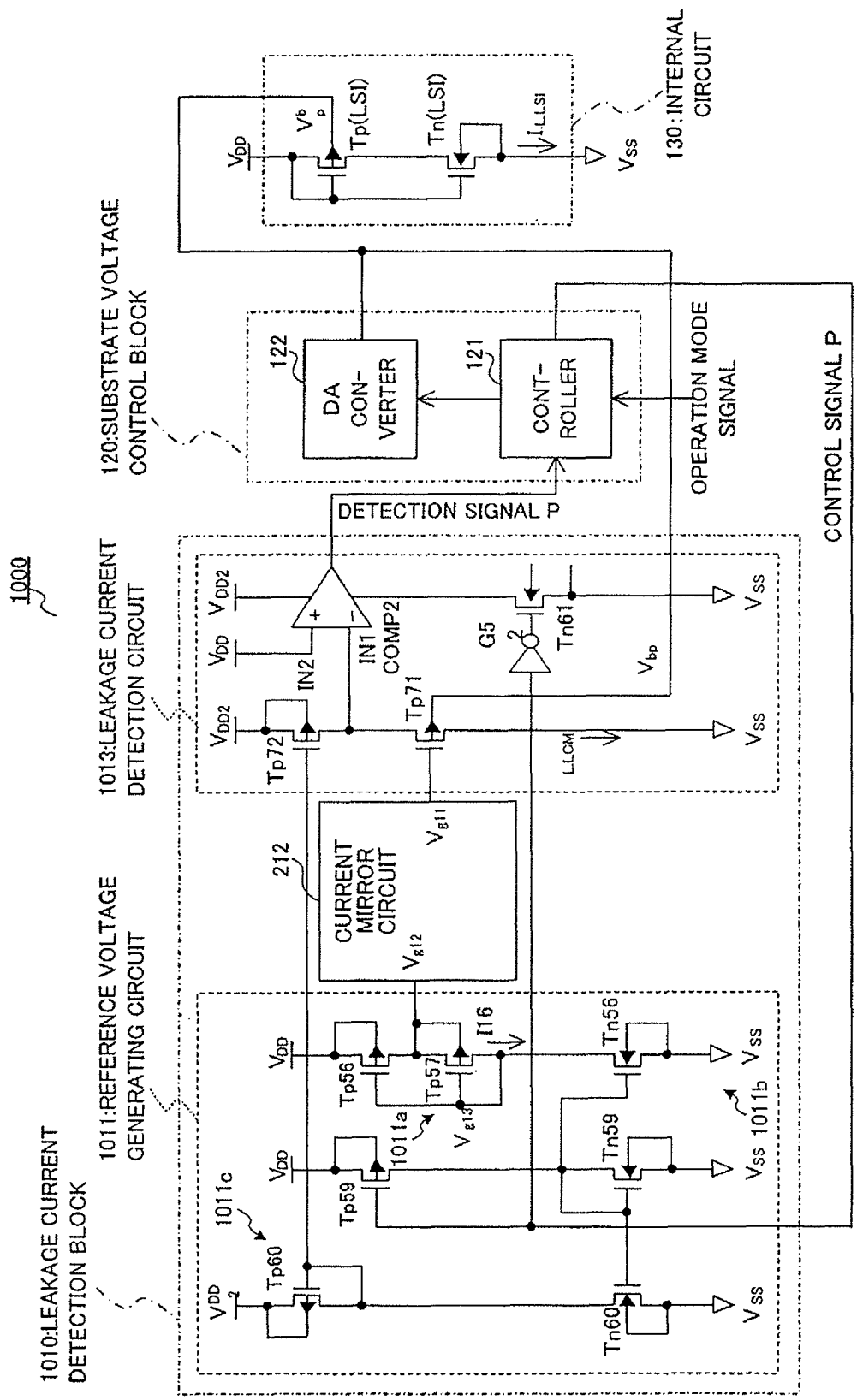
FIG. 11 shows a configuration for a semiconductor integrated circuit apparatus according to Embodiment 10 of the present invention.

FIG. 11 shows a configuration for a semiconductor integrated circuit apparatus according to Embodiment 10 of the present invention. This embodiment shows an example applied to semiconductor integrated circuit apparatus equipped with a PchMOS transistor leakage current detection circuit, substrate voltage control block, and internal circuit. Components identical to those in FIG. 3 are assigned the same numerals and description for the overlapped portions will be omitted.

In FIG. 11, semiconductor integrated circuit apparatus 1000 is equipped with PchMOS transistor leakage current detection block 1010, substrate voltage control block 120 controlling substrate voltage, and internal circuit 130 having a plurality of MOS transistors on a semiconductor substrate. Semiconductor integrated circuit apparatus 1000 adopts a basic configuration employing a source follower circuit constructed using leakage current detection PchMIS transistor $T_{p71}$ with a drain connected to low potential side supply voltage $V_{SS}$, a source connected to a constant current source, and a substrate voltage controlled by substrate voltage control block 120, for PchMOS transistor $T_{p\,(LSI)}$ equivalently representing internal circuit 130.

Leakage current detection block 1010 is comprised of reference voltage generating circuit 1011, current mirror circuit 212, and leakage current detection circuit 1013. Leakage current detection block 1010 arbitrarily amplifies the leakage current value of leakage current detection PchMOS transistor $T_{p71}$ of leakage current detection circuit 1013 using current mirror circuit 212, detects source potential of leakage current detection PchMOS transistor $T_{p71}$ by potential comparison with a reference potential using a source follower circuit constructed from leakage current detection PchMOS transistor $T_{p71}$, and makes detection of leakage current and determination straightforward. Further, the configuration is such that current does not pass through leakage current detection circuit 1013 when leakage current detection circuit 1013 is not operating.

Reference voltage generating circuit 1011 is comprised of PchMOS transistor $T_{p56}$ and PchMOS transistor $T_{p57}$ constituting voltage generating section 1011a that generates potential for generating gate potential $V_{g11}$ of leakage current detection PchMOS transistor $T_{p71}$ of leakage current detection circuit 1013, PchMOS transistor $T_{p59}$, NchMOS transistor $T_{n59}$ and NchMOS transistor $T_{n56}$ constituting constant current source 1011b that supplies a constant current to PchMOS transistor $T_{p56}$ and PchMOS transistor $T_{p57}$, and PchMOS transistor $T_{p60}$ and NchMOS transistor $T_{n60}$ constituting circuit 1011c that generates a gate voltage for constant current source PchMOS transistor $T_{p72}$ of leakage current detection circuit 1013.

Namely, reference voltage generating circuit 1011 is further provided with PchMOS transistor $T_{p60}$ with a source connected to high potential side supply voltage $V_{DD2}$ of a higher potential than high potential side supply voltage $V_{DD}$ and a drain and gate connected to the gate of constant current source PchMOS transistor $T_{p72}$ of leakage current detection circuit 1013 and NchMOS transistor $T_{n60}$ supplying a constant current to PchMOS transistor $T_{p60}$, at reference voltage generating circuit 211 of FIG. 3.

Leakage current detection circuit 1013 is comprised of leakage current detection PchMOS transistor $T_{p71}$ with a drain connected to $V_{SS}$, a source connected to a constant current source, potential $V_{g11}$ received at a gate, and substrate voltage controlled by substrate voltage control block 120, constant current source PchMOS transistor $T_{p72}$ with a source connected to high potential side supply voltage $V_{DD2}$ of a potential higher than the high potential side supply voltage $V_{DD}$ and a drain connected to leakage current detection PchMOS transistor $T_{p71}$, comparator COMP2 comparing source potential of leakage current detection PchMOS transistor $T_{p71}$ and $V_{DD}$ potential that is a reference potential, and NchMOS transistor $T_{n61}$ with a source connected to low potential side supply voltage $V_{SS}$, a drain connected to comparator COMP2, and control signal P from controller 121 received at a gate via inverter circuit G52.

In this way, instead of the leakage current detection PchMOS transistor $T_{p51}$ connected to the circuit as in each of Embodiments 2, 4, 6 and 8 described above, leakage current detection block 1010 adopts a configuration using a source follower circuit configured from leakage current detection PchMOS transistor $T_{p71}$ with a drain connected to $V_{SS}$, a source connected to a constant current source, and substrate voltage controlled by substrate voltage control block 120, and comparing the source potential of leakage current detection PchMOS transistor $T_{p71}$ with $V_{DD}$ that is a reference potential by comparator COMP2.

In this embodiment, the theory of operation is exactly the same as for the circuit shown in FIG. 10 simply with NchMOS transistors changed for PchMOS transistors, and vice versa. Therefore, in this embodiment 10, as in Embodiment 9, as it is possible to increase the detection current value of leakage current detection PchMOS transistor $T_{p71}$ by an arbitrary ratio, detection of leakage current, comparison of the detected leakage current and target current value and determination of the result after comparison are extremely straightforward.

Embodiment 9 and Embodiment 10 described above are examples applied to threshold voltage control circuits employing source follower circuits and comparators. A configuration employing a source follower circuit and a comparator is also capable of being applied to a configuration that is a combination of voltage amplifying circuits employing operational amplifiers shown in Embodiment 3 and Embodiment 4 of FIG. 4 and FIG. 5, and the reference voltage generating circuits shown in Embodiment 5 to Embodiment 8 of FIG. 6 to FIG. 9, and the same effects can be obtained.

Embodiment 11

Embodiment 11 is an example applied to a leakage current detection circuit canceling DC offset of a comparator.

Figure 12:
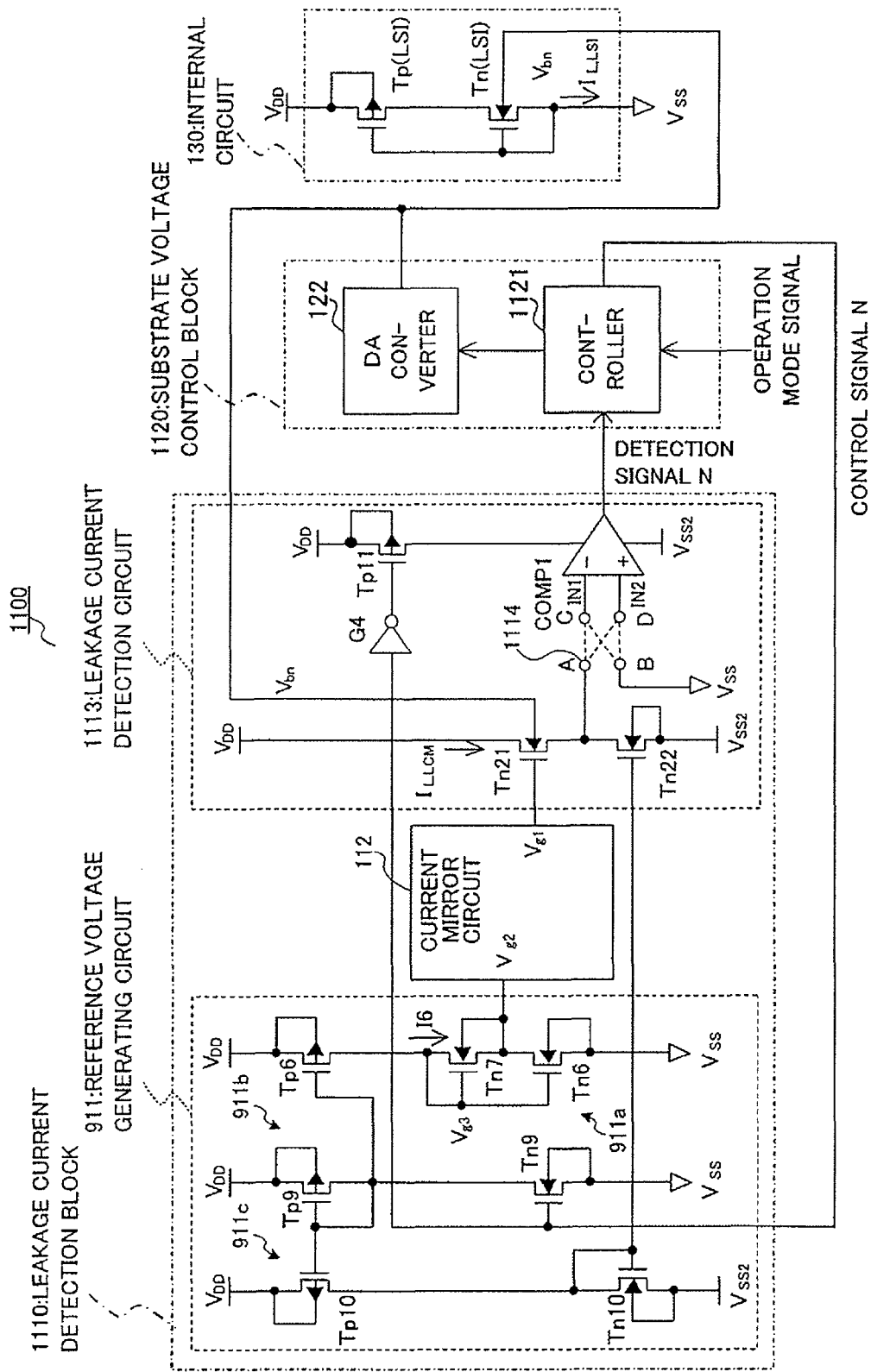
FIG. 12 shows a configuration for a semiconductor integrated circuit apparatus according to Embodiment 11 of the present invention.

FIG. 12 shows a configuration for a semiconductor integrated circuit apparatus according to Embodiment 11 of the present invention. This embodiment shows an example applied to semiconductor integrated circuit apparatus equipped with an NchMOS transistor leakage current detection circuit, substrate voltage control block, and internal circuit. Components identical to those in FIG. 10 are assigned the same numerals and description for the overlapped portions will be omitted.

In FIG. 12, semiconductor integrated circuit apparatus 1100 is equipped with NchMOS transistor leakage current detection block 1110, substrate voltage control block 120 controlling substrate voltage, and internal circuit 130 having a plurality of MOS transistors on a semiconductor substrate. Semiconductor integrated circuit apparatus 1100 then adopts a basic configuration employing a source follower circuit constructed using leakage current detection NchMOS transistor $T_{n21}$ with a drain connected to high potential side supply voltage $V_{DD}$, a source connected to a constant current source, and a substrate voltage controlled by substrate voltage control block 1120, for NchMOS transistor $Tn_{(LSI)}$ equivalently representing internal circuit 130.

Leakage current detection block 1110 is comprised of reference voltage generating circuit 911, current mirror circuit 112, and leakage current detection circuit 1113. Leakage current detection block 1110 arbitrarily amplifies the leakage current value of leakage current detection NchMOS transistor $T_{n21}$ of leakage current detection circuit 1113 using current mirror circuit 112, detects source potential of leakage current detection NchMOS transistor $T_{n21}$ by potential comparison with a reference potential using a source follower circuit constructed from leakage current detection NchMOS transistor $T_{n21}$, and makes detection of leakage current and determination straightforward. Further, the configuration is such that current does not pass through leakage current detection circuit 1113 when leakage current detection circuit 1113 is not operating.

Leakage current detection circuit 1113 is comprised of leakage current detection NchMOS transistor $T_{n21}$ with a drain connected to $V_{DD}$, a source connected to a constant current source, potential $V_{g1}$ received at a gate, and substrate voltage controlled by substrate voltage control block 1120, constant current source NchMOS transistor $T_{n22}$ with a source connected to low potential side supply voltage $V_{SS2}$ of a lower potential than low potential side supply voltage $V_{SS}$, and a drain connected to leakage current detection NchMOS transistor $T_{21}$, comparator COMP1 comparing source potential of leakage current detection NchMOS transistor $T_{n21}$ and $V_{SS}$ potential that is the reference potential, input switching switch 1114 that is arranged between the respective input terminals IN1, IN2 of comparator COMP1 and the source of leakage current detection NchMOS transistor $T_{n21}$ and the $V_{SS}$ terminal, and switches between the source of leakage current detection NchMOS transistor $T_{n21}$ and the $V_{SS}$ terminal and the respective input terminals of comparator COMP1, and PchMOS transistor $T_{p11}$ with a source connected to high potential side supply voltage $V_{DD}$, a drain connected to comparator COMP1, and control signal N from controller 1121 received at a gate via inverter circuit G4.

Namely, leakage current detection circuit 1113 adopts a configuration where input switching switch 1114 arranged between input terminals IN1, IN2 of comparator COMP1 and the source of leakage current detection Nch MOS transistor $T_{n21}$ and $V_{SS}$ terminal, and the source of leakage current detection Nch MOS transistor $T_{n21}$ and $V_{SS}$ terminal and the respective input terminals of comparator COMP1 switched between when internal circuit 130 is not operating is provided between the source of leakage current detection Nch MOS transistor $T_{n21}$ of leakage current detection circuit 913 and comparator COMP1 of FIG. 10.

Substrate voltage control block 1120 is comprised of controller 1121 receiving the output of comparator COMP1 and controlling to change a substrate voltage applied to substrates of leakage current detection NchMOS transistor $T_{n21}$ and NchMOS transistors $T_{n\ (LSI)}$ of internal circuit 130, and DA converter 122 DA converting a digital value from controller 1121 and generating a substrate voltage. Further, substrate voltage control block 1120 is configured from a digital circuit for ease of switching control of input switching switch 1114 and offset adjustment amount operation control.

In this embodiment, at semiconductor integrated circuit apparatus 900 of FIG. 10, input switching switch 1114 is provided between the respective input terminals IN1, IN2 of comparator COMP1 and the source of NchMOS transistor $T_{n21}$ and the $V_{SS}$ terminal. Further, controller 1121 of substrate voltage control block 1120 is further equipped with functions for controlling switching of input switching switch 1114 and controlling offset adjustment amount operations.

Figure 13:
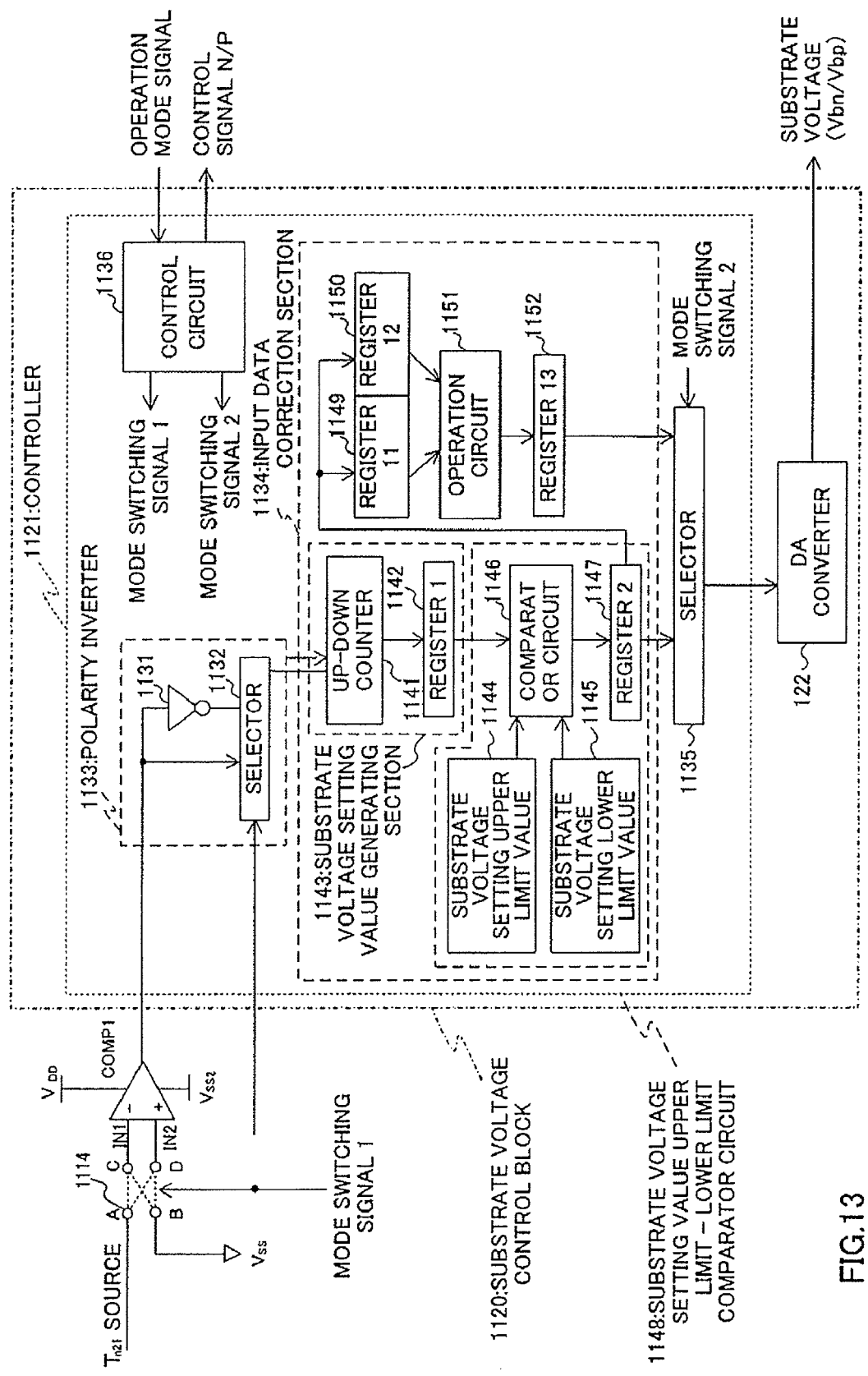
FIG. 13 shows a circuit configuration for a controller of a semiconductor integrated circuit apparatus according to Embodiment 11.

FIG. 13 shows a circuit configuration for controller 1121.

In FIG. 13, controller 1121 is comprised of polarity inverter 1133 comprised of inverter 1131 and selector 1132 selectively inverting the polarity of the output signal of comparator COMP1, input data correction section 1134, selector 1135 switching register 2 and register 13, and control circuit 1136 controlling each circuit in such a manner as to input an operation mode signal, and output mode switching signal 1, mode switching signal 2, and control signal N/P.

Input switching switch 1114 and polarity inverter 1133 are controlled by mode switching signal 1, and selector 1135 is controlled by mode switching signal 2.

Input data correction section 1134 is comprised of substrate voltage setting value generating section 1143 composed of up-down counter 1141 and register 1142 (register 1) employing a method of successive comparison where one LSB (least significant bit) is changed at a time, substrate voltage setting value upper limit-lower limit comparator circuit 1148 composed of substrate voltage setting upper limit value register 1144, substrate voltage setting lower limit value register 1145, comparator circuit 1146 and register 1147 (register 2) register 1149 (register 11) and register 1150 (register 12) temporarily storing a first substrate voltage setting value and second substrate voltage setting value, operation circuit 1151, and register 1152 (register 13) storing operation results.

The operation of semiconductor integrated circuit apparatus 1100 of the configuration described above will be described below.

A circuit generating gate potential $V_{g1}$ of leakage current detection NchMOS transistor $T_{n21}$ is exactly the same as Embodiment 9 of FIG. 10. The relationship between the detection ratio for the leakage current of the NchMOS transistor of the internal circuit 130 and the leakage current of NchMOS transistor $T_{n21}$ shown in equation (8) is also satisfied.

The overall operation of substrate voltage control of semiconductor integrated circuit apparatus 1100 is the same as Embodiment 9 and description thereof will be omitted. An offset compensation operation will be described.

First, the operation for compensating DC offset of comparator COMP1 occurring at the substrate voltage control operation will be described.

This operation is carried out by an operation (first input mode) obtaining a first substrate voltage setting value, an operation (second input mode) obtaining a second substrate voltage setting value, and an operation (operation mode) obtaining a third substrate voltage setting value when internal circuit 130 is not operating.

It is then possible to eliminate DC offset of comparator COMP1 by applying the substrate voltage using the third substrate voltage setting value obtained in this manner.

As shown in FIG. 13, input switching switch 1114 has a function for selectively connecting input terminals A and B to either of output terminals C and D.

At the time of the first input mode, input switching switch 1114 is such that A terminal and C terminal are connected, and B terminal and D terminal are connected, and selector 1132 of polarity inverter 1133 allows the output signal of comparator COMP1 to pass as is.

The output signal of comparator COMP1 is then provided to up-down counter 1141 functioning as substrate voltage setting value generating section 1143.

First, before starting the substrate voltage control operation, a count value of up-down counter 1141 and the value of register 1142 (register 1) are reset to zero (0) or are set to the value measured the previous time. Next, up-down counter 1141 counts up when the output signal of comparator COMP1 provided at this time is +1 (high level) and counts down when −1 (low level), and stores this count value in register 1.

A substrate voltage setting upper limit value and a substrate voltage setting lower limit value stored in input data correction section 1134 and the value of register 1 are compared using a comparator circuit. In the event that the value of register 1 exceeds the substrate voltage setting upper limit, this substrate voltage setting upper limit value is outputted. In the event that the value of register 1 exceeds the substrate voltage setting lower limit value, this substrate voltage setting lower limit value is outputted. If the value of register 1 is between the substrate voltage setting lower limit value and the substrate voltage setting upper limit value, the value of register 1 is outputted. The outputted comparison results are then stored in register 1147 (register 2).

The value of register 2 is then inputted to DA converter 122 from input data correction section 1134 via selector 1135 using mode switching signal 2. As a result, a substrate voltage corresponding to register 2 from DA converter 122 is applied to the substrate of leakage current detection NchMOS transistor $T_{n21}$ and the substrate of the NchMOS transistors of internal circuit 130.

Namely, if source potential of leakage current detection NchMOS transistor $T_{n21}$ is higher than $V_{SS}$ that is the reference potential, comparator COMP1 outputs −1 (low level), up-down counter counts down, and the count value is stored in register 1. Comparator circuit 1146 compares whether or not the value of register 1 exceeds the substrate voltage setting upper limit value or lower limit value, and stores the results of the comparison in register 2. DA converter 122 then outputs a substrate voltage corresponding to the value of register 2, and lowers (deepens) the substrate voltage of leakage current detection NchMOS transistor $T_{n21}$. As a result, the threshold voltage of leakage current detection NchMOS transistor $T_{n21}$ becomes large, and source potential of NchMOS transistor $T_{n21}$ is lowered.

Conversely, if source potential of leakage current detection NchMOS transistor $T_{n21}$ is lower than $V_{SS}$ that is the reference potential, comparator COMP1 outputs +1 (high level), up-down counter 1141 counts up, and the count value is stored in register 1. Comparator circuit 1146 compares whether or not the value of register 1 exceeds the substrate voltage setting upper limit value or lower limit value, and stores the results of the comparison in register 2. DA converter 122 then outputs a substrate voltage corresponding to the value of register 2, and raises (makes shallow) the substrate voltage of leakage current detection NchMOS transistor $T_{n21}$. As a result, the threshold voltage of leakage current detection NchMOS transistor $T_{n21}$ becomes small, and source potential of NchMOS transistor $T_{n21}$ is raised.

In the following, the above loop is gone through and the same operation is carried out. This operation continues until the polarity of the output signal of comparator COMP1 is inverted.

Namely, upon detecting inversion of the polarity of the output signal of comparator COMP1, substrate voltage setting value generating section 1143 holds the count value (that is the first substrate voltage setting value) at this time in register 1142 (register 11).

It should be noted that carrying out detection of inversion of polarity requires consideration for slight swings in signal voltage.

Next, input switching switch 1114 is controlled, A terminal is connected to D terminal, B terminal is connected to C terminal, and the second input mode is adopted.

At this time, selector 1132 of polarity inverter 1133 selects the output signal of inverter 1131. Namely, a signal that is the output signal of comparator COMP1 with the polarity inverted is provided to up-down counter 1141.

In this state, the count value of up-down counter 1141 of substrate voltage setting value generating section 1143 returns to zero (0) and the same operation as for the first input mode is carried out, or an operation is carried out to obtain the second substrate voltage setting value by continuing from the same count value as for the first substrate voltage setting value obtained in the first input mode. The second substrate voltage setting value obtained as a result is then stored in register 1150 (register 12).

First and second substrate voltage setting values are then extracted from register 11 and register 12, the third substrate voltage setting value is calculated by taking an average value using operation circuit 1151, and this is stored in register 1152 (register 13).

This third substrate voltage setting value is the substrate voltage setting value (i.e. the substrate voltage setting value when the DC offset of comparator COMP1 is completely cancelled) in the event that there is no DC offset whatsoever at comparator COMP1.

Therefore, at the time of normal operation of internal circuit 130, it is possible to completely cancel the DC offset of comparator COMP1 by controlling the selector using mode switching signal 2 and controlling substrate voltage of internal circuit 130 using the third substrate voltage setting value of register 13, and improve the precision of controlling substrate voltage substantially.

According to this embodiment, input switching switch 1114 is provided between the respective input terminals IN1, IN2 of comparator COMP1 and the source of NchMOS transistor $T_{n21}$ and the $V_{SS}$ terminal. By then switching between the source of NchMOS transistor $T_{n21}$ and the $V_{SS}$ terminal and the respective input terminals of comparator COMP1 using input switching switch 1114, substrate voltage adjustment is carried out two times, and respective substrate voltage setting values are stored in register 1 and register 2 within controller 1121. The average of these substrate voltage setting values is then taken and stored in register 3. The substrate voltage of the internal circuit is then controlled using the substrate voltage setting value of register 3 at the time of normal operation of internal circuit 130. It is therefore possible to completely cancel DC offset errors of comparator COMP1 and improve the precision of controlling the substrate voltage. In this way, it is possible to detect leakage current more precisely.

Embodiment 12

Embodiment 12 is an example of applying canceling of DC offset of a comparator to a leakage current detection circuit employing a leakage current detection PchMOS transistor to cancel DC offset of a comparator.

Figure 14:
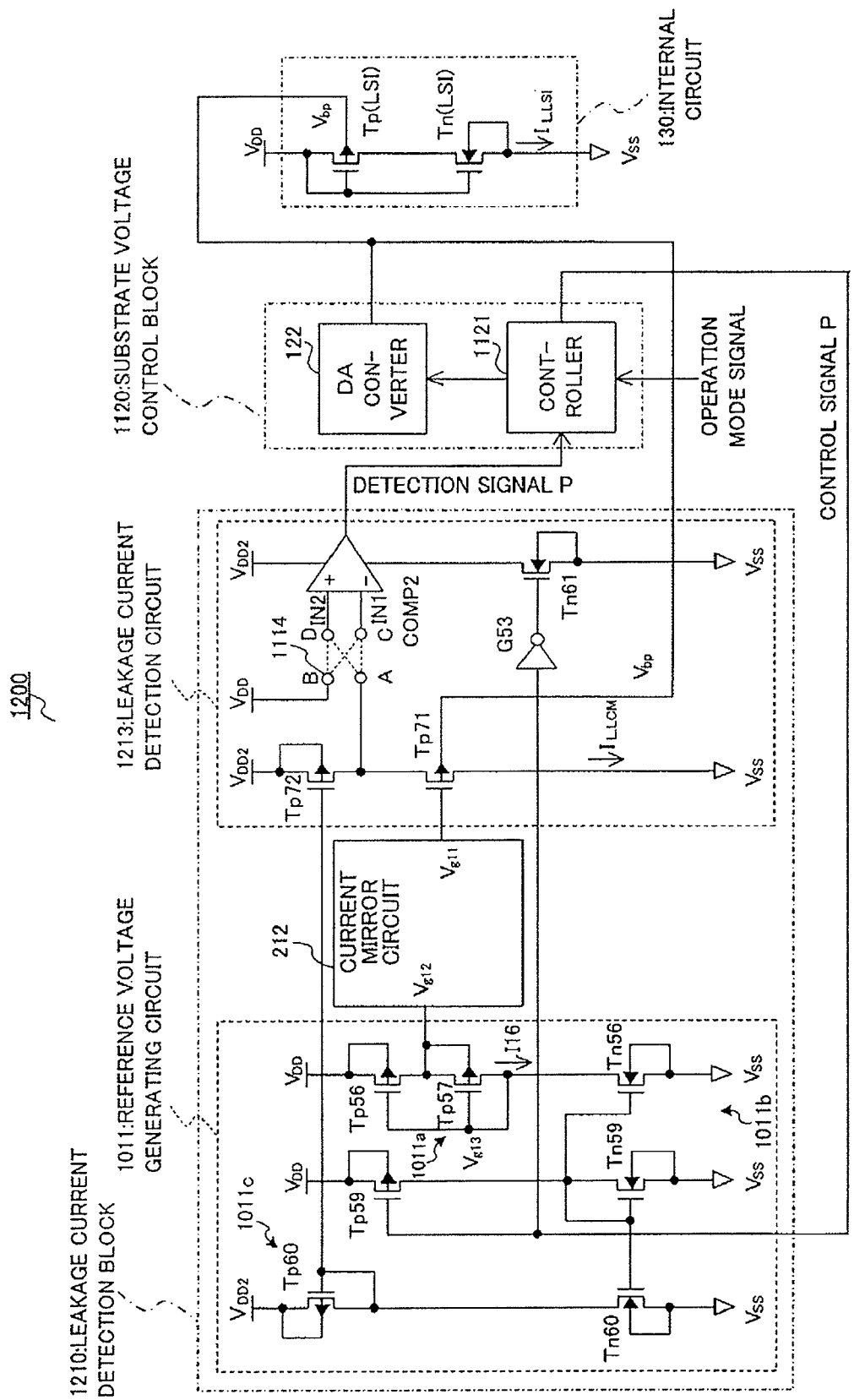
FIG. 14 shows a configuration for a semiconductor integrated circuit apparatus according to Embodiment 12 of the present invention.

FIG. 14 shows a configuration for a semiconductor integrated circuit apparatus according to Embodiment 12 of the present invention. This embodiment shows an example applied to semiconductor integrated circuit apparatus equipped with a PchMOS transistor leakage current detection circuit, substrate voltage control block, and internal circuit. Components identical to those in FIG. 11 to FIG. 13 are assigned the same numerals and description for the overlapped portions will be omitted.

In FIG. 14, semiconductor integrated circuit apparatus 1200 is equipped with PchMOS transistor leakage current detection block 1210, substrate voltage control block 1120 controlling substrate voltage, and internal circuit 130 having a plurality of MOS transistors on a semiconductor substrate. Semiconductor integrated circuit apparatus 1200 then adopts a basic configuration employing a source follower circuit constructed using leakage current detection PchMOS transistor $T_{p71}$ with a drain connected to low potential side supply voltage $V_{SS}$, a source connected to a constant current source, and a substrate voltage controlled by substrate voltage control block 1120, for PchMOS transistor $T_{p\ (LSI)}$ equivalently representing internal circuit 130.

Leakage current detection block 1210 is comprised of reference voltage generating circuit 1011, current mirror circuit 212, and leakage current detection circuit 1213. Leakage current detection block 1210 arbitrarily amplifies the leakage current value of leakage current detection PchMOS transistor $T_{p71}$ of leakage current detection circuit 1213 using current mirror circuit 212, detects source potential of leakage current detection PchMOS transistor $T_{p71}$ by potential comparison with a reference potential using a source follower circuit constructed from leakage current detection PchMOS transistor $T_{p71}$, makes detection of leakage current and determination straightforward. Further, the configuration is such that current does not pass through leakage current detection circuit 1213 when leakage current detection circuit 1213 is not operating.

Leakage current detection circuit 1213 is comprised of leakage current detection PchMOS transistor $T_{p71}$ with a drain connected to low voltage side supply voltage $V_{SS}$, a source connected to a constant current source, potential $V_{g11}$ received at a gate, and substrate voltage controlled by substrate voltage control block 1120, constant current source PchMOS transistor $T_{p72}$ with a source connected to high potential side supply voltage $V_{DD2}$ of a potential higher than high potential side supply voltage $V_{DD}$, and a drain connected to leakage current detection PchMOS transistor $T_{p71}$, comparator COMP2 comparing source potential of leakage current detection PchMOS transistor $T_{p71}$ and $V_{DD}$ potential that is the reference potential, input switching switch 1114 that is arranged between the respective input terminals IN1, IN2 of comparator COMP2 and the source of leakage current detection PchMOS transistor $T_{p71}$ and the $V_{DD}$ terminal, and switches between the source of leakage current detection PchMOS transistor $T_{p71}$ and the $V_{DD}$ terminal and the respective input terminals of comparator COMP2, and NchMOS transistor $T_{n61}$ with a source connected to low potential side supply voltage $V_{SS}$, a drain connected to comparator COMP2, and control signal P from controller 1121 received at a gate via inverter circuit G53.

Namely, leakage current detection circuit 1213 adopts a configuration where input switching switch 1114 arranged between input terminals In1, IN2 of comparator COMP2 and the source of leakage current detection PchMOS transistor $T_{p71}$ and $V_{DD}$ terminal and switches the source of leakage current detection PchMOS transistor $T_{p71}$ and $V_{DD}$ terminal and the respective input terminals of comparator COMP2 when internal circuit 130 is not operating is provided between the source of leakage current detection PchMOS transistor $T_{p71}$ of leakage current detection circuit 1013 of FIG. 11 and comparator COMP2. The circuit configuration of the above input switching switch 1114 is the same as FIG. 13.

In this embodiment, the theory of operation is exactly the same as for the circuit shown in FIG. 12 simply with NchMOS transistors changed for PchMOS transistors, and vice versa. Namely, the same offset compensation operation as the operation described in FIG. 12 and FIG. 13 is added in the basic operation of Embodiment 10 of FIG. 11.

Therefore, in this embodiment 12 also and as in Embodiment 10, as it is possible to increase the detection current value of leakage current detection PchMOS transistor $T_{p71}$ by an arbitrary ratio, detection of leakage current, comparison of the detected leakage current and target current value and determination of the result after comparison are extremely straightforward. In addition to this effect, as with Embodiment 11, it is therefore possible to completely cancel the DC offset of comparator COMP2, and improve the precision of controlling the substrate voltage substantially.

Embodiment 13

Embodiment 13 is an example of applying a separate leakage current detection circuit to the leakage current detection circuit of the leakage current detection block.

Figure 15:
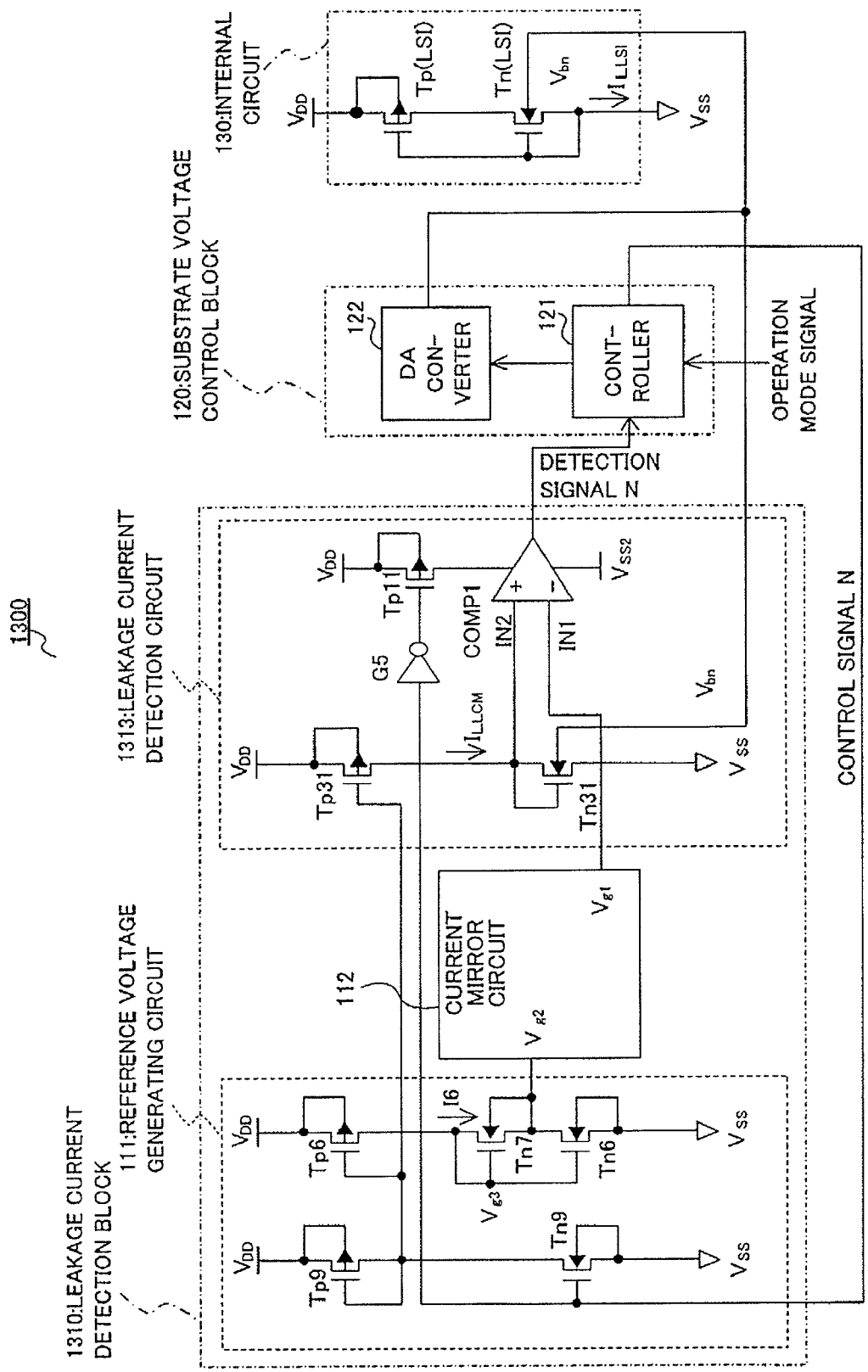
FIG. 15 shows a configuration for a semiconductor integrated circuit apparatus according to Embodiment 13 of the present invention.

FIG. 15 shows a configuration for a semiconductor integrated circuit apparatus according to Embodiment 13 of the present invention. This embodiment shows an example applied to semiconductor integrated circuit apparatus equipped with an NchMOS transistor leakage current detection circuit, substrate voltage control block, and internal circuit. Components identical to those in FIG. 1 and FIG. 10 are assigned the same numerals and description for the overlapped portions will be omitted.

In FIG. 15, semiconductor integrated circuit apparatus 1300 is equipped with NchMOS transistor leakage current detection block 1310, substrate voltage control block 120 controlling substrate voltage, and internal circuit 130 having a plurality of MOS transistors on a semiconductor substrate. Semiconductor integrated circuit apparatus 1300 adopts a basic configuration carrying out potential comparison of drain potential of leakage current detection NchMOS transistor $T_{n31}$ with a source connected to $V_{SS}$, the gate and drain connected together and connected to a constant current source and a substrate voltage controlled by substrate voltage control block 120, for NchMOS transistor $T_{n\,(LSI)}$ equivalently representing internal circuit 130, and voltage amplifier output potential due to current mirror circuit 112 by a comparator.

Leakage current detection block 1310 is comprised of reference voltage generating circuit 111, current mirror circuit 112, and leakage current detection circuit 1313.

Leakage current detection circuit 1313 is comprised of constant current source PchMOS transistor $T_{p31}$ with a source connected to high potential side supply voltage $V_{DD}$ and a drain connected to leakage current detection NchMOS transistor $T_{n31}$, leakage current detection NchMOS transistor $T_{n31}$ with a gate and drain in common and connected to constant current source PchMOS transistor $T_{p31}$, and a source connected to low potential side supply voltage $V_{SS}$, comparator COMP1 comparing drain potential of leakage current detection NchMOS transistor $T_{n31}$ and voltage amplified output potential $V_{g1}$ due to current mirror circuit 112, and PchMOS transistor $T_{p11}$ with a source connected to high potential side supply voltage $V_{DD}$, a drain connected to comparator COMP1, and control signal N from controller 121 received at a gate via inverter circuit G5.

A substrate voltage control operation for semiconductor integrated circuit apparatus 1300 of the configuration described above will be described below. The overall operation is the same as Embodiment 1 and description thereof will be omitted. Only different aspects of the operation will be described.

The configuration for the leakage current detection circuit is different from Embodiment 1 shown in FIG. 1 in that a configuration is adopted where the gate and drain of the leakage current detection NchMOS transistor $T_{n31}$ are common and connected to constant current source PchMOS transistor $T_{p31}$, and the source is connected to $V_{SS}$. In this configuration, drain potential of leakage current detection NchMOS transistor $T_{n31}$ is compared with $V_{g1}$ that is a reference potential using a comparator. As a power supply voltage, $V_{SS2}$ that is a voltage lower than $V_{DD}$ and $V_{SS}$ is applied to comparator COMP1. At internal circuit 130, $V_{SS}$ is connected to a plurality of NchMOS transistor sources. Output of comparator COMP1 is inputted to substrate voltage control block 120.

Comparator COMP1 is comprised of a comparator and operational amplifier, and if the drain potential of leakage current detection NchMOS transistor $T_{n31}$ is higher than the reference potential of $V_{g1}$, high level detection signal N is outputted. Substrate voltage control block 120 carries out the same operation as Embodiment 1 in that the substrate voltage is outputted, and the substrate voltage of leakage current detection NchMOS transistor $T_{n31}$ is raised (makes shallow). As a result, the threshold voltage of leakage current detection NchMOS transistor $T_{n31}$ becomes small, and drain potential is lowered. Conversely, if the source potential is lower than the reference voltage $V_{g1}$, comparator COMP1 outputs a low level detection signal N and substrate voltage control block 120 operates in such a manner as to lower (deepens) the substrate voltage of leakage current detection NchMOS transistor $T_{n31}$. As a result, the threshold voltage of leakage current detection NchMOS transistor $T_{n31}$ becomes large, and drain potential is raised.

As in Embodiment 1, a circuit generating gate potential of leakage current detection NchMOS transistor $T_{n31}$ is comprised of reference voltage generating circuit 111 and current mirror circuit 112. The relationship between the detection ratio for the leakage current of leakage current detection NchMOS transistor $T_{n\,(LSI)}$ of the internal circuit and the leakage current of the NchMOS transistor $T_{n31}$ shown in equation (8) is also satisfied.

With the above circuit configuration, as it is possible to increase the detection current value of leakage current detection NchMOS transistor $T_{n31}$ by an arbitrary ratio, detection of leakage current, comparison of the detected leakage current and target current value and determination of the result after comparison are extremely straightforward.

Embodiment 14

Embodiment 14 is an example of applying a separate leakage current detection circuit to the leakage current detection circuit of the leakage current detection block.

Figure 16:
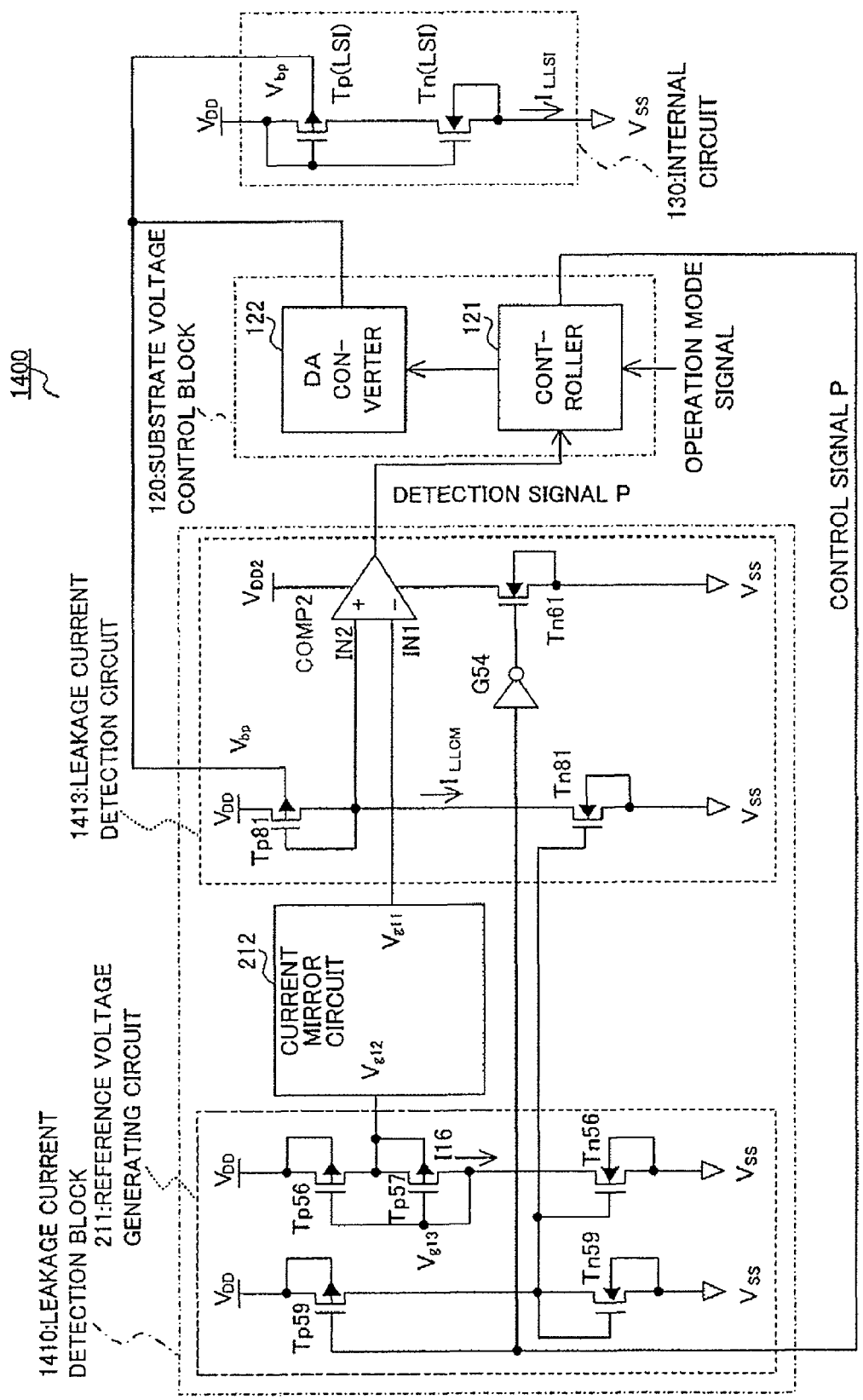
FIG. 16 shows a configuration for a semiconductor integrated circuit apparatus according to Embodiment 14 of the present invention.

FIG. 16 shows a configuration for a semiconductor integrated circuit apparatus of Embodiment 14 of the present invention. This embodiment shows an example applied to semiconductor integrated circuit apparatus equipped with a PchMOS transistor leakage current detection circuit, substrate voltage control block, and internal circuit. Components identical to those in FIG. 3 are assigned the same numerals and description for the overlapped portions will be omitted.

In FIG. 16, semiconductor integrated circuit apparatus 1400 is equipped with PchMOS transistor leakage current detection block 1410, substrate voltage control block 120 controlling substrate voltage, and internal circuit 130 having a plurality of MOS transistors on a semiconductor substrate. Semiconductor integrated circuit apparatus 1400 adopts a basic configuration carrying out potential comparison of drain potential of leakage current detection PchMOS transistor $T_{p81}$ with a source connected to $V_{DD}$, the gate and drain connected together and connected to a constant current source and a substrate voltage controlled by substrate voltage control block 120, for PchMOS transistor $T_{p\ (LSI)}$ equivalently representing internal circuit 130, and voltage amplifier output potential due to current mirror circuit 212 by a comparator.

Leakage current detection block 1410 is comprised of reference voltage generating circuit 211, current mirror circuit 212, and leakage current detection circuit 1413.

Leakage current detection circuit 1413 is comprised of constant current source NchMOS transistor $T_{n81}$ with a source connected to low potential side supply voltage $V_{SS}$ and a drain connected to leakage current detection PchMOS transistor $T_{p81}$, leakage current detection PchMOS transistor $T_{p81}$ with a gate and drain in common and connected to constant current source NchMOS transistor $T_{n81}$, and a source connected to high potential side supply voltage $V_{DD}$, comparator COMP2 comparing drain potential of leakage current detection PchMOS transistor $T_{p81}$ and voltage amplified output potential $V_{g11}$ due to current mirror circuit 212, and NchMOS transistor $T_{n61}$ with a source connected to low potential side supply voltage $V_{SS}$, a drain connected to comparator COMP2, and control signal P from controller 121 received at a gate via inverter circuit G54.

In this embodiment, the theory of operation is exactly the same as for the circuit shown in FIG. 15 simply with NchMOS transistors changed for PchMOS transistors, and vice versa. Therefore, in this embodiment 14 also and as in Embodiment 13, as it is possible to increase the detection current value of leakage current detection PchMOS transistor $T_{p81}$ by an arbitrary ratio, detection of leakage current, comparison of the detected leakage current and target current value and determination of the result after comparison are extremely straightforward.

Embodiment 13 and Embodiment 14 described above show an example applied to a threshold voltage control circuit using a leakage current detection MOS transistor with a gate and drain in common and a comparator. It is possible to apply a configuration employing a leakage current detection MOS transistor with a gate and drain in common and a comparator to a configuration that is a combination of voltage amplifying circuits employing operational amplifiers shown in Embodiment 3 and Embodiment 4 of FIG. 4 and FIG. 5 and the reference voltage generating circuits shown in Embodiment 5 to Embodiment 8 of FIG. 6 to FIG. 9, and the same effects can be obtained.

Embodiment 15

Embodiment 15 is an example of applying a separate leakage current detection circuit to the leakage current detection circuit of the leakage current detection block.

Figure 17:
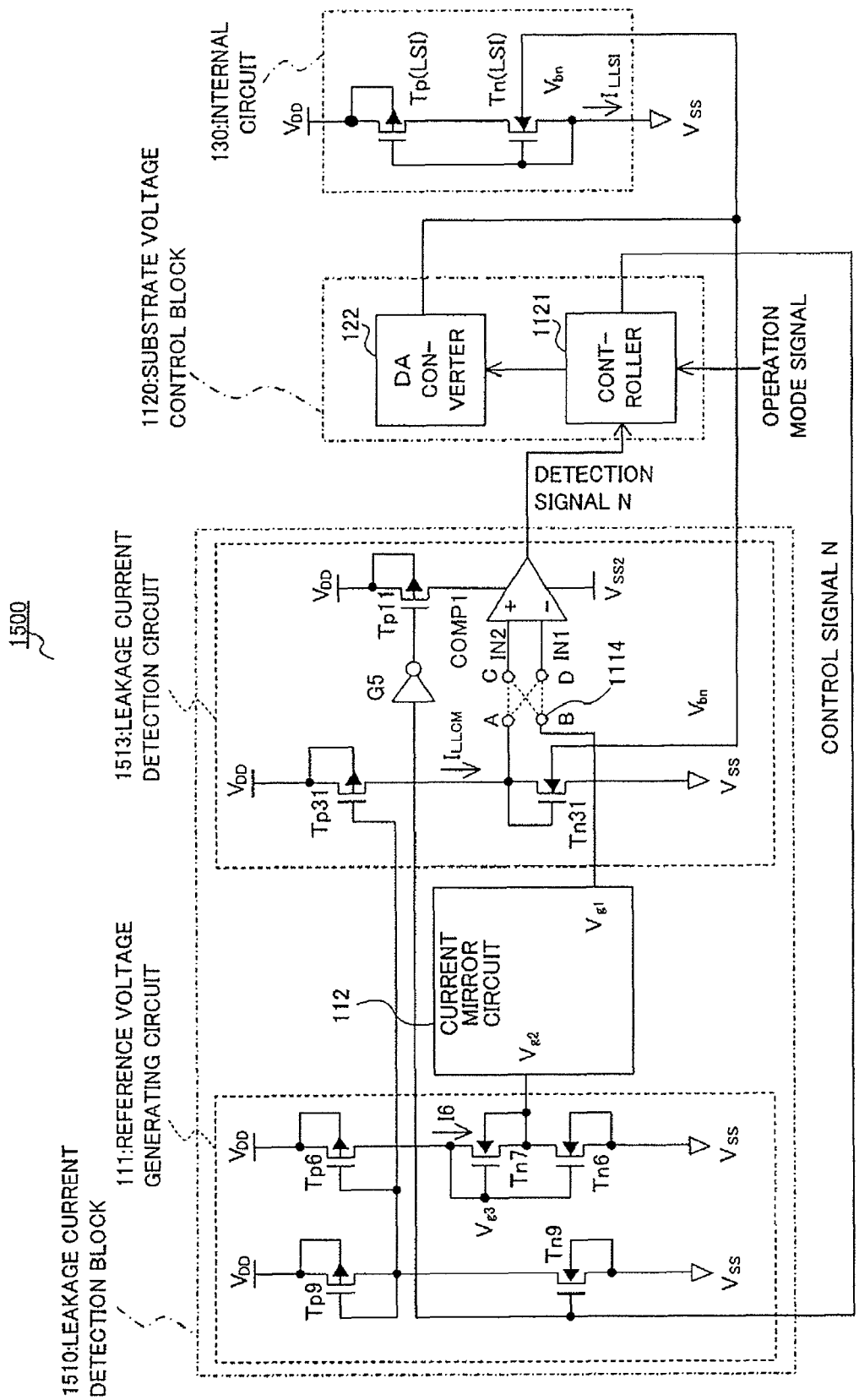
FIG. 17 shows a configuration for a semiconductor integrated circuit apparatus according to Embodiment 15 of the present invention.

FIG. 17 shows a configuration for a semiconductor integrated circuit apparatus according to Embodiment 15 of the present invention. This embodiment shows an example applied to semiconductor integrated circuit apparatus equipped with an NchMOS transistor leakage current detection circuit, substrate voltage control block, and internal circuit. Components identical to those in FIG. 12 and FIG. 15 are assigned the same numerals and description for the overlapped portions will be omitted.

In FIG. 17, semiconductor integrated circuit apparatus 1500 is equipped with NchMOS transistor leakage current detection block 1510, substrate voltage control block 1120 controlling substrate voltage, and internal circuit having a plurality of MOS transistors on a semiconductor substrate. Semiconductor integrated circuit apparatus 1500 adopts a basic configuration carrying out potential comparison of drain potential of leakage current detection NchMOS transistor $T_{n31}$ with a source connected to $V_{SS}$, and the gate and drain connected together and connected to a constant current source and a substrate voltage controlled by substrate voltage control block 1120, for NchMOS transistor $T_{n\ (LSI)}$ equivalently representing internal circuit 130, and voltage amplifier output potential due to current mirror circuit 112 by a comparator.

Leakage current detection block 1510 is comprised of reference voltage generating circuit 111, current mirror circuit 112, and leakage current detection circuit 1513.

Leakage current detection circuit 1513 adopts a configuration where input switching switch 1114 for switching between drain potential of leakage current detection NchMOS transistor $T_{n31}$ and $V_{g1}$ that is a reference potential and respective input terminals IN1, IN2 of comparator COMP1 is further inserted at leakage current detection circuit 1513 of FIG. 15. The configuration of input switching switch 1114 is the same as FIG. 13.

The circuit configuration and substrate voltage control operation of substrate voltage control block 1120 is exactly the same as for Embodiment 13 of FIG. 15, and a method for canceling DC offset of comparator COMP1 is exactly the same as for Embodiment 11.

Further, a circuit generating gate potential of leakage current detection NchMOS transistor $T_{n31}$ is comprised of reference voltage generating circuit 111 and current mirror circuit 112. The relationship between the detection ratio for the leakage current of the leakage current detection NchMOS transistor $T_{n\ (LSI)}$ of the internal circuit and the leakage current of the leakage current detection NchMOS transistor $T_{n31}$ shown in equation (8) is also satisfied.

Therefore, in this embodiment also and as in Embodiment 13, as it is possible to increase the detection current value of leakage current detection NchMOS transistor $T_{n31}$ by an arbitrary ratio, detection of leakage current, comparison of the detected leakage current and target current value and determination of the result after comparison are extremely straightforward. In addition to this effect, as with Embodiment 11, it is possible to completely cancel the DC offset of comparator COMP1, and substantially improve the precision of controlling substrate voltage.

Embodiment 16

Embodiment 16 is an example applying a separate leakage current detection circuit to the leakage current detection circuit of the leakage current detection block.

Figure 18:
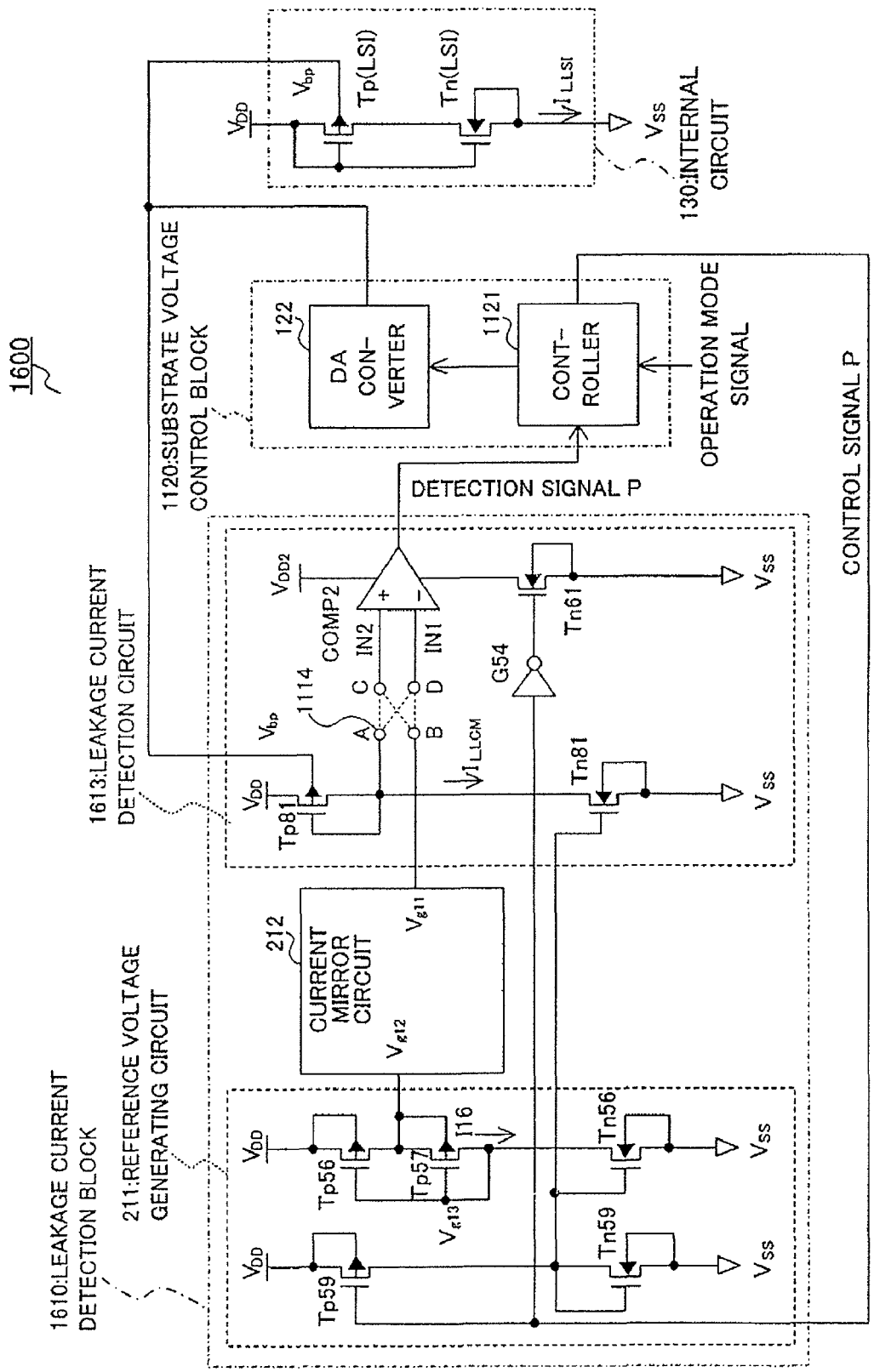
FIG. 18 shows a configuration for a semiconductor integrated circuit apparatus according to Embodiment 16 of the present invention.

FIG. 18 shows a configuration for a semiconductor integrated circuit apparatus according to Embodiment 16 of the present invention. This embodiment shows an example applied to semiconductor integrated circuit apparatus equipped with a PchMOS transistor leakage current detection circuit, substrate voltage control block, and internal circuit. Components identical to those in FIG. 14 and FIG. 16 are assigned the same numerals and description for the overlapped portions will be omitted.

In FIG. 18, semiconductor integrated circuit apparatus 1600 is equipped with PchMOS transistor leakage current detection block 1610, substrate voltage control block 1120 controlling substrate voltage, and internal circuit 130 having a plurality of MOS transistors on a semiconductor substrate. Semiconductor integrated circuit apparatus 1600 adopts a basic configuration carrying out potential comparison of drain potential of leakage current detection PchMOS transistor $T_{p81}$ with a source connected to $V_{DD}$, the gate and drain connected together and connected to a constant current source and a substrate voltage controlled by substrate voltage control block 1120, for PchMOS transistor $T_{p\ (LSI)}$ equivalently representing internal circuit 130, and voltage amplifier output potential due to current mirror circuit 212 by a comparator.

Leakage current detection block 1610 is comprised of reference voltage generating circuit 211, current mirror circuit 212, and leakage current detection circuit 1613.

Leakage current detection circuit 1613 adopts a configuration where input switching switch 1114 for switching between drain potential of leakage current detection PchMOS transistor $T_{p81}$ and $V_{g11}$ that is a reference potential and respective input terminals IN1, IN2 of comparator COMP2 is further inserted at leakage current detection circuit 1413 of FIG. 16. The configuration of input switching switch 1114 is the same as FIG. 13.

The circuit configuration and substrate voltage control operation of substrate voltage control block 1120 is exactly the same as for Embodiment 14 of FIG. 16, and a method for canceling DC offset of comparator COMP2 is exactly the same as for Embodiment 12.

In this embodiment, the theory of operation is exactly the same as for the circuit shown in FIG. 17 simply with NchMOS transistors changed for PchMOS transistors, and vice versa. Therefore, in this embodiment 16 also and as in Embodiment 14, as it is possible to increase the detection current value of leakage current detection PchMOS transistor $T_{p81}$ by an arbitrary ratio, and detection of leakage current, comparison of the detected leakage current and target current value and determination of the result after comparison are extremely straightforward. In addition to this effect, as with Embodiment 12, it is possible to completely cancel the DC offset of comparator COMP2, and it is possible to substantially increase the precision of controlling substrate voltage.

Embodiment 15 and Embodiment 16 described above show an example applied to a threshold voltage control circuit using a leakage current detection MOS transistor with a gate and drain in common and a comparator. It is possible to apply a configuration employing a leakage current detection MOS transistor with a gate and drain in common and a comparator to a configuration that is a combination of voltage amplifying circuits employing operational amplifiers shown in Embodiment 3 and Embodiment 4 of FIG. 4 and FIG. 5 and the reference voltage generating circuits shown in Embodiment 5 to Embodiment 8 of FIG. 6 to FIG. 9, and the same effects can be obtained.

Embodiment 17

Embodiment 17 is an example of varying current amplification ratio of the current mirror circuit.

Figure 19:
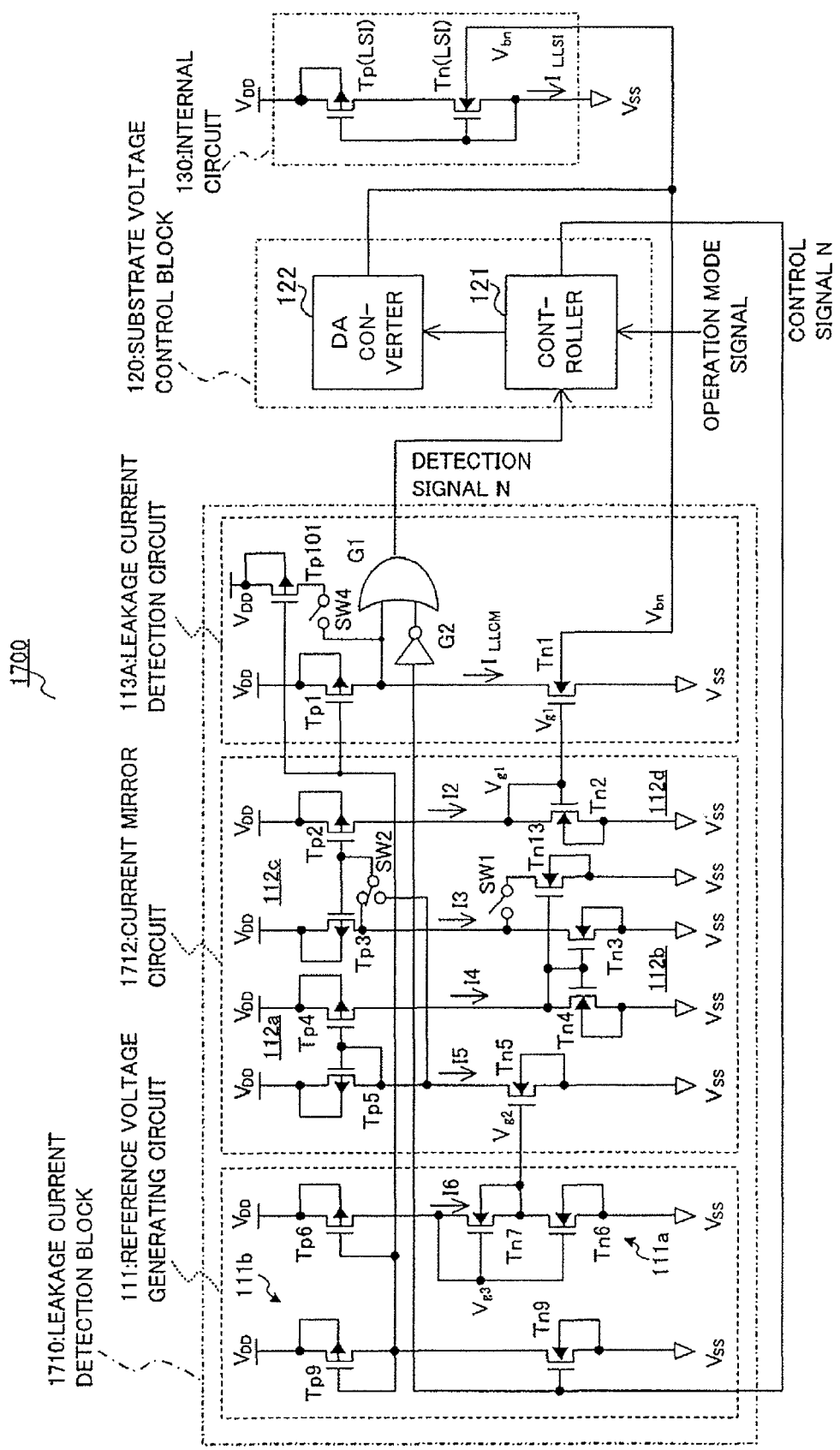
FIG. 19 shows a configuration for a semiconductor integrated circuit apparatus according to Embodiment 17 of the present invention.

FIG. 19 shows a configuration for a semiconductor integrated circuit apparatus according to Embodiment 17 of the present invention. This embodiment shows an example applied to semiconductor integrated circuit apparatus equipped with an NchMOS transistor leakage current detection circuit, substrate voltage control block, and internal circuit. Components identical to those in FIG. 1 are assigned the same numerals and description for the overlapped portions will be omitted.

In FIG. 19, semiconductor integrated circuit apparatus 1700 is equipped with NchMOS transistor leakage current detection block 1710, substrate voltage control block 120 controlling substrate voltage, and internal circuit 130 having a plurality of MOS transistors on a semiconductor substrate. Semiconductor integrated circuit apparatus 1700 adopts a basic configuration employing leakage current detection NchMOS transistor $T_{n1}$ with a drain connected to a constant current source, for leakage current detection of NchMOS transistor $T_{n\ (LSI)}$ equivalently representing internal circuit 130.

Leakage current detection block 1710 is comprised of current mirror circuit 1712, and leakage current detection circuit 113A. Leakage current detection block 1710 arbitrarily amplifies a leakage current value of leakage current detection NchMOS transistor $T_{n1}$ of leakage current detection circuit 113A using current mirror circuit 1712, and makes detection of leakage current and determination straightforward. Further, it is possible to accelerate the response to substrate voltage control so that fluctuation of substrate voltage can also be suppressed. Moreover, the configuration is such that current does not pass through leakage current detection circuit 113A when leakage current detection circuit 113A is not operating.

Current mirror circuit 1712 adopts a configuration where NchMOS transistor $T_{n13}$, and switch SW1 and switch SW2 are further added to current mirror circuit 112 of FIG. 1.

Leakage current detection circuit 113A adopts a configuration where PchMOS transistor $T_{p101}$ and switch SW4 are added in parallel with PchMOS transistor $T_{P1}$ of leakage current detection circuit 113 of FIG. 1.

In the above configuration, by putting switches SW1 and SW2 on and off, it is possible to change the ratio of channel width of NchMOS transistor $T_{n4}$ and $T_{n3}$ that are MOS transistors forming a pair for the current mirror circuit and $T_{n13}$, or it is possible to change the number of stages of the current mirror circuit and also to vary the current amplification ratio. Further, the current value is adjusted according to the amplification ratio by switching switch SW4 according to the current amplification ratio of current mirror circuit 1712 and adjusting the current value of the constant current source constructed from PchMOS transistor $T_{P101}$. For example, it is possible to make the NchMOS transistor appropriate for high speed operation by setting the current amplification ratio to be small and the threshold voltage to be low when power supply voltage is high. Conversely, it is possible to make the NchMOS transistor appropriate for low power consumption operation by setting the current amplification ratio to be large and the threshold voltage to be high when power supply voltage is low.

In the above, a substrate voltage control block of an NchMOS transistor has been described, but it is also possible to apply the above similarly to a threshold voltage control circuit constructed using PchMOS transistors, reference potential generating circuits of a separate configuration, or threshold voltage control circuits constructed using leakage current detection circuits of a separate configuration.

Embodiment 18

Embodiment 18 is an example of varying voltage amplification ratio of the voltage amplifying circuit.

Figure 20:
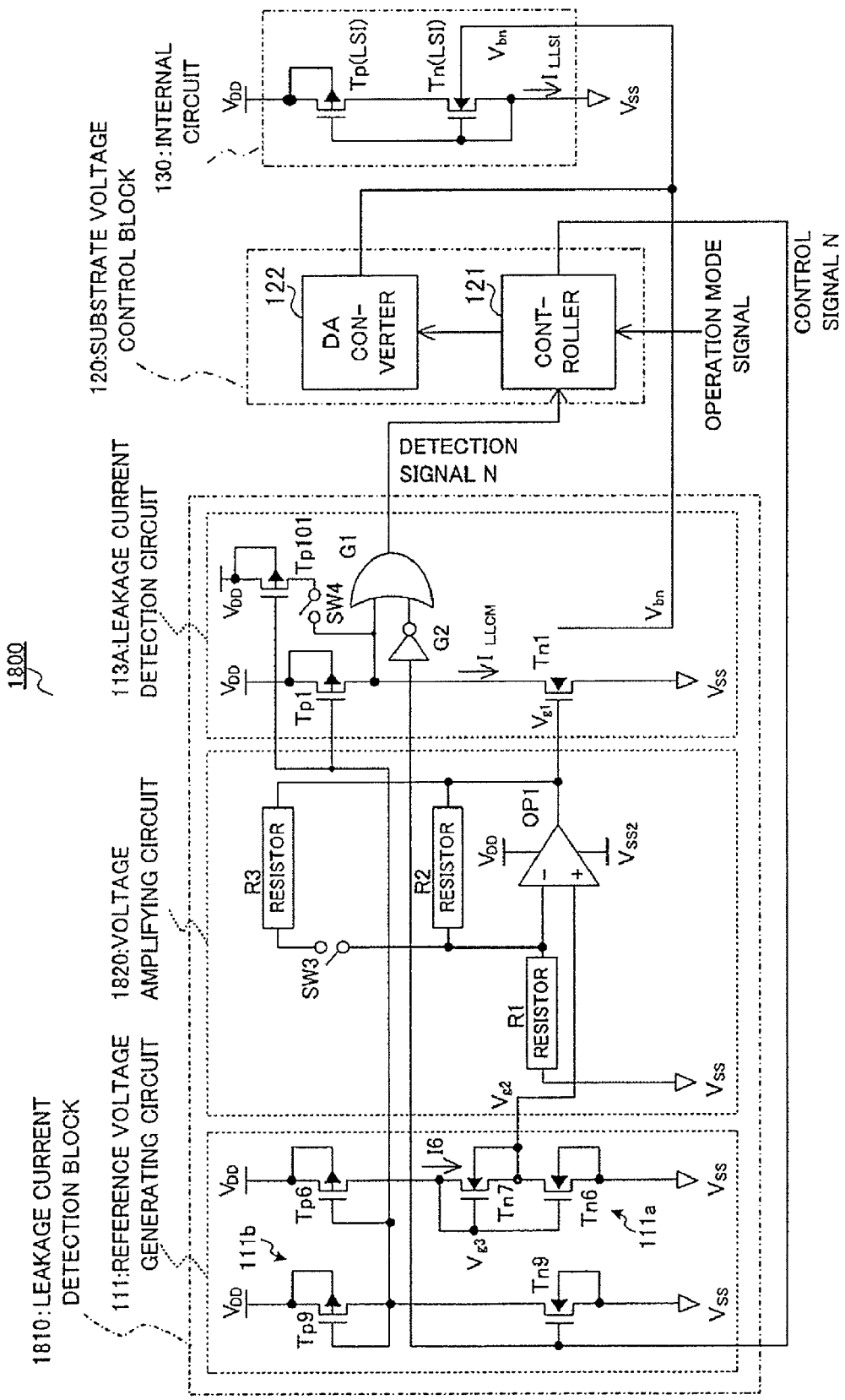
FIG. 20 shows a configuration for a semiconductor integrated circuit apparatus according to Embodiment 18 of the present invention.

FIG. 20 shows a configuration for a semiconductor integrated circuit apparatus according to Embodiment 18 of the present invention. This embodiment shows an example applied to semiconductor integrated circuit apparatus equipped with an NchMOS transistor leakage current detection circuit, substrate voltage control block, and internal circuit. Components identical to those in FIG. 4 are assigned the same numerals and description for the overlapped portions will be omitted.

In FIG. 20, semiconductor integrated circuit apparatus 1800 is equipped with NchMOS transistor leakage current detection block 1810, substrate voltage control block 120 controlling substrate voltage, and internal circuit 130 having a plurality of MOS transistors on a semiconductor substrate. Semiconductor integrated circuit apparatus 1800 adopts a basic configuration employing leakage current detection NchMOS transistor $T_{n1}$ with a drain connected to a constant current source, for leakage current detection of NchMOS transistor $T_{n\ (LSI)}$ equivalently representing internal circuit 130.

Leakage current detection block 1810 is comprised of reference voltage generating circuit 111, voltage amplifying circuit 1820, and leakage current detection circuit 113A. Leakage current detection block 1810 arbitrarily amplifies a leakage current value of leakage current detection NchMOS transistor $T_{n1}$ of leakage current detection circuit 113A using voltage amplifying circuit 1820, detects leakage current, and makes detection of leakage current and determination straightforward. Further, it is possible to accelerate the response to substrate voltage control so that fluctuation of substrate voltage can also be suppressed. Moreover, the configuration is such that current does not pass through leakage current detection circuit 113A when leakage current detection circuit 113A is not operating.

Voltage amplifying circuit 1820 adopts a configuration where resistor R3 and switch SW3 are further added in parallel to resistor R2 at voltage amplifying circuit 320 of FIG. 4. Leakage current detection circuit 113A adopts a configuration where PchMOS transistor $T_{p101}$ and switch SW4 are added in parallel to PchMOS transistor $T_{P1}$ of leakage current detection circuit 113 of FIG. 1.

By putting switch SW3 on and off and changing the ratio of the input resistance value and output resistance value of voltage amplifying circuit 1820, it is possible to arbitrarily change the voltage amplification ratio according to power supply voltage. Further, the current value is adjusted according to the amplification ratio by switching switch SW4 according to the current amplification ratio of voltage amplifying circuit 1820 and adjusting the current value of the constant current source constructed from PchMOS transistor $T_{P101}$. For example, it is possible to make the NchMOS transistor appropriate for high speed operation by setting the voltage amplification ratio to be small and the threshold voltage to be low when power supply voltage is high. Conversely, it is possible to make the NchMOS transistor appropriate for low power consumption operation by setting the voltage amplification ratio to be large and the threshold voltage to be high when power supply voltage is low.

In the above, a substrate voltage control block of an NchMOS transistor has been described, but it is also possible to apply the above similarly to a threshold voltage control circuit constructed using PchMOS transistors, reference potential generating circuits of a separate configuration, or threshold voltage control circuits constructed using leakage current detection circuits of a separate configuration.

Embodiment 19

Embodiment 19 is an example of respectively controlling substrate voltage of PchMOS transistors and NchMOS transistors constituting a CMOS circuit at an internal circuit using both an NchMOS transistor threshold voltage control circuit and a PchMOS transistor threshold voltage control circuit.

Figure 21:
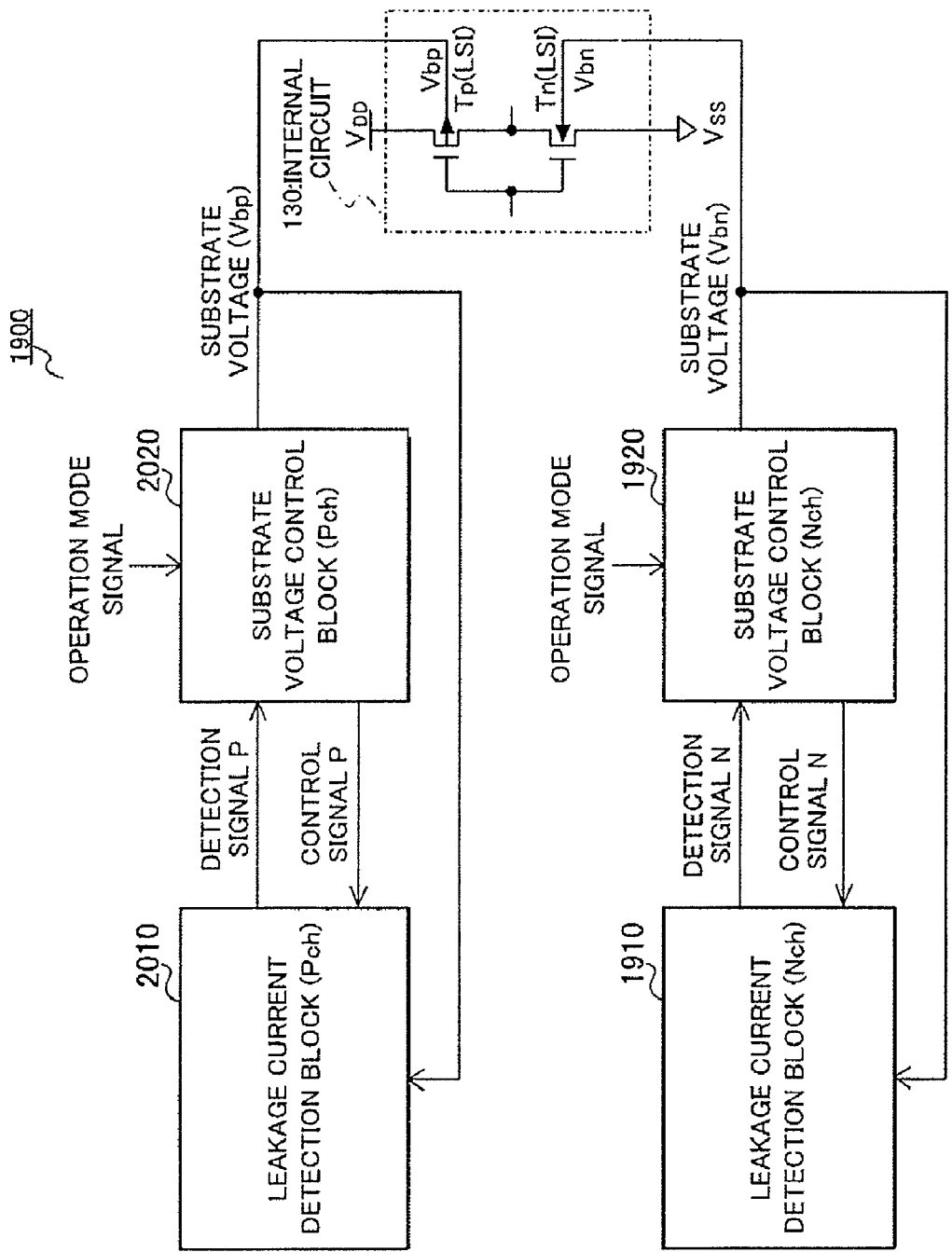
FIG. 21 shows a configuration for a semiconductor integrated circuit apparatus according to Embodiment 19 of the present invention.

FIG. 21 shows a configuration for a semiconductor integrated circuit apparatus according to Embodiment 19 of the present invention. Components identical to those in FIG. 1 to FIG. 1B are assigned the same numerals and description for the overlapped portions will be omitted.

In FIG. 21, semiconductor integrated circuit apparatus 1900 is equipped with NchMOS transistor leakage current detection block 1910, substrate voltage control block 1920, PchMOS transistor leakage current detection block 2010, substrate voltage control block 2020, and internal circuit 130. Semiconductor integrated circuit apparatus 1900 controls the threshold voltage of the NchMOS transistor and PchMOS transistor constituting internal circuit 130.

Leakage current detection blocks 1910 and 2010, and substrate voltage control blocks 1920 and 2020 may operate with any combination of the leakage current detection blocks and substrate voltage control blocks of each of Embodiments 1 to 18.

In this way, according to this embodiment, the same effects are also obtained for CMOS circuits, and it is possible to improve detection sensitivity and response of detection potential for a leakage current detection NchMOS transistor and a leakage current detection PchMOS transistor. Further, as a result of applying the above to an internal circuit using CMOS circuits, it is possible to exert control both simultaneously and in an optimum manner on threshold voltages of the PchMOS transistors and NchMOS transistors.

Embodiment 20

Figure 22:
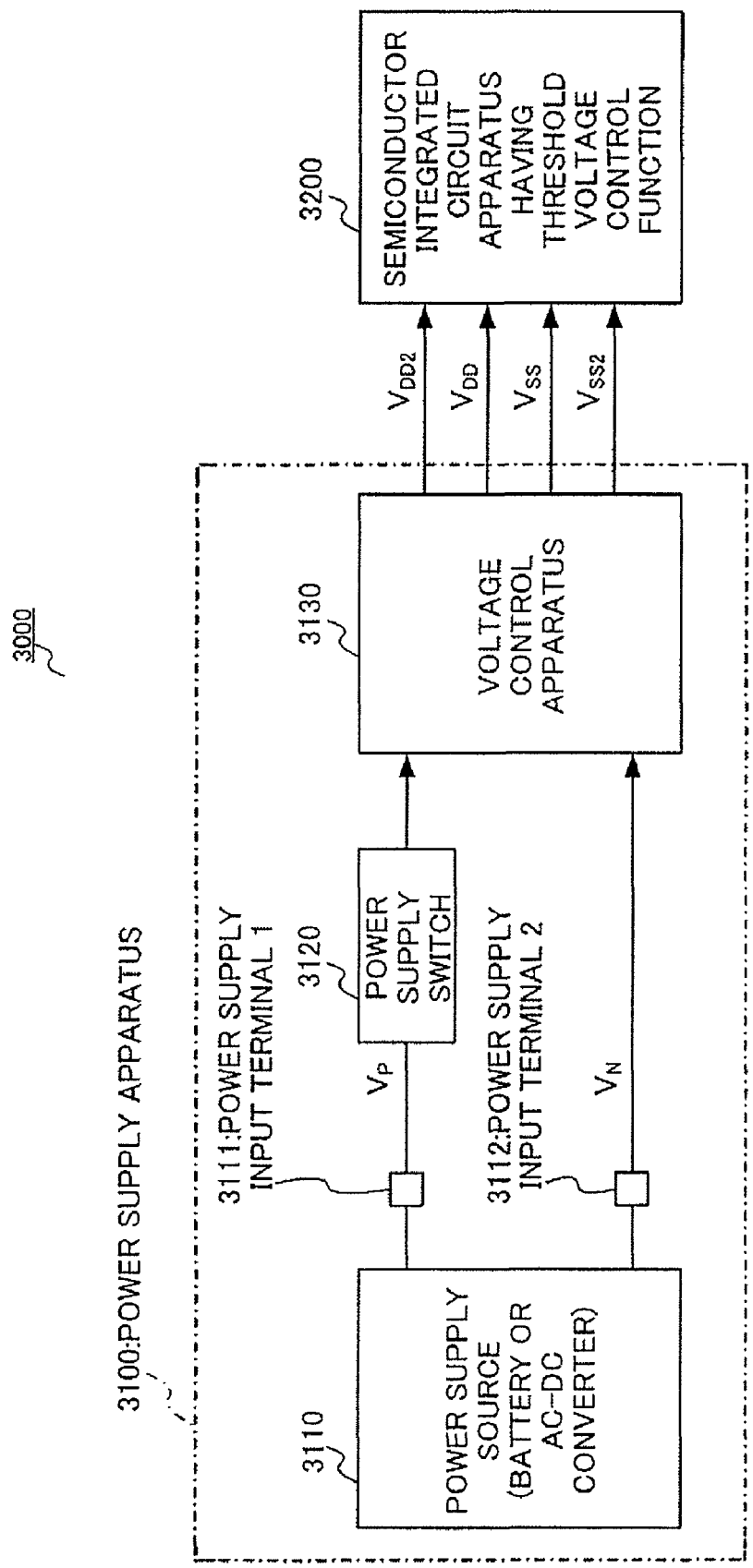
FIG. 22 is a block view showing a configuration of an electronic apparatus according to Embodiment 20 of the present invention.
Figure 23:
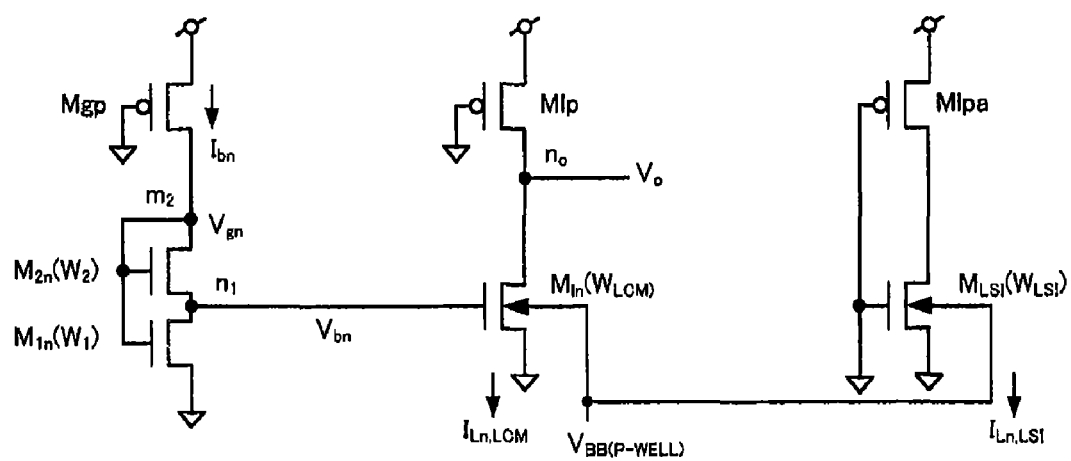
FIG. 23 shows a configuration for a semiconductor integrated circuit apparatus controlling threshold voltage of an NchMOS transistor of the related art.

FIG. 22 is a block view showing a configuration of electronic apparatus having a threshold voltage control function according to Embodiment 20 of the present invention.

In FIG. 22, electronic apparatus 3000 is equipped with power supply apparatus 3100, and semiconductor integrated circuit apparatus 3200 having a threshold voltage control function. Power supply apparatus 3100 is comprised of power supply source 3110 composed of a battery and AC-DC converter etc., power supply input terminals 3111 and 3112 inputting a power supply voltage generated by power supply source 3110, power supply switch 3120 switching the power supply voltage on and off, and voltage control apparatus 3130 converting the power supply voltage of power supply source 3110 to a voltage required by semiconductor integrated circuit apparatus 3200 having a threshold voltage control function or generating and supplying this voltage.

Semiconductor integrated circuit apparatus 3200 is LSI apparatus receiving supply voltages $V_{DD}$, $V_{SS}$, $V_{DD2}$ and $V_{SS2}$ from voltage control apparatus 3130 of power supply apparatus 3100. Semiconductor integrated circuit apparatus 3200 may be an individual one or a combination of semiconductor integrated circuit apparatuses 100 to 1900 described in each of Embodiments 1 to 19. Therefore, it is possible to implement the superior effects of semiconductor integrated circuit apparatuses 100 to 1900 described in each of Embodiments 1 to 19, i.e. semiconductor integrated circuit apparatus 3200 having a leakage current detection circuit where an arbitrary set leakage current detection ratio does not depend on power supply voltage, temperature, or manufacturing variations, detection of leakage current is straightforward, and response to substrate voltage control is fast. Further, by mounting semiconductor integrated circuit apparatus 3200 on electronic apparatus 3000, the effect of improving performance (in particular, power consumption) of electronic apparatus 3000 is fully expected.

Electronic apparatus 3000 using a battery as power supply source 3110 is extremely effective as portable equipment for use of long hours. It is also expected that the effect of consuming less power will be sufficient even for electronic apparatus employing an AC-DC converter as power supply source 3110.

The preferred embodiments of the present invention described above are merely given as examples, and they are not limited to the scope of the present invention.

Further, the title of "semiconductor integrated circuit apparatus and electronic apparatus" is used in the forms of the embodiments, but this is merely for simplicity of description. Therefore, the title may also be "threshold voltage control circuit apparatus," "semiconductor integrated circuit," "mobile electronic equipment," or "substrate voltage control method" etc.

Moreover, the type, number, and method of connecting each circuit section constituting the semiconductor integrated circuit apparatus such as, for example, comparators etc. are not limited to the embodiments described above.

The embodiments can be carried out for each of a plurality of circuit blocks the substrate may be electrically divided up into.

Further, it is possible to implement not only for MOS transistors configured on a normal silicon substrate, but also for semiconductor integrated circuits configured using MOS transistors of an SOI (Silicon On Insulator) structure.

In the above, according to the present invention, it is possible to implement semiconductor integrated circuit apparatus controlling threshold voltage of MIS transistors having a leakage current detection circuit where arbitrarily set leakage current detection does not depend on power supply voltage, temperature or manufacturing variations, and where detection is straightforward, and response to substrate voltage control is fast.

Further, it is possible to implement low power consumption of the leakage current detection circuit. Moreover, it is possible to arbitrarily set threshold voltage to an arbitrary system clock frequency or power supply voltage.

The semiconductor integrated circuit apparatus and electronic apparatus controlling threshold voltage of transistors of the present invention is therefore capable of increasing the detection current value of leakage current detection MOS transistors so that detection of leakage current, comparison of the detected leakage current and target current value and determination of the result after comparison are extremely straight forward. Further, it is possible to accelerate the response to substrate voltage control so that fluctuation of substrate voltage can also be suppressed. Further, it is possible for a constant current supply to take up a small surface area by setting current of a constant current source connected to an MOS transistor to be large. It is then possible to keep the power consumed when leakage current detection circuit is not operating low by inserting an MOS transistor switch controlled by a control signal at a circuit constituting a constant current source of the leakage current detection circuit. This is therefore extremely effective not only as a way of controlling variation of threshold voltages of semiconductor integrated circuits and electronic apparatus operating at low power supply voltages, but also as a way of arbitrarily changing threshold voltage according to a changing power supply voltage.

The present invention is not limited to the above described embodiments, and various variations and modifications may be possible without departing from the scope of the present invention.

This application is based on Japanese Patent Applications No. 2005-299209 filed on Oct. 13, 2005, and No. 2006-175899 filed on Jun. 26, 2006, entire content of which is expressly incorporated by reference herein.

What is claimed:

1. A semiconductor integrated circuit apparatus, comprising:

a first first main conductivity MIS transistor with a source connected to a first power supply;

a second first main conductivity MIS transistor with a source connected to a drain of the first first main conductivity MIS transistor, a drain connected to a first current source, and a gate connected to a gate of the first first main conductivity MIS transistor and the first current source;

a voltage amplifier that amplifies or attenuates a drain potential of the first first main conductivity MIS transistor to an arbitrary voltage up or down; and a leakage current detection first main conductivity MIS transistor that takes an output potential of the voltage amplifier as a gate potential, and has a substrate connected to a substrate of a first main conductivity MIS transistor of an internal circuit, wherein:

the voltage amplifier satisfies the following equation when the drain potential of the first first main conductivity MIS transistor is amplified 3S volts up, $$\frac{I_{LLSI}}{I_{LLCM}} = \frac{W_{LSI}}{W_{LCM}} \cdot \frac{W_1}{W_2} \cdot \frac{1}{10^3}$$

where:

S is a gate source voltage necessary to make a leakage current of the first main conductivity MIS transistor one digit higher or lower;

$I_{LLSI}$ is a leakage current of the first main conductivity MIS transistor of the internal circuit, $I_{LLCM}$ is a leakage current of a leakage current detection first main conductivity MIS transistor $T_{n1}$, $W_{LSI}$ is a channel width of the first main conductivity MIS transistor of the internal circuit, $W_{LCM}$ is a channel width of the leakage current detection first main conductivity MIS transistor, $W_1$ is a channel width of the first first main conductivity MIS transistor, $W_2$ is a channel width of the second first main conductivity MIS transistor, and the first and second first main conductivity MIS transistor operate in a subthreshold region in such a manner that an absolute value of a difference in agate potential of the first first main conductivity MIS transistor and the second first main conductivity MIS transistor and the first power supply potential becomes equal to or smaller than a threshold voltage of the first and second first main conductivity MIS transistors.

2. A semiconductor integrated circuit apparatus, comprising:

a first first main conductivity MIS transistor with a source connected to a first power supply;

a second first main conductivity MIS transistor with a source connected to a drain of the first first main conductivity MIS transistor and a drain connected to a first current source;

a fourth first main conductivity MIS transistor with a source connected to the first power supply, a gate and drain connected in common and connected to respective gates of the first first main conductivity MIS transistor and the second first main conductivity MIS transistor and a second current source; and a voltage amplifier that amplifies or attenuates a drain potential of the first first main conductivity MIS transistor to a potential of an arbitrary ratio, wherein the first, second and fourth first main conductivity MIS transistors operate in a sub-threshold region in such a manner that an absolute value of a difference in a gate potential of the first first main conductivity MIS transistor, the second first main conductivity MIS transistor, and the fourth first main conductivity MIS transistor becomes equal to or smaller than a threshold voltage of the first, second, and fourth first main conductivity MIS transistors.

3. A semiconductor integrated circuit apparatus, comprising:

an internal circuit having a plurality of MIS transistors on a semiconductor substrate;

a substrate voltage control block that supplies a substrate voltage to the internal circuit and controls a threshold voltage of the plurality of MIS transistors of the internal circuit;

a reference potential generator;

a voltage amplifier that amplifies or attenuates an output potential of the reference potential generator to a potential of an arbitrary ratio; and a leakage current detector having an MIS transistor with the substrate voltage supplied by the substrate voltage control block, and that takes a potential amplified or attenuated by the voltage amplifier as a gate potential, wherein the threshold voltage is controlled by inputting an output signal of the leakage current detector to the substrate voltage control block, wherein:

the internal circuit has a Complementary Metal Insulated Semiconductor (CMIS) circuit; the substrate voltage control block controls the threshold voltage for a NchMIS transistor and a PchMIS transistor of the CMIS circuit; and the leakage current detector includes a leakage current detection NchMIS transistor and a leakage current detection PchMIS transistor.

\* \* \* \* \*